United States Patent
Cruz

(10) Patent No.: US 9,627,861 B2
(45) Date of Patent: Apr. 18, 2017

(54) UTILITY METER BYPASS SYSTEMS, METHODS, AND DEVICES

(71) Applicant: Q Factory 33 LLC, Encinitas, CA (US)

(72) Inventor: Paul Martin Cruz, San Diego, CA (US)

(73) Assignee: QFE 002 LLC, Encinitas, CA (US)

( * ) Notice: Subject to any disclaimer, the term of this patent is extended or adjusted under 35 U.S.C. 154(b) by 0 days.

(21) Appl. No.: 15/191,243

(22) Filed: Jun. 23, 2016

(65) Prior Publication Data

US 2016/0380413 A1    Dec. 29, 2016

Related U.S. Application Data

(60) Provisional application No. 62/231,050, filed on Jun. 23, 2015.

(51) Int. Cl.
| | |
|---|---|
| H02B 1/03 | (2006.01) |
| H02B 1/04 | (2006.01) |
| H02B 1/20 | (2006.01) |
| H02H 7/22 | (2006.01) |
| H02B 1/06 | (2006.01) |

(52) U.S. Cl.
CPC ............. *H02B 1/03* (2013.01); *H02B 1/04* (2013.01); *H02B 1/06* (2013.01); *H02B 1/20* (2013.01); *H02H 7/22* (2013.01)

(58) Field of Classification Search
CPC ........................................................ H01B 1/03
See application file for complete search history.

(56) References Cited

U.S. PATENT DOCUMENTS

| | | | | |
|---|---|---|---|---|
| 4,977,482 A | * | 12/1990 | Langdon | H02B 1/03 |
| | | | | 324/156 |
| 5,097,383 A | * | 3/1992 | Heard | G01R 11/00 |
| | | | | 361/626 |
| 5,216,802 A | * | 6/1993 | Cole | G01R 11/00 |
| | | | | 29/825 |
| 5,453,725 A | | 9/1995 | You et al. | |
| 5,573,412 A | | 11/1996 | Anthony | |
| 6,188,145 B1 | | 2/2001 | Stewart | |
| 6,545,374 B1 | * | 4/2003 | Allenbach | H01H 9/26 |
| | | | | 307/125 |
| 7,030,514 B2 | | 4/2006 | Wareham et al. | |
| 7,648,389 B1 | | 1/2010 | Scott et al. | |
| 7,977,818 B1 | | 7/2011 | Wahl | |
| 8,103,563 B2 | | 1/2012 | O'Neil | |

(Continued)

OTHER PUBLICATIONS

International Search Report and Written Opinion of the International Searching Authority issued in PCT/US2016/038825 dated Sep. 14, 2016.

*Primary Examiner* — Robert J Hoffberg
(74) *Attorney, Agent, or Firm* — Knobbe Martens; Olson & Bear LLP

(57) ABSTRACT

Bypass systems can be used to connect alternative energy sources to existing distribution panels without the need to replace or upgrade the distribution panel. Some such bypass systems may be integrated directly into an electric meter, while others can be connected to the meter but located laterally or otherwise away from the electric meter. The bypass busbars and breakers may in some devices be interchangeable, allowing for greater flexibility and capacity of the bypass systems.

28 Claims, 77 Drawing Sheets

(56) References Cited

U.S. PATENT DOCUMENTS

| | | |
|---|---|---|
| 8,350,417 B1 | 1/2013 | Dooley et al. |
| 8,368,386 B2 | 2/2013 | Reineccius |
| 8,687,348 B2 | 4/2014 | Peplinski et al. |
| 8,784,130 B2 | 7/2014 | Scott et al. |
| 9,318,861 B2 | 4/2016 | Fulton et al. |
| 2002/0171436 A1 | 11/2002 | Russell |
| 2004/0036362 A1 | 2/2004 | Beck et al. |
| 2006/0138868 A1 | 6/2006 | Wareham et al. |
| 2010/0225305 A1 | 9/2010 | Reineccius |
| 2011/0175453 A1 | 7/2011 | Batzler et al. |
| 2012/0217954 A1 | 8/2012 | Cook |
| 2014/0098470 A1 | 4/2014 | Robinson et al. |
| 2015/0036267 A1* | 2/2015 | Miller .................. H01H 9/54 361/625 |
| 2015/0061644 A1 | 3/2015 | Parks et al. |
| 2015/0309075 A1 | 10/2015 | Parks et al. |

\* cited by examiner

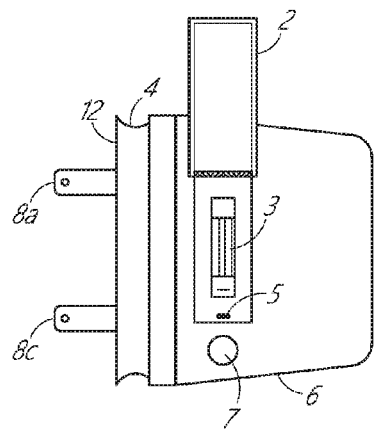
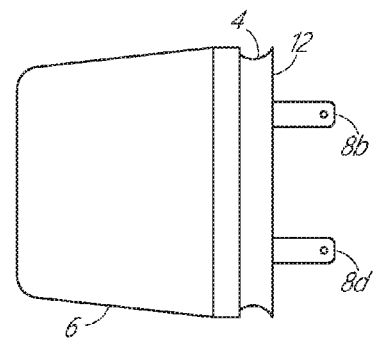
FIG. 1B    FIG. 1C
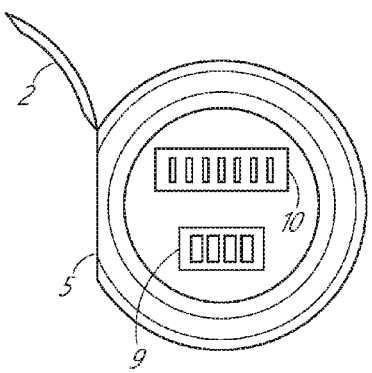
FIG. 1A
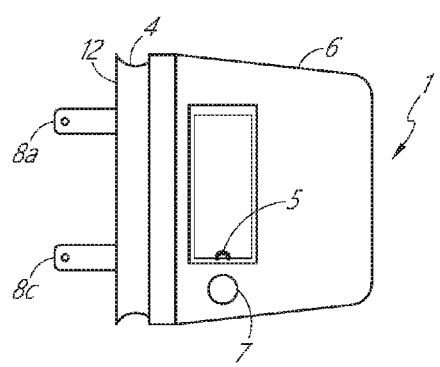
FIG. 2

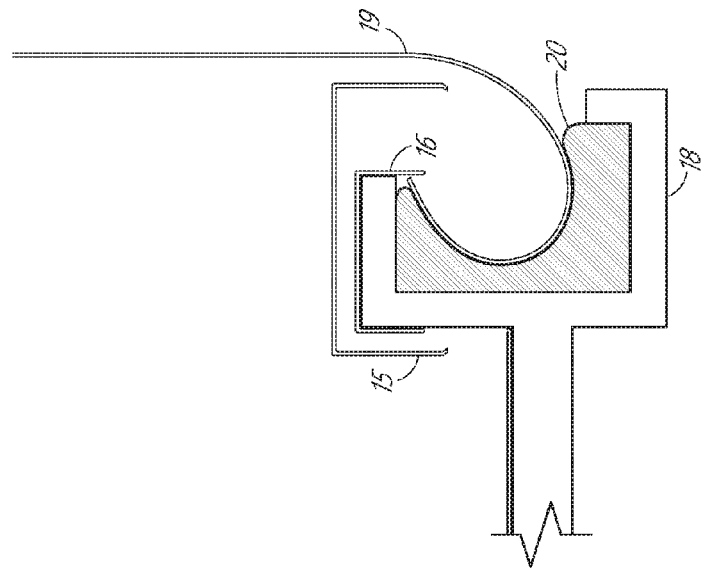
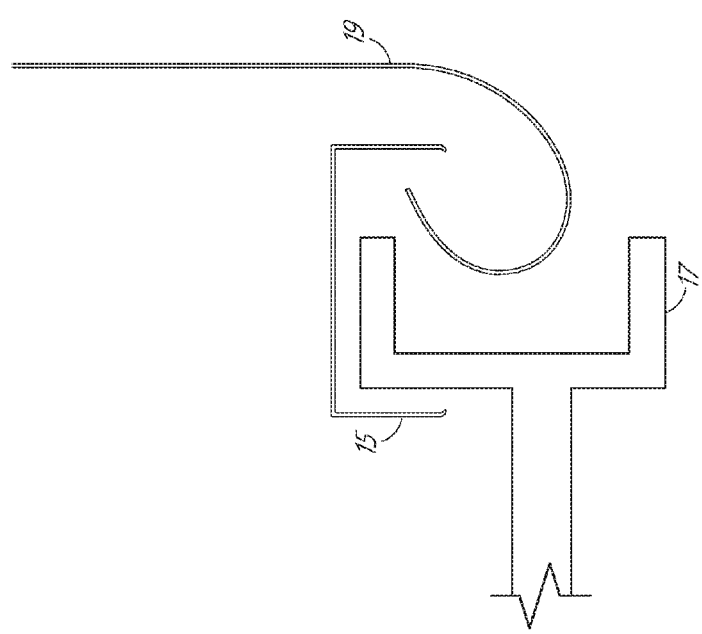

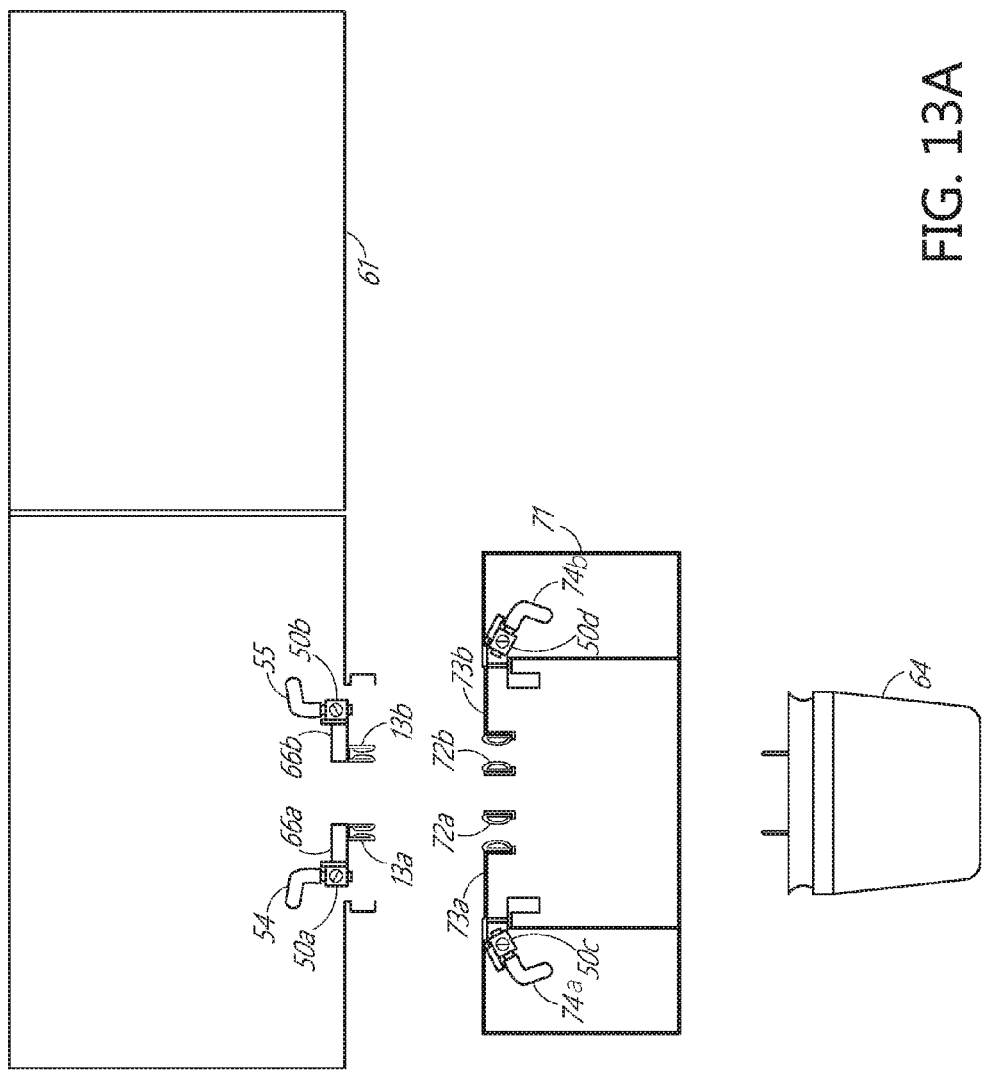

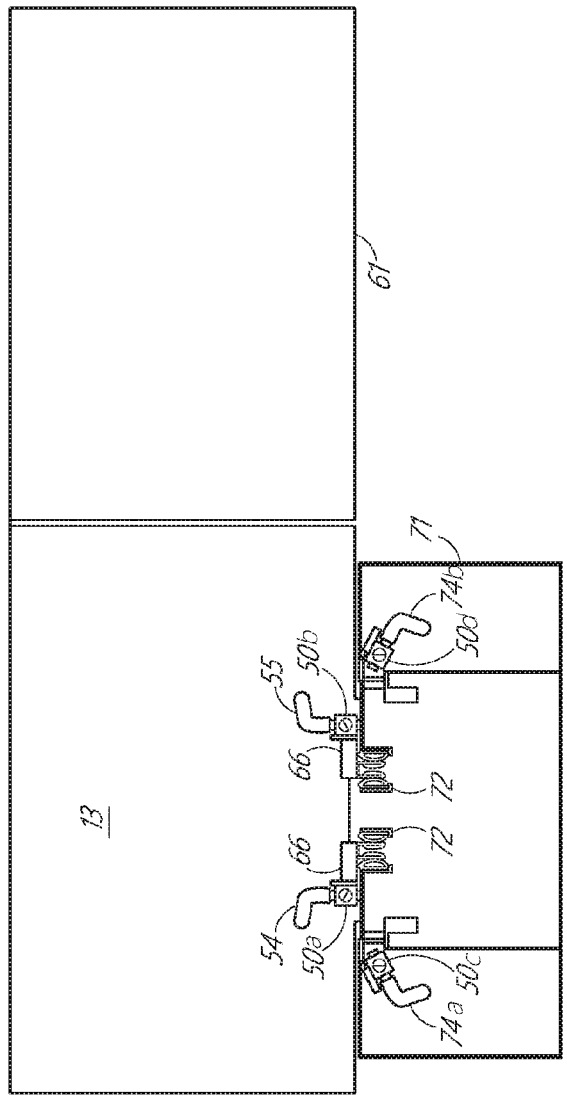
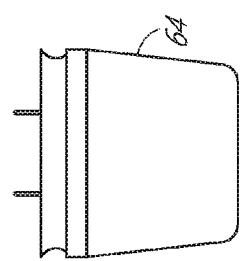
FIG. 13B

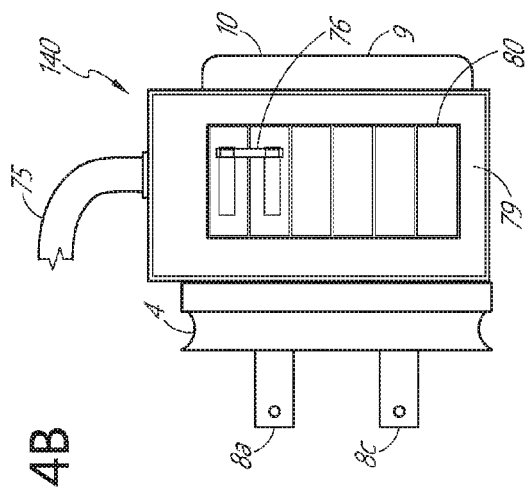
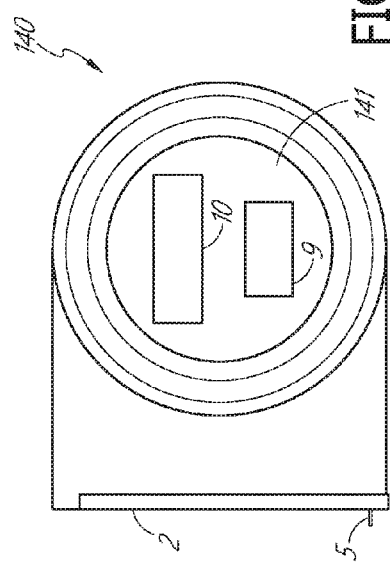
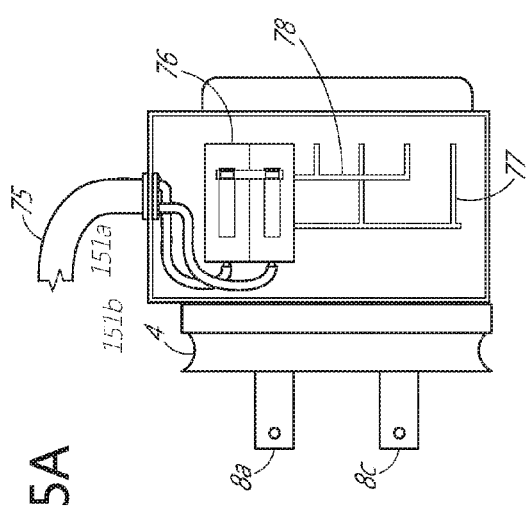
FIG. 14B
FIG. 14A
FIG. 15A

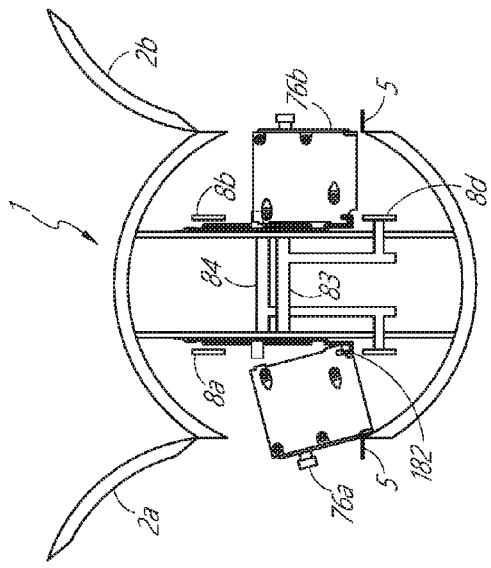
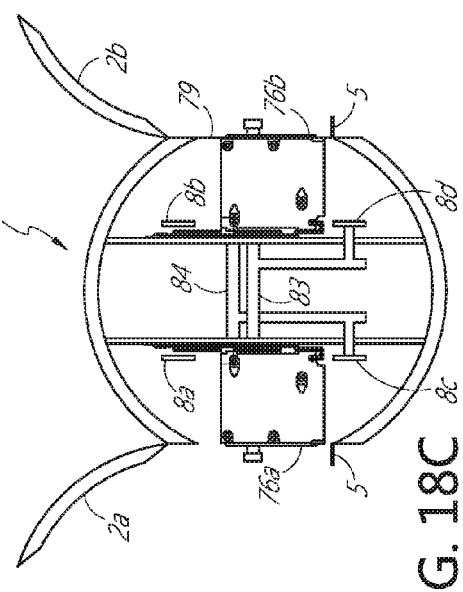
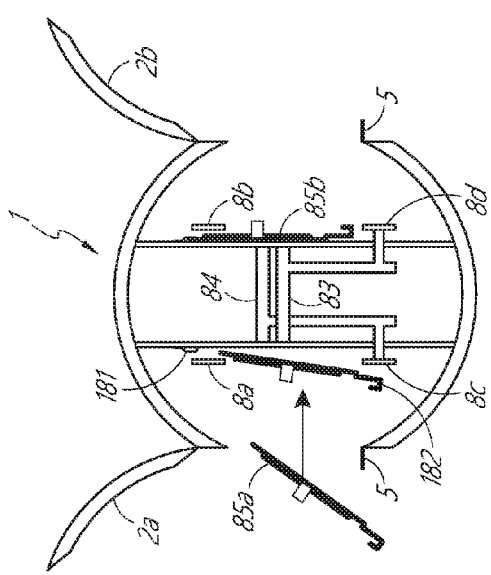

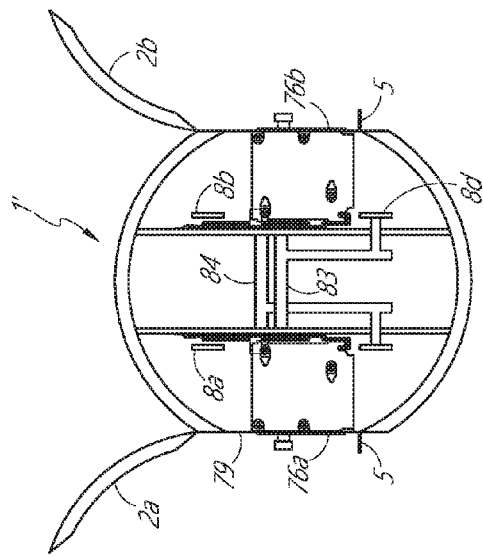
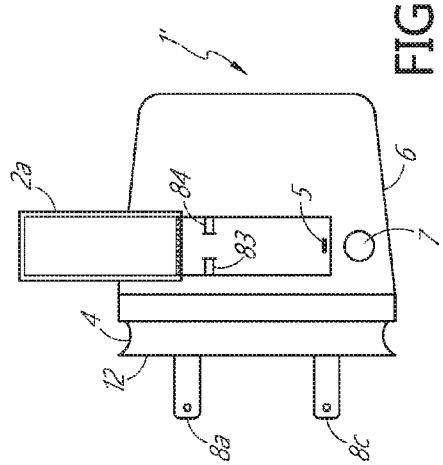
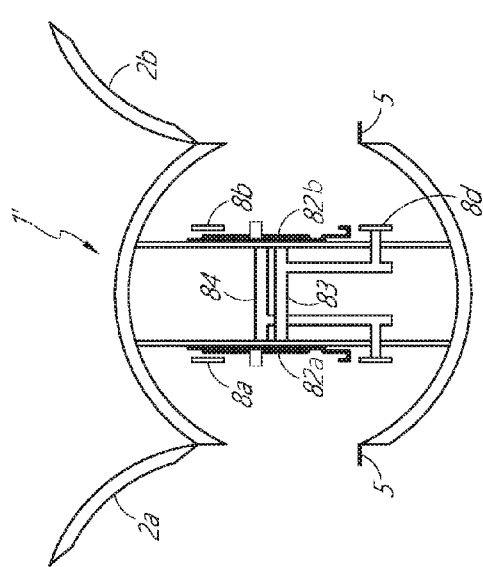
FIG. 19B
FIG. 19C
FIG. 19A

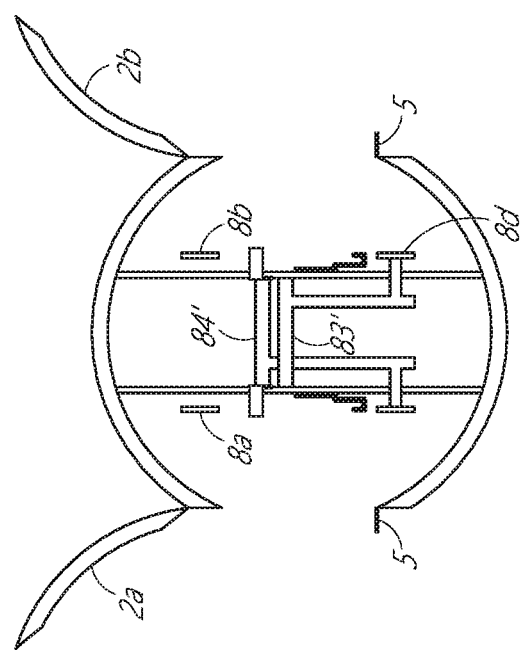

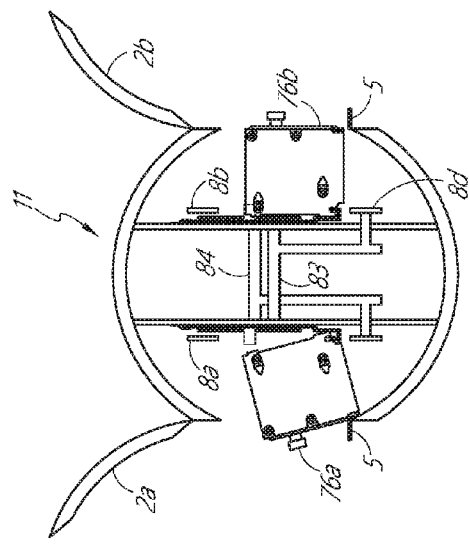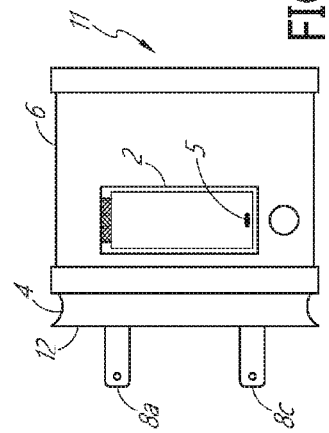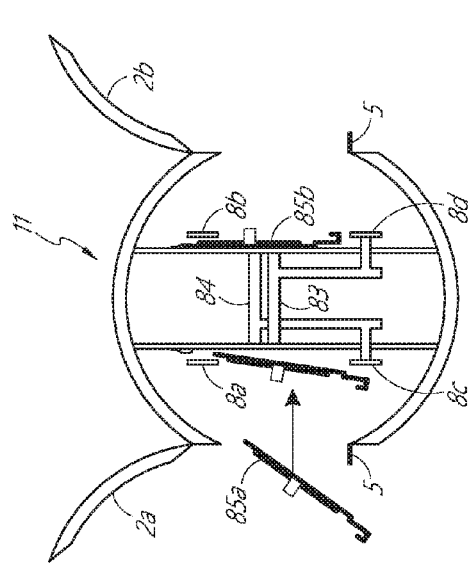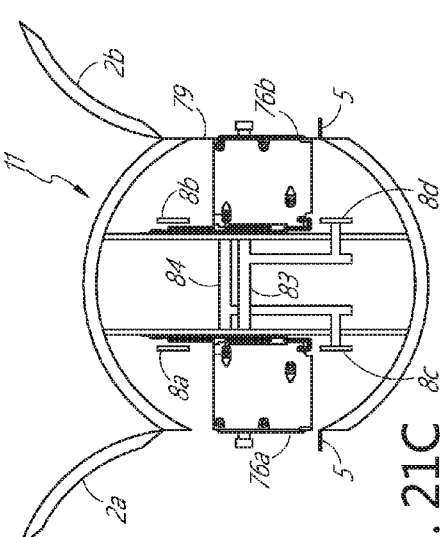

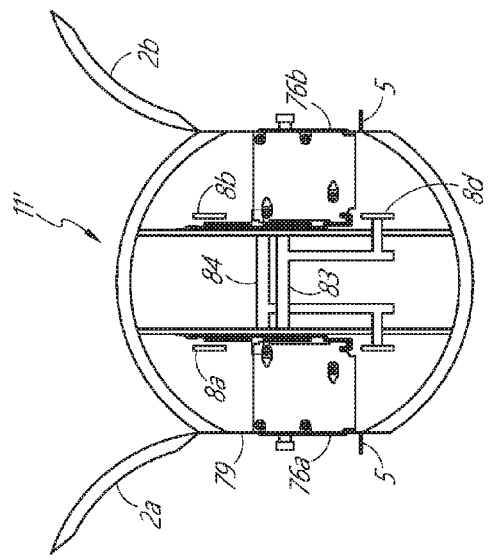
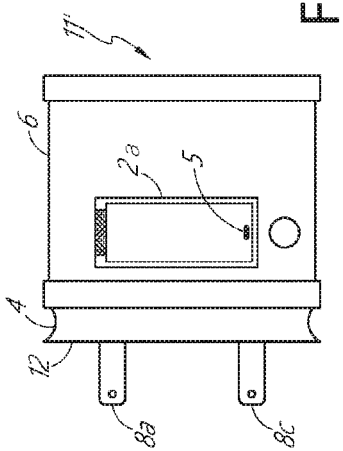
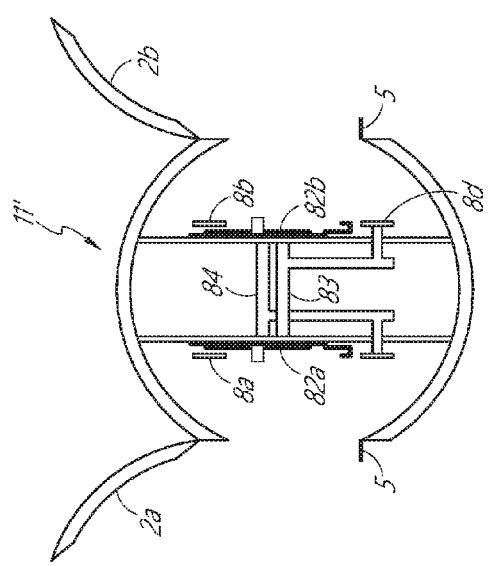
FIG. 22B
FIG. 22C
FIG. 22A

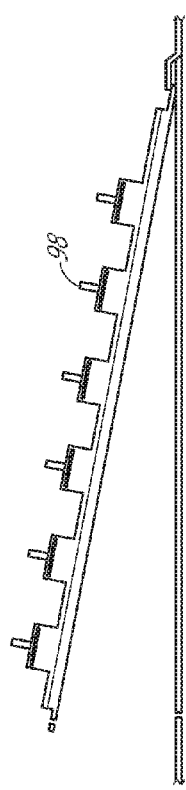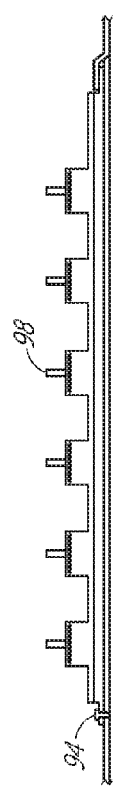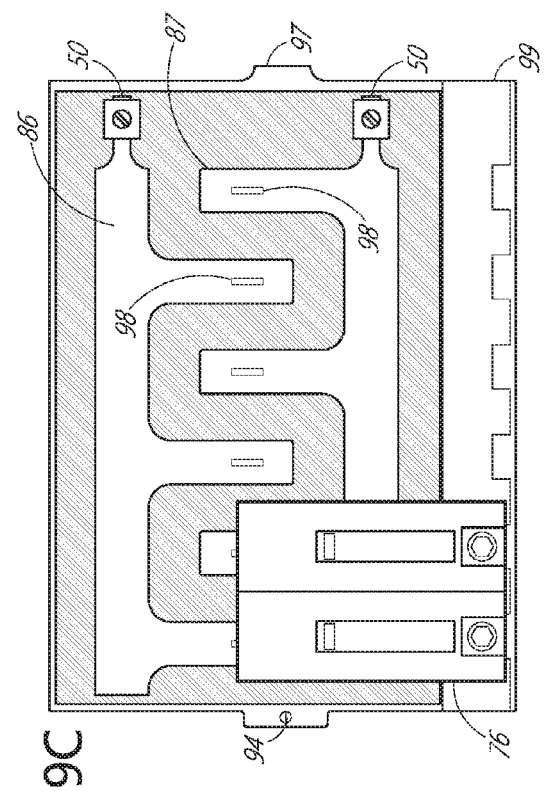

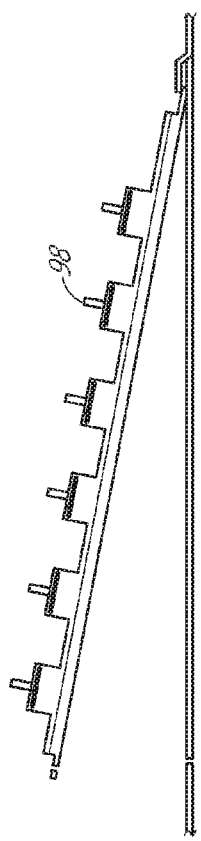
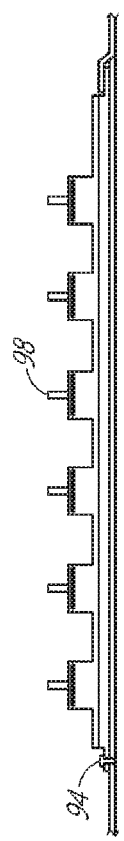
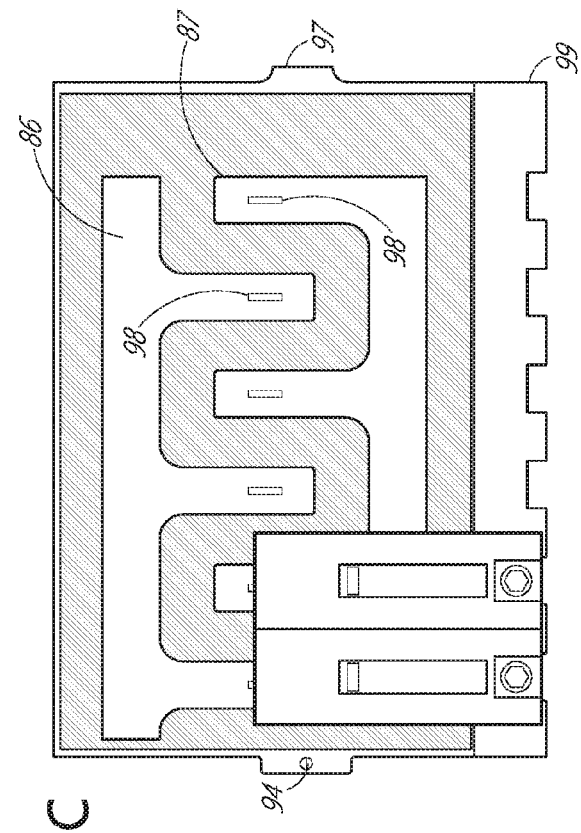
FIG. 30A
FIG. 30B
FIG. 30C

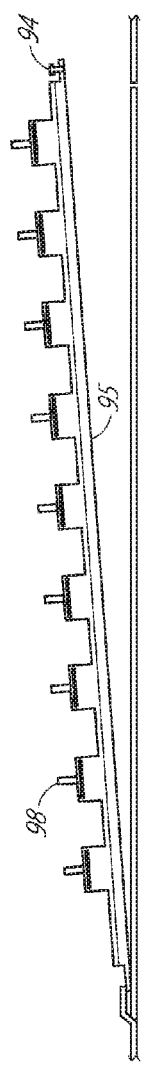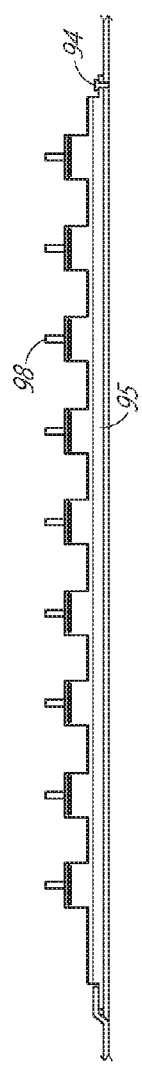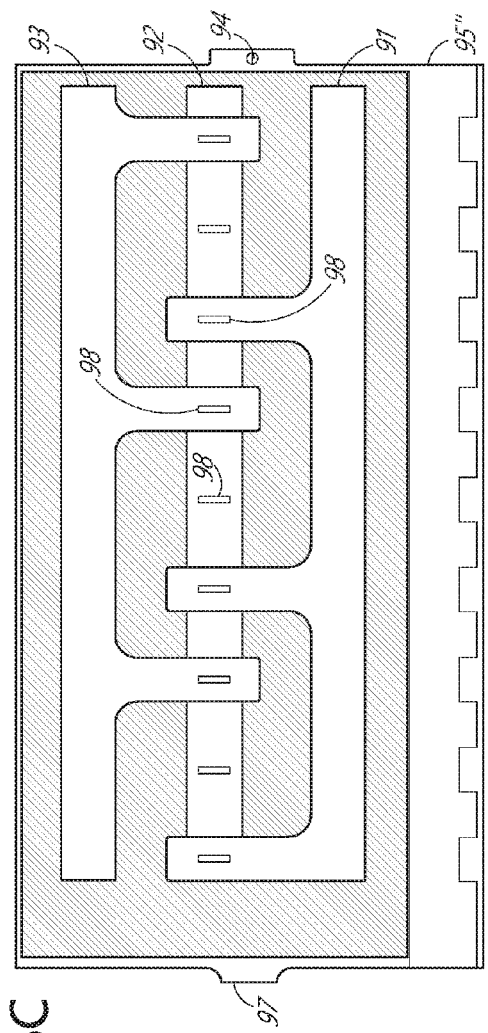

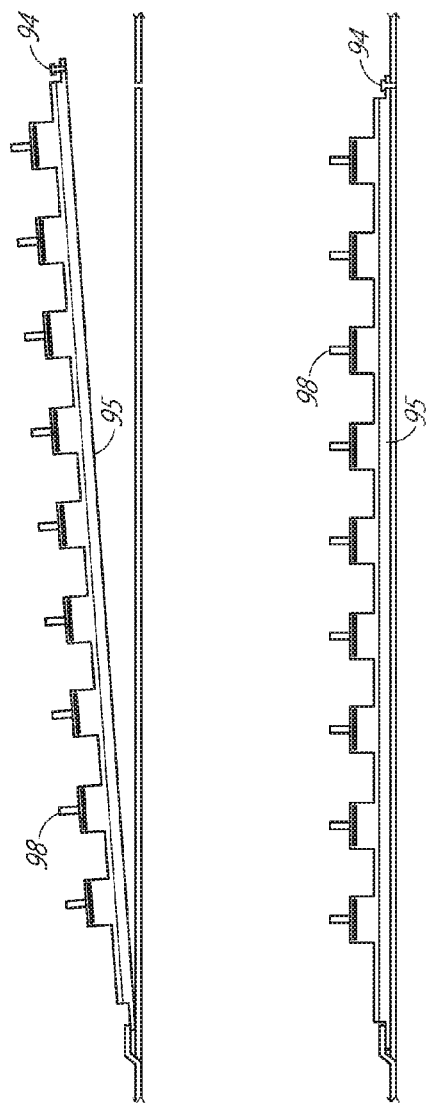
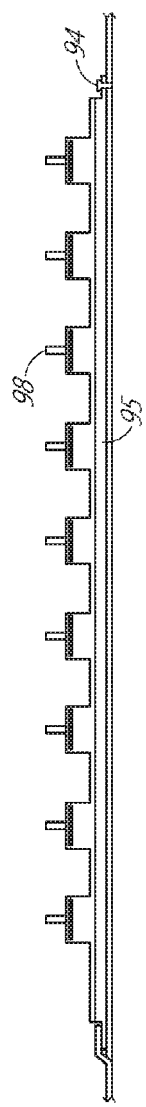
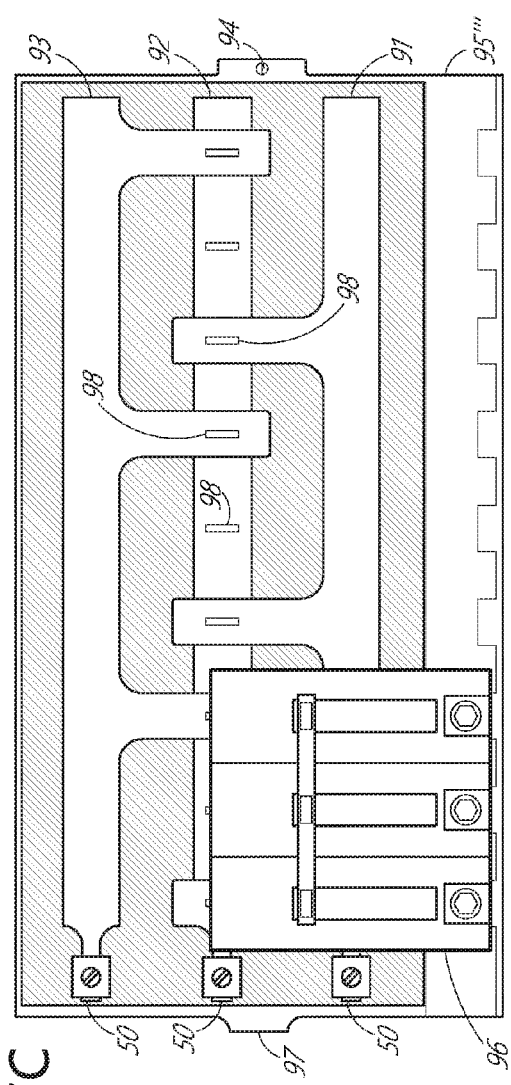
FIG. 37A
FIG. 37B
FIG. 37C

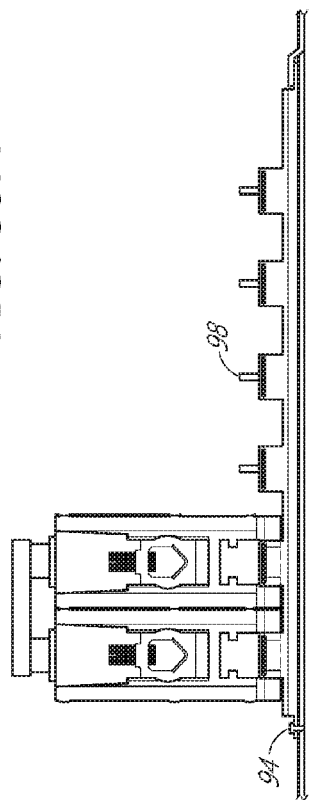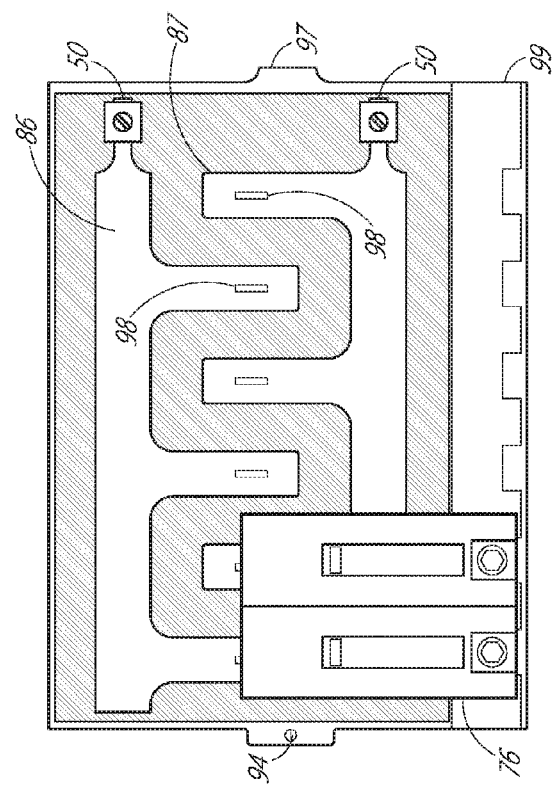
FIG. 39A
FIG. 39B

| | Description | L-N Vac | L-L Vac | Countries | WattNode Models (Wye or Delta-Voltage) |
|---|---|---|---|---|---|
| A* | 1-Phase, 2-Wire 120 V with neutral | 120 | - | US | 3Y-208 |
| B* | 1-Phase, 2-Wire 230 V with neutral | 230 | - | EU, Others | 3Y-400 |
| C* | 1-Phase, 2-Wire 208 V (No neutral) | - | 208 | US | 3D-240 |
| D* | 1-Phase, 2-Wire 240 V (No neutral) | - | 240 | US | 3D-240 |
| E* | 1-Phase, 3-Wire 120 / 240 V | 120 | 240 | US | 3Y-208 |
| F* | 3-Phase, 3-Wire 208 V Delta (No neutral) | - | 208 | US | 3D-240 |
| G* | 3-Phase, 3-Wire 230 V Delta (No neutral) | - | 230 | Norway | 3D-240 |
| H* | 3-Phase, 3-Wire 400 V Delta (No neutral) | - | 400 | EU, Others | 3D-400 |
| I* | 3-Phase, 3-Wire 480 V Delta (No neutral) | - | 480 | US | US 3D-480 |
| J* | 3-Phase, 3-Wire 600 V Delta (No neutral) | - | 600 | US, Canada | none |
| K* | 3-Phase, 4-Wire 208 Y / 120 V | 120 | 208 | US | 3Y-208, 3D-240 |
| L* | 3-Phase, 4-Wire 400 Y / 230 V | 230 | 400 | EU, Others | 3Y-400, 3D-400 |
| M* | 3-Phase, 4-Wire 415 Y / 240 V | 230 | 415 | Australia | 3Y-400, 3D-400 |
| N* | 3-Phase, 4-Wire 480 Y / 277 V | 277 | 480 | US | 3Y-480, 3D-480 |
| O* | 3-Phase, 4-Wire 600 Y / 347 V | 347 | 600 | US, Canada | 3Y-600 |
| P* | 3-Phase, 4-Wire Delta 120 / 208 / 240 Wild Phase 120, | 120 208 | 240 | US | 3D-240 |
| Q* | 3-Phase, 4-Wire Delta 240 / 415 / 480 Wild Phase 240, | 240 415 | 480 | US | 3D-480 |
| R* | 3-Phase Corner-rounded Delta 208 / 240 | - | 240 | US | 3D-240 |
| S* | 3-Phase Corner-rounded Delta 415 / 480 | - | 480 | US | 3D-480 |

FIG. 64

UTILITY METER BYPASS SYSTEMS, METHODS, AND DEVICES

CROSS-REFERENCE TO RELATED APPLICATIONS

This application claims the benefit of U.S. Provisional Application No. 62/231,050, filed Jun. 23, 2015, entitled UTILITY METER BYPASS SYSTEMS, METHODS, AND DEVICES, which is hereby incorporated by reference in its entirety.

BACKGROUND

Embodiments described herein relate to electrical components, and some particular embodiments related to bypass breakers for electrical systems and interconnection meter socket adapters and associated components which can connect various energy sources and sinks to a power system without the need to change or replace a distribution panel.

SUMMARY OF THE INVENTION

Some innovations relate to an offset bypass breaker device, the device including a housing, the housing configured to allow connection of the device to an installed electric meter without substantial alteration to the position of the installed electric meter, a plurality of busbars disposed within the housing, the plurality of busbars configured to be placed into electrical communication with the load-side of an electric metering device and a separate distribution panel, and at least one circuit breaker supported by the plurality of busbars.

The device can additionally include a substantially planar section configured to extend parallel to a base of an installed electric meter, the substantially planar section including a plurality of power transfer members configured to be placed in electrical communication with load-side components of the installed electric meter. The device can additionally include a plurality of conductive members extending perpendicular to the plurality of power transfer members, the plurality of conductive members configured to provide mechanical and electrical connection with at least one of an electric meter and a meter socket. The device can additionally include a plurality of pairs of conductive members configured to engage outer surfaces of load-side insertion jaws of a meter socket. The substantially planar section can include at least two apertures configured to allow line-side prongs of the electric meter to pass therethrough, where the at least two apertures are surrounded by insulating material.

The device can additionally include a conduit extending into the device, the conduit configured to contain wiring in electrical communication with the at least one breaker and at least one alternative energy device. The device can additionally include an AC coupler configured to disconnect the system from utility power. The device can additionally include at least one probe connected to the AC coupler and configured to monitor at least one of AC voltage, current, and frequency of the utility power, where the AC coupler is configured to disconnect the system from utility power when an indication of a disruption in the utility power is detected. The AC coupler can be disposed within the housing.

The busbars can be live busbars configured to be connected to the load side of an electric metering device. The device can additionally include a main breaker supported by the plurality of busbars, the main breaker configured to be directly connected to the load-side of an electric metering device. The device can additionally be configured to be placed into electrical communication with the electric metering device and a separate distribution panel via a flexible conduit.

The plurality of busbars can include three busbars, each of the three busbars in contact with the at least one bypass breaker. The plurality of busbars can include two busbars, each of the two busbars in contact with the at least one bypass breaker. The at least one bypass breaker can be an interchangeable breaker. The plurality of busbars can be interchangeable busbars.

Some innovations relate to an electric meter bypass extension including at least one bypass breaker, the extension including a housing portion including at least a first side, the first side of the housing being substantially planar, at least one bypass breaker disposed at least partially within the housing, and a connection portion extending outward from the housing and substantially parallel to the first side of the housing, the connection portion including a plurality of conductive members configured to be placed in electrical contact with a portion of a circuit extending between the load side of an electric meter and a separate breaker panel.

The connection portion can extend along at least a portion of the first side of the housing portion. The connection portion can include a plurality of clamping structures configured and dimensioned to allow a plurality of load-side conductive structures and a plurality of line-side conductive structures extending from an electric meter to pass therethrough. Each of the plurality of clamping structures can be configured and dimensioned to allow a plurality of load-side conductive structures to pass therethrough and can include a conductive structure in electrical communication with one of the plurality of conductive members in the connection portion. Each of the plurality of clamping structures can be configured and dimensioned to allow a plurality of load-side conductive structures to pass therethrough and can include an insulating structure.

Some innovations relate to an electric meter including at least one bypass breaker, the meter including a housing a metering device disposed within the housing for measuring power consumption from external power lines, a plurality of line-side conductive members in electrical communication with the metering device, the plurality of line-side conductive members configured to be placed in electrical communication with the external power lines, a plurality of load-side conductive members in electrical communication with the metering device, the plurality of load-side conductive members configured to be placed in electrical communication with a separate circuit breaker panel, and at least one bypass breaker disposed at least partially within the housing and in electrical communication with the second plurality of conductive members along a circuit in which the bypass breaker is disposed between the metering device and the circuit breaker panel.

The bypass breaker can allow power to be provided to the separate circuit breaker panel without passing through the metering device. The plurality of line-side conductive members can include a plurality of line-side prongs extending outward from the housing and configured to be placed in electrical communication with the external power lines. The plurality of load-side conductive members can include a plurality of load-side prongs extending outward from the housing and configured to be placed in electrical communication with the separate circuit breaker panel. The housing can additionally include an aperture to allow routing of wiring to the bypass breaker. The meter can additionally include at least a second bypass breaker disposed at least partially within the housing.

The housing can additionally include a first opening to allow access to the first breaker, and a second opening to allow access to the second breaker. The first breaker and the second breaker can be disposed on opposite sides of the meter from one another. The first bypass breaker can be configured to function as a sub breaker and the second bypass breaker can be configured to function as a main breaker and control the first bypass breaker. The at least one bypass breaker can include a two-pole circuit breaker. The at least one bypass breaker can include a one-pole circuit breaker, three-pole circuit breaker, or any other suitable type of circuit breaker.

Some innovations relate to an electric meter including at least one bypass breaker, the meter including a housing, a metering device disposed within the housing for measuring power consumption, a plurality of line-side conductive members in electrical communication with the metering device, the first plurality of prongs configured to be placed in electrical communication with external power lines, a plurality of load-side conductive members in electrical communication with the metering device, the second plurality of conductive members configured to be placed in electrical communication with a separate circuit breaker panel, and at least one breaker support disposed at least partially within the housing and dimensioned to receive a bypass breaker.

The meter can additionally include at least one conductive structure to place a bypass breaker retained within the at least one breaker support in electrical communication with the plurality of load side conductive members along a circuit in which the bypass breaker is disposed between the metering device and the circuit breaker panel.

Some innovations relate to an electric meter bypass extension including at least one bypass breaker, the extension including a housing, a plurality of line-side conductive members configured to transmit power from external power lines to a metering device, a plurality of load-side conductive members configured to transmit power from a metering device to a separate circuit breaker panel, the plurality of line-side members not connected within the extension to the plurality of load-side conductive members, and at least one bypass breaker disposed at least partially within the housing and in electrical communication with the plurality of load-side conductive members.

The extension can include a first plurality of connectors on a first face of the extension, the first plurality of connectors including at least two connectors in electrical communication with the plurality of line-side conductive members and configured to form part of a connection between the plurality of line-side conductive members and external power lines, and at least two connectors in electrical communication with the plurality of load-side conductive members and configured to form part of a connection between the plurality of load-side conductive members and the separate circuit breaker panel, and a second plurality of connectors on a second face of the extension.

The first plurality of connectors can include a plurality of conductive members extending outward from the first face of the extension. The second plurality of connectors can include a plurality of slots formed in the second face of the extension. The first and second faces of the extension are formed on opposite sides of the extension.

The housing can additionally include an aperture to allow routing of wiring to the bypass breaker. The extension can additionally include at least a second bypass breaker disposed at least partially within the housing. The housing can additionally include a first opening to allow access to the first breaker, and a second opening to allow access to the second breaker. The first breaker and the second breaker can be disposed on opposite sides of the meter from one another. The first bypass breaker can be configured to function as a sub breaker and the second bypass breaker can be configured to function as a main breaker and control the first bypass breaker.

The at least one bypass breaker can include a two-pole bypass breaker. The extension can be dimensioned to be installed between a breaker panel and an electric meter.

BRIEF DESCRIPTION OF THE DRAWINGS

FIG. 1A illustrates a front view of electric meter that includes at least one overcurrent protection device.

FIG. 1B illustrates a left side view of the electric meter of FIG. 1A.

FIG. 1C illustrates a right side view of the electric meter of FIG. 1A.

FIG. 2 illustrates a front view of the electric meter of FIG. 1A, with the side door closed.

FIG. 5A illustrates a cutaway view of a region where an electric meter engages a main panel.

FIG. 5B illustrates a cutaway view of an alternate embodiment region where an electric meter engages a main panel, including a seal.

FIGS. 13A through 13C illustrate certain steps in the installation of an offset bypass breaker panel onto a main service panel.

FIG. 14A illustrates a front view of an integral electric meter-alternative energy breaker panel system.

FIG. 14B illustrates a left side view of the integral bypass system of FIG. 14A.

FIG. 15A illustrates the integral bypass system of FIGS. 14A and 14B with the breaker cover removed.

FIGS. 18A-18C illustrate front cutaway views of various steps in the installation of both interchangeable bussing and interchangeable breakers in a bypass electric meter.

FIGS. 19A-19C illustrate front cutaway views of various steps in the installation of interchangeable breakers in a bypass electric meter having fixed bussing.

FIG. 20 illustrates a cutaway view of another embodiment of a bypass electric meter which utilizes fixed bussing.

FIGS. 21A-21C illustrate front cutaway views of the installation of interchangeable bussing and breakers in a meter bypass extension.

FIG. 21D illustrates a left side view of the meter extension bypass of FIGS. 21A-21C.

FIGS. 22A and 22B illustrate front cutaway views of the installation of interchangeable breakers in a meter extension having fixed bussing.

FIG. 22C illustrates a left side view of the meter extension bypass 11 described above with regard to FIGS. 22A and 22B

FIGS. 29A and 29B illustrate a side view of the installation and securement of an interchangeable, single-phase, lug-type bussing assembly.

FIG. 29C illustrates a top view of the bussing assembly with an installed breaker.

FIGS. 30A and 30B illustrate a side view of the installation and securement of an interchangeable, single-phase, bussing assembly connected to a main breaker.

FIG. 30C illustrates a top view of the bussing assembly with an installed breaker.

FIGS. 36A and 36B illustrate a side view of the installation and securement of an interchangeable, no-lug, three-phase bussing assembly.

FIG. 36C illustrates a top view of the bussing assembly.

FIGS. 37A and 37B illustrate a side view of the installation and securement of an interchangeable, lug-type, three-phase bussing assembly.

FIG. 37C illustrates a top view of the bussing assembly with an installed breaker.

FIG. 39A illustrates a side view of an interchangeable, lug-type, single-phase bussing assembly with an installed breaker.

FIG. 39B is a top view of the bussing assembly of FIG. 39A.

FIG. 64 is a table of various power systems which are used in certain countries.

DETAILED DESCRIPTION OF THE PREFERRED EMBODIMENT

Figure 3B:
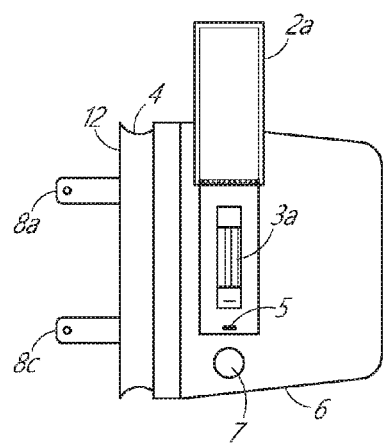
FIG. 3B illustrates a left side view of the electric meter of FIG. 3A.

A distribution panel, or main electrical panel, can serve as a hub where an electrical power feed is divided into subsidiary circuits. Distribution panels of different capacities (e.g., 150 amp, 200 amp, or 400 amp) are installed into homes or other locations based on their anticipated electrical usage needs. Power carried by the power feed is distributed to the users via the distribution panel. An increased load that results from more electrical current flowing through the distribution panel may require upgrading or replacing the distribution panel to accommodate the increased current.

With the increasing use of renewable and other alternative energy sources, a user that traditionally consumes electrical power may provide electrical power into a distribution grid at certain times. This backfeed of energy may exceed the current capacity of an existing distribution channel, again requiring upgrading or replacing the distribution panel to accommodate the increased current. In addition, in many cases there is no room in the distribution panel for additional circuits, even if the current capacity would not be exceeded by the addition of one or more additional circuits.

A variety of interconnection meter socket adapters and other bypass devices are discussed herein. In some embodiments, these devices may be under utility seal and ownership. In some embodiments, these devices may be connected such that electrical power may be delivered to the user while the electrical meter accurately reflects the total power consumption and redistribution of the user. The use of a bidirectional measurement module can facilitate this process.

Certain embodiments are configured to be coupled to a DC-AC converter, which may in turn be coupled to various energy sources. A connector such as a flexible or rigid conduit may be used to form a part of such connections, in order to comply with local codes and regulations.

FIGS. 1A-1C illustrate various views of an electric meter that includes at least one overcurrent protection device (OCPD). FIG. 1A illustrates a front view of electric meter that includes at least one overcurrent protection device. FIG. 1B illustrates a left side view of the electric meter of FIG. 1A. FIG. 1C illustrates a right side view of the electric meter of FIG. 1A.

The electric meter includes a housing 6 and a display 10. In some embodiments, the housing 6 may be circular in cross section and may have either a uniform or a sloping profile from back to front. The housing 6 may comprise at least two separable and rigid components—a base portion and an outwardly extending portion, respectively, the outwardly extending portion extending away from the base portion and cooperating with the base portion to define an enclosed region—that can be held together mechanically by any suitable arrangement, such as by using a plurality of clips (not shown). The base portion of the housing 6 may be circular. The outer diameter of the base portion of the housing 6 is dimensioned to allow the electric meter 1 to be seated in an appropriately sized and configured meter socket. However, in other embodiments, the housing 6 may be any suitable size or shape, and may be formed from any appropriate material, and may include more or fewer components than shown in the illustrated implementation.

In the illustrated embodiment, the outwardly extending portion of the housing 6 of the electrical meter 1 can have a plurality of cutouts to accommodate one or more displays 10, communication hardware (not shown), and any other suitable components, depending on the particular implementation. The electric meter 1 can include electronic component such as a motherboard (not shown) that in some particular embodiments may be disposed proximate to the front-facing exterior portion of the outwardly extending portion of the housing 6 of the electrical meter 1 in which the one or more displays 10 are disposed. The electronic components can include control electronics, and can receive electrical power for its operation from an electrical communication with the line-side conductive prongs 8a and 8b. The motherboard can also be in electrical communication with a current transformer in order to provide energy consumption and energy delivery data (e.g., the amount of electrical energy (in kWh) produced by alternative energy sources, some of which can be delivered to the electrical grid by one or more alternative energy sources connected to the meter) that can be displayed. In some embodiments, the motherboard may be disposed within the interior of the outwardly extending portion of the housing 6 of the electrical meter 1.

The display 10 may be an LCD display or other suitable display, and may alternately display customer utility energy usage data. In some particular embodiments, the energy usage data may be displayed in kWh, and the instantaneous total root mean square AC line voltage at the meter from the utility (in Volts) may also be displayed. The display 10 may also continuously display whether or not electrical energy from an alternative energy source such as a solar panel array connected to the meter is being backfed to the utility. In some embodiments, the electric meter 1 utilizes an overcurrent protection device (OCPD), not shown.

As can best be seen in FIG. 1B, the electric meter 1 also includes at least one bypass breaker 3 disposed at least partially within the housing 6. As described in greater detail elsewhere in the specification, the at least one bypass breaker 3 can be either a fixed breaker or an interchangeable breaker. In the illustrated embodiment, the housing 6 also includes an aperture or a knockout or cutout section of the housing on at least one side of the housing 6, providing access to the at least one bypass breaker 3, and allowing routing of wires from an alternative energy source to the bypass breaker 3. In the illustrated embodiment, a hinged access door 2 is shown open above the aperture. A latch 5 can be used to hold down the hinged access door 2 when the door is closed, and may in some embodiments be used to provide a waterproof seal, so that the housing 6 can be waterproof Other suitable structures can also be used to cover the aperture, such as press-fit covers. The cutout 7 is dimensioned to accommodate a threaded end of a rigid conduit member (not shown) for connecting an external device to the bypass breaker 3. For example, an alternative energy source may be connected to the at least one bypass breaker 3 via electrical wires or leads (not shown), which may be guided through the threaded end of the conduit member for connection to bypass breaker 3. The outwardly extending portion of housing 6 abuts the base portion of the housing 6 in a rimmed projection 4 around which a meter ring (not shown) can be placed, tightened, and fitted with a tamperproof seal in accordance with the standards of the local utility.

FIG. 1C illustrates a right side view of the electric meter 1 shown in FIGS. 1A and 1B. As illustrated in this embodiment, an additional overcurrent protection device is not provided on the right side of the electrical meter 1, but at least one overcurrent protection device may be included on the right side of the meter 1 in other embodiments.

The rearmost exterior area of the base portion of the housing 6 is positioned proximate to the jaws of a meter socket when the electric meter 1 is installed, and may include a plurality of conductive connectors for connection with other load-side components. In some embodiments, these connectors may include integrally seated and externally protruding line-side conductive prongs 8a and 8b, also referred to as socket spades, which may be inserted into socket jaws in electrical communication with external utility power lines. In the interior of the base portion of the casing, electrical wires or leads in electrical communication with the line-side spades are routed in series to busbars (not shown) and from the busbars to a plurality of conductive connectors for connection with load-side components. In some embodiments, these conductive connectors may include integrally seated and externally protruding load-side conductive prongs 8c and 8d. The busbars can be either fixed or interchangeable. A current transformer (not shown) or other suitable current-sensing can be in electrical communication with the electrical wires or leads that are in electrical communication with the line-side conductive prongs 8a and 8b.

Although the embodiments described herein primarily discuss the use of breakers as OCPDs, any suitable OCPD may be used in other embodiments, including but not limited to fuses, bimetallic strips, or other electronic overcurrent protection devices.

Figure 3C:
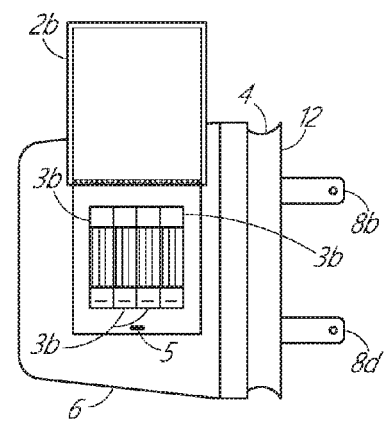
FIG. 3C illustrates a right side view of the electric meter of FIG. 3A.
Figure 3A:
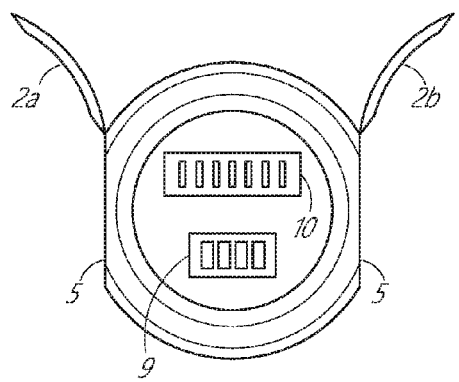
FIG. 3A illustrates a front view of electric meter including overcurrent protection devices on two sides of the electric meter.

FIG. 3A illustrates a front view of electric meter including overcurrent protection devices on two sides of the electric meter. FIG. 3B illustrates a left side view of the electric meter of FIG. 3A. FIG. 3C illustrates a right side view of the electric meter of FIG. 3A.

As can be seen in FIG. 3A and FIG. 3C, the electric meter 1' has an access door 2a on one side and an access door 2B on the opposite side. Overcurrent protection devices such as bypass breakers can be located on each side of the device, and can be accessed via the access doors 2a and 2b. In particular, a first bypass breaker 3a is installed on the left side of the electric meter 1' and a second bypass breaker 3b is installed on the right side of the electric meter 1'. As discussed in greater detail elsewhere within the specification, these breakers may be fixed breakers which may in some embodiments be permanently or semi-permanently installed, or may be interchangeable breakers which may in some embodiments be more easily installed and replaced.

Figure 4B:
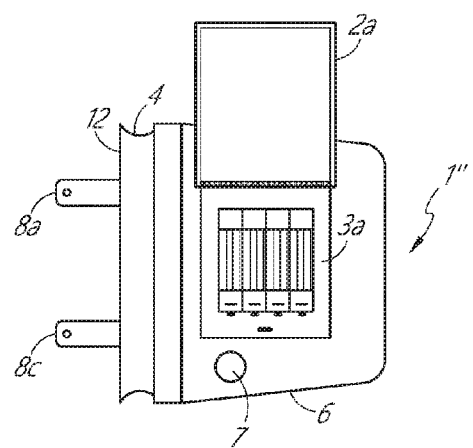
FIG. 4B illustrates a left side view of the electric meter of FIG. 4A.
Figure 4C:
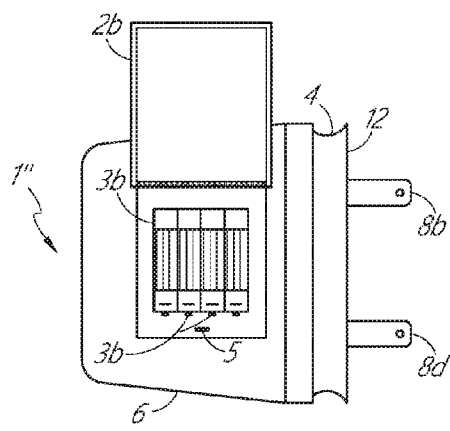
FIG. 4C illustrates a right side view of the meter of FIG. 4B.
Figure 4A:
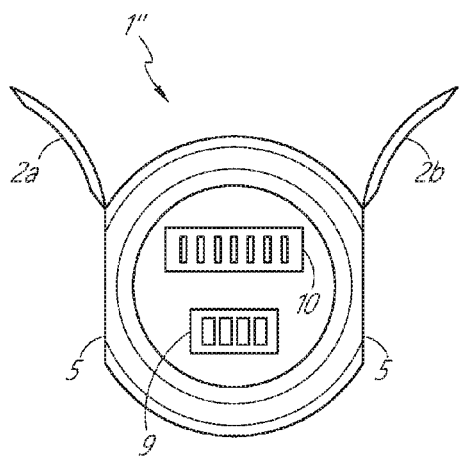
FIG. 4A illustrates a front view of an electric meter which has a plurality of bypass breakers on two sides of the electric meter.

Any suitable number of overcurrent protection devices may be provided in a bypass electric meter. FIG. 4A illustrates a front view of an electric meter which has a plurality of bypass breakers on two sides of the electric meter. FIG. 4B illustrates a left side view of the electric meter of FIG. 4A. FIG. 4C illustrates a right side view of the meter of FIG. 4B.

As can be seen in FIGS. 4B and 4C, the electric meter 1" includes a plurality of bypass breakers 3a on the left side of the electric meter 1", and a plurality of bypass breakers 3b on the right side of the electric meter 1". With conventional electric meter and breaker dimensions, an electric meter 1" can accommodate two rows of four breakers each, as depicted in FIGS. 4A to 4C. However, any suitable number of breakers can be provided on each side of the breakers. For example, in some embodiments, there may be one, two, three, four, or more breakers on the left side of the device, and one, two, three, four, or more breakers on the right side of the device. In addition, the breakers need not be located on the left and right sides of the device. For example, breakers can be included on the top, base, or front of the electric meter 1".

When multiple circuit breakers are included in an electric meter or other device, such as electric meter 1" or one of the other alternative structures discussed elsewhere in the specification, one or more of the circuit breakers can be configured to be operated as a main circuit breaker, with one or more of the other circuit breakers configured to be operated as a sub circuit breaker. When configured a main breaker and one or more sub breakers, toggling off the main breaker will also shut off the corresponding one or more sub breakers. In some embodiments, only one of the breakers in the electric meter 1" may be configured as a main breaker, with the remaining breakers configured as sub breakers. In other embodiments, one breaker on each side of the electric meter 1" may be configured as a main breaker, with the other breakers on each side being configured as sub breakers of the main breaker on their side. Any other configuration of main and sub breakers are also possible. The configuration of at least one breaker as a main breaker and at least one breaker as a sub breaker may be accomplished, for example, through the wiring and arrangement of the busbars within the electric meter 1" or other device.

FIG. 5A illustrates a cutaway view of a region where an electric meter engages a main panel. In particular, FIG. 5A cutaway view of a region where a backmost profile portion 17 of a transparent cover or housing of an electric meter engages with a flanged metal portion 19 of a front panel member of a main service panel when the electric meter is inserted into a meter socket of the main service panel.

However, even after the electric meter has been properly installed in the meter socket of the main service panel, and a retaining ring 15 (shown in profile) has been placed around the entire circumference of the backmost profile portion 17 of the cover of the electric meter and tightened down, the possibility still exists that water (from, for example, wind-driven rain, snow melting in the vicinity of the flanged metal portion 19 of the front panel member, etc.) can be introduced between the interior region of the backmost portion 17 of the cover of the electric meter and the convex surface of the flanged metal portion 19 of the front panel member of the main service panel, thereby entering the main service panel and potentially coming into contact with the insertion jaws of the meter socket of the main service panel. This may pose a safety hazard.

FIG. 5B illustrates a cutaway view of an alternate embodiment region where an electric meter engages a main panel, including a seal. In particular, FIG. 5B illustrates a magnified cutaway view of a region where a backmost profile portion 18 of a transparent cover or housing of an electric meter engages with a flanged metal portion 19 of a front panel member of a main service panel when the electric meter is inserted into a meter socket of the main service panel. It can be seen that the cross-section of profile portion 18 differs from that of profile portion 17 depicted in FIG. 15. In addition, outermost lateral surface of the backmost profile portion 18 has been fitted with a form-fitting flange retention member that catches and fixedly retains the terminus of flanged portion 19. Waterproof sealing material 20 may be disposed circumferentially between the convex outer surface of the flanged metal panel 19 and the interior of the backmost profile portion 18 of the transparent cover of the electric meter.

Figure 6C:
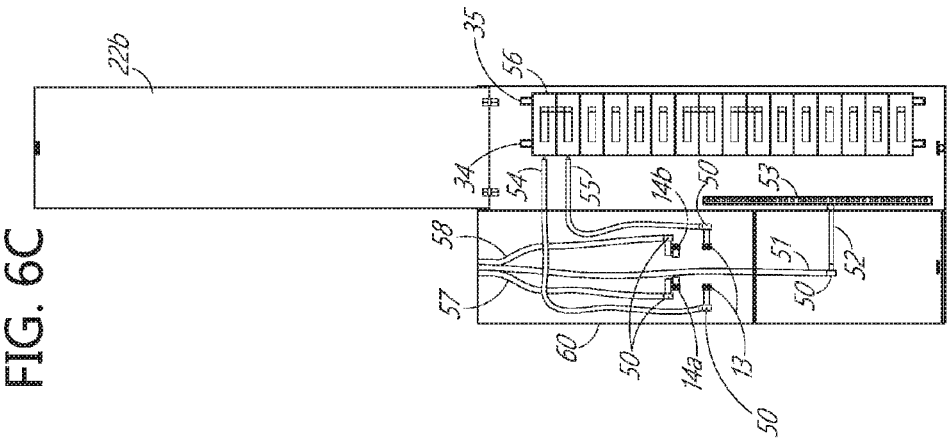
FIG. 6C illustrates the breaker panel of FIGS. 6A and 6B, with panels removed.
Figure 6B:
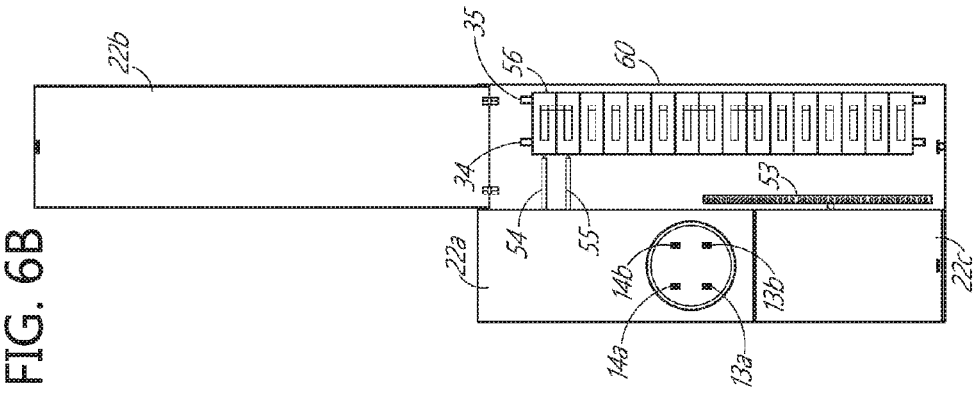
FIG. 6B illustrates the panel of FIG. 6A, with the hinged door open.
Figure 6A:
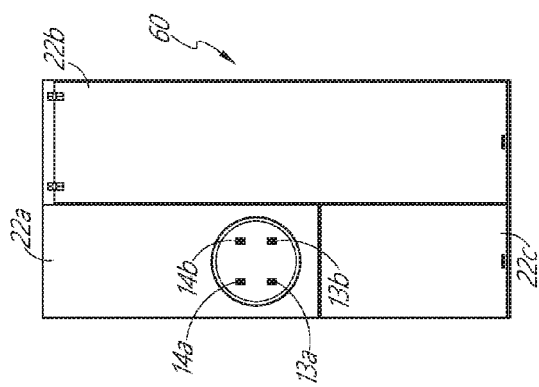
FIG. 6A illustrates a surface-mounted or flush-mounted breaker panel without an electric meter.

FIG. 6A illustrates a surface-mounted or flush-mounted breaker panel without an electric meter. The breaker panel 60 can also be referred to as a main service panel. As illustrated, a meter socket comprises two utility-side, or line-side, insertion jaws, 14a and 14b, and two load-side insertion jaws, 13a and 13b. Utility-side insertion jaws 14a and 14b are in respective electrical communication with A-phase 120 VAC and B-phase 120 VAC power lines (not shown in FIG. 6A) from the utility. Load-side insertion jaws 13a and 13b are in respective electrical communication with the main breaker (not shown) of panel 60. Panel 22a, seated beneath the meter socket, can include a portion which is flanged in profile and which facilitates securement of an electric meter to panel 60. Hinged door 22b covers the area of the panel 60 in which a main circuit breaker, sub circuit breaker, or branch circuit breakers, can be disposed, along with A-phase and B-phase busbars.

Panel 22c covers an area of the panel 60 through which utility wiring can be located. In some embodiments, a utility common wire from an overhead electrical service can be routed through this area prior to being mechanically and electrically connected to a common or neutral bar 53 (see FIG. 6B) in the panel 60. In some other embodiments, the utility mains from an underground utility service conduit can be routed through this area prior to being electrically connected to electrical lugs 50 (see FIG. 6C) that are in electrical communication with insertion jaws 14a, 14b of the meter socket. The utility common can also be routed through this area prior to being mechanically and electrically connected to a common or neutral bar in the panel 60.

FIG. 6B illustrates the panel of FIG. 6A, with the hinged door 22b open. In the illustrated embodiment, the wire 54 connects A-phase 120 VAC, in electrical communication with the load-side insertion jaw 13a, to main breaker 56, and wire 55 connects B-phase 120 VAC, in electrical communication with the load-side insertion jaw 13b, to main breaker 56. Common ground bar 53 is in electrical communication with the common (or ground) wire 51 (see FIG. 6C), coming into the panel 60 from the utility.

FIG. 6C illustrates the breaker panel of FIGS. 6A and 6B, with panels removed. In particular, it can be seen that panels 22a and 22c have been removed. Wire 57 is in electrical communication with the A-phase 120 VAC power line from the utility. Wire 58 is in electrical communication with the B-phase 120 VAC power line from the utility. Wire 51 is in electrical communication with the utility common. Each of wires 51, 57, and 58 are introduced to panel 60 through one or more metal or PVC conduits, also referred to as a riser (not shown). In the illustrated embodiment, wire 57 is secured in an electrical lug 50 that is in electrical communication with utility-side insertion jaw 14a, wire 58 is secured in an electrical lug 50 that is in electrical communication with utility-side insertion jaw 14b, and wire 51 is secured in an electrical lug 50 that is in electrical communication with common or neutral bar 53, such as via jumper bar 52.

In the illustrated embodiment, one end of wire 54 is mechanically secured to an electrical lug 50 that is in electrical communication with load-side insertion jaw 13a, and the other end of wire 54 is inserted into and mechanically secured to an electrical lug (not shown) in main breaker 56. Likewise, one end of wire 55 is mechanically secured to an electrical lug 50 that is in electrical communication with load-side insertion jaw 13b; the other end of wire 55 is inserted into and mechanically secured to an electrical lug (not shown) in main breaker 56. Until an electric meter is inserted into and properly seated in insertion jaws 14a & 14b and 13a & 13b, neither A-phase 120 VAC electricity nor B-phase 120 VAC electricity is actually present in either wire 54 or wire 55. After proper installation of an electric meter, A-phase 120 VAC and B-phase 120 VAC electricity transits the electrical meter, entering the meter via line-side conductive prongs and exiting the meter via load-side conductive prongs.

Figure 7D:
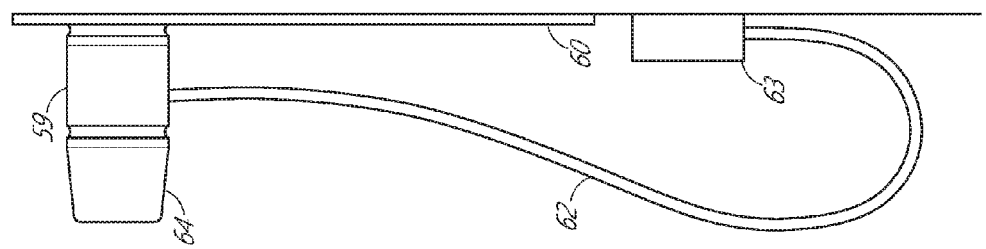
FIG. 7D illustrates bypassing elements installed between a flush-mounted main service panel and an electric meter.
Figure 7A:
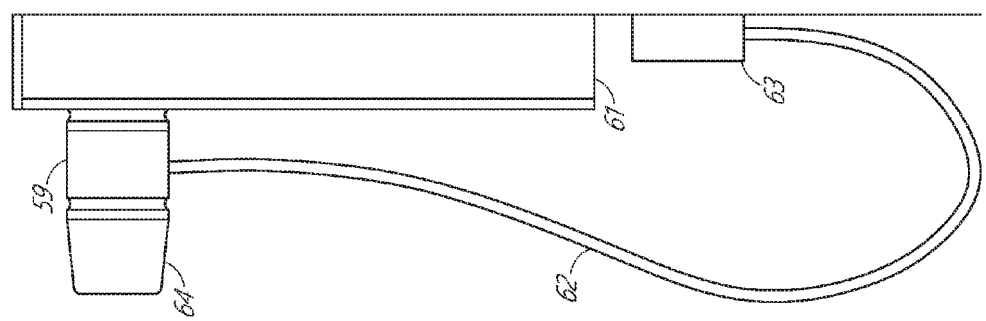
FIG. 7A illustrates bypassing elements installed between a surface-mounted main service panel and an electric meter.

FIG. 7A illustrates bypassing elements installed between a surface-mounted main service panel and an electric meter. As illustrated, original electric meter 64 has been pulled from the meter socket of main service panel 61 in which it had been seated, meter extension 59 has been inserted into the meter socket of panel 61, and the original electric meter 64 has been inserted into the outwardly facing receiving surface, alternatively referred to as the face, of meter extension 59. Also as illustrated, conduit 62, which may be flexible or rigid, is in mechanical communication with both meter extension 59 and junction box 63; and four wires are routed through conduit 62 between meter extension 59 and junction box 63, as shown in greater detail in FIGS. 7B and 7C.

Wire 171a is in electrical communication with A-phase 120 VAC from the utility, tapped from the A-phase power transfer bar that provides electrical continuity from the load-side A-phase insertion jaw of the meter socket of main panel 61 into which load-side prong off meter extension 59 is inserted to the load-side jaw at the face of meter extension 59 into which the load-side prong of meter 64 is inserted. In a similar fashion, wire 171b is in electrical communication with B-phase 120 VAC from the utility, tapped from the B-phase power transfer bar that provides electrical continuity from the load-side B-phase insertion jaw of the meter socket of main panel 61 into which load-side prong of meter extension 59 is inserted to the load-side jaw b at the face of meter extension 59 into which the load-side prong of meter 64 is inserted. Wire 171c is in electrical communication with the common or neutral wire from the utility, and wire 171d is in electrical communication with a local grounding rod (not shown). The meter extension 59, conduit 62, and junction box 63 thus collectively serve as bypassing elements.

Figure 7B:
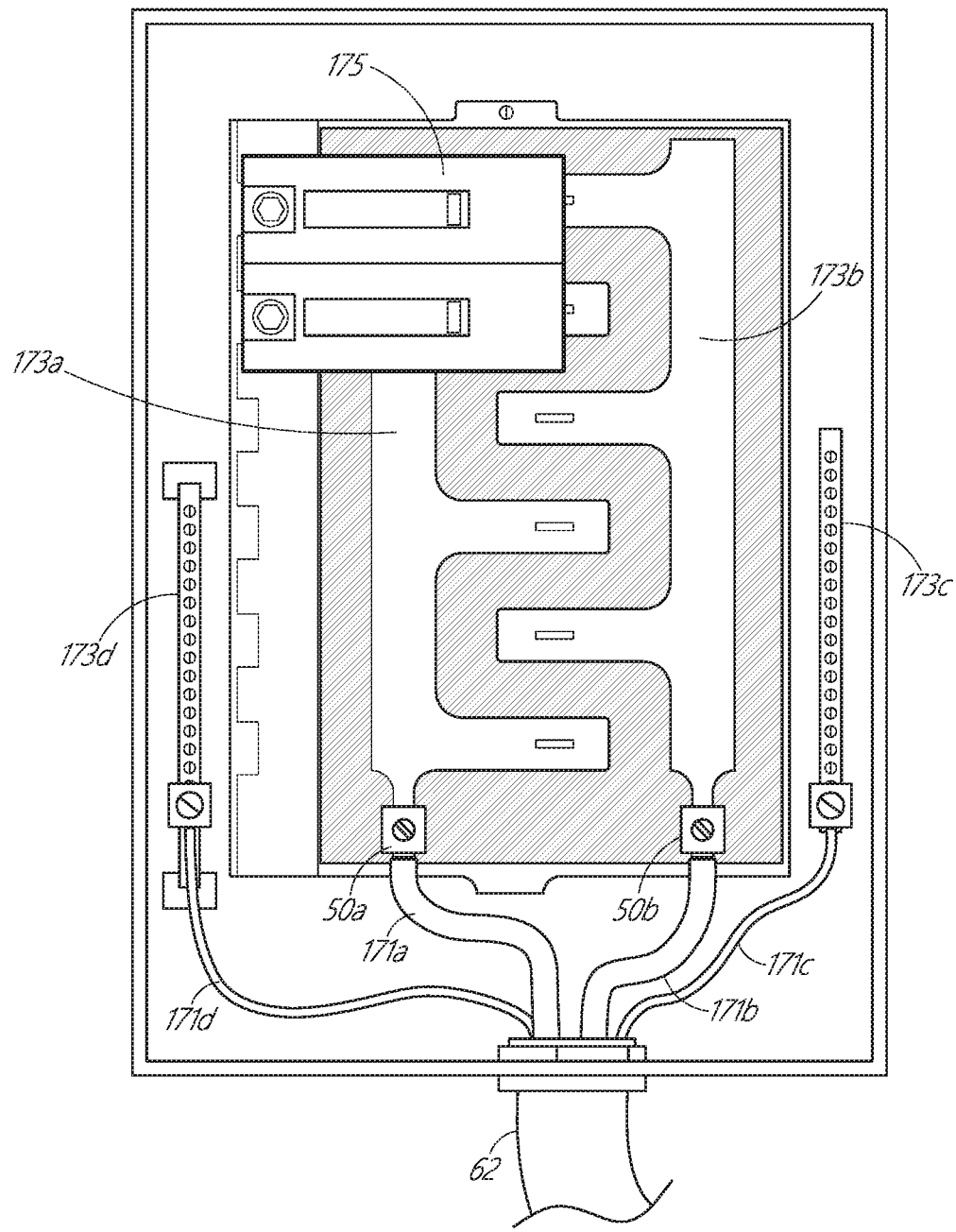
FIG. 7B illustrates a front view of the junction box depicted in profile in FIG. 7A.

FIG. 7B illustrates a front view of the junction box depicted in profile in FIG. 7A. The mechanical and electrical connections in the illustrated embodiment are depicted in greater detail in FIG. 7B, such as the mechanical and electrical connections made between the ends of the above-described four wires routed through conduit 62 from meter extension 59 to dedicated elements within junction box 63. The stripped end of wire 171a is secured in electrical lug 50a, which is in mechanical communication with busbar 173a, thereby establishing electrical communication between wire 171a and busbar 173a, electrifying busbar 173a with A-phase 120 VAC. Similarly, the stripped end of wire 171b is secured in an electrical lug 50b, which is in mechanical communication with busbar 173b, thereby establishing electrical communication between wire 171b and busbar 173b, electrifying busbar 173b with B-phase 120 VAC. The stripped end of wire 171c is secured in an electrical lug of insulated neutral or common bar 173c (see FIG. 7C), and the stripped end of wire 171d is secured in an electrical lug of grounding bar 173d. In some jurisdictions, electrical code mandates that both ground and neutral lines be secured within a junction box or subpanel during the installation of microinverter-based alternative energy sources.

Figure 7C:
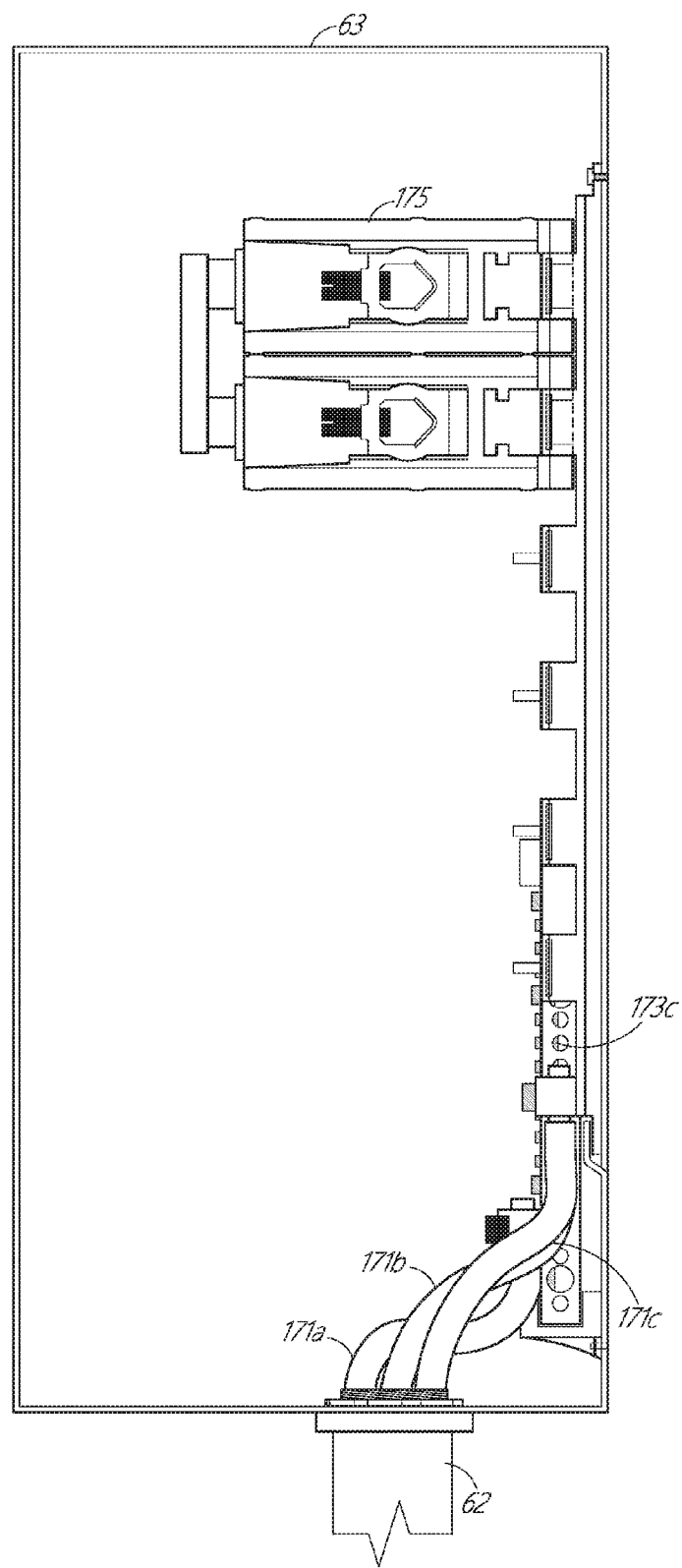
FIG. 7C illustrates an enlarged view of the junction box 63 shown in profile in FIG. 7A.

As illustrated in both FIGS. 7B and 7C, a double-pole alternative energy breaker 175 is installed in junction box 63. It can be seen that the alternative energy breaker 175 engages both the A-phase and B-phase busbars. Both busbar 173a and busbar 173b are continuously powered. If additional alternative energy breaker or breakers were to be inserted into junction box 63 beside breaker 175, toggling breaker 175 off would not shut off power to the other breaker(s). The A-phase and B-phase wires from alternative energy sources can be routed through a conduit to junction box 63, for connection to respective alternative energy breaker(s), entering junction box 63 via an appropriate means, such as a partially stamped opening in a side of junction box 63, also referred to as a "knock out" in which a threaded end of the conduit is secured inside junction box 63.

FIG. 7C illustrates a side view of the junction box 63 shown in profile in FIG. 7A. FIG. 7D illustrates bypassing elements installed between a flush-mounted main service panel 61 and its electric meter 64, in manner similar or identical to that set forth above in the description of FIG. 7A.

Figure 7E:
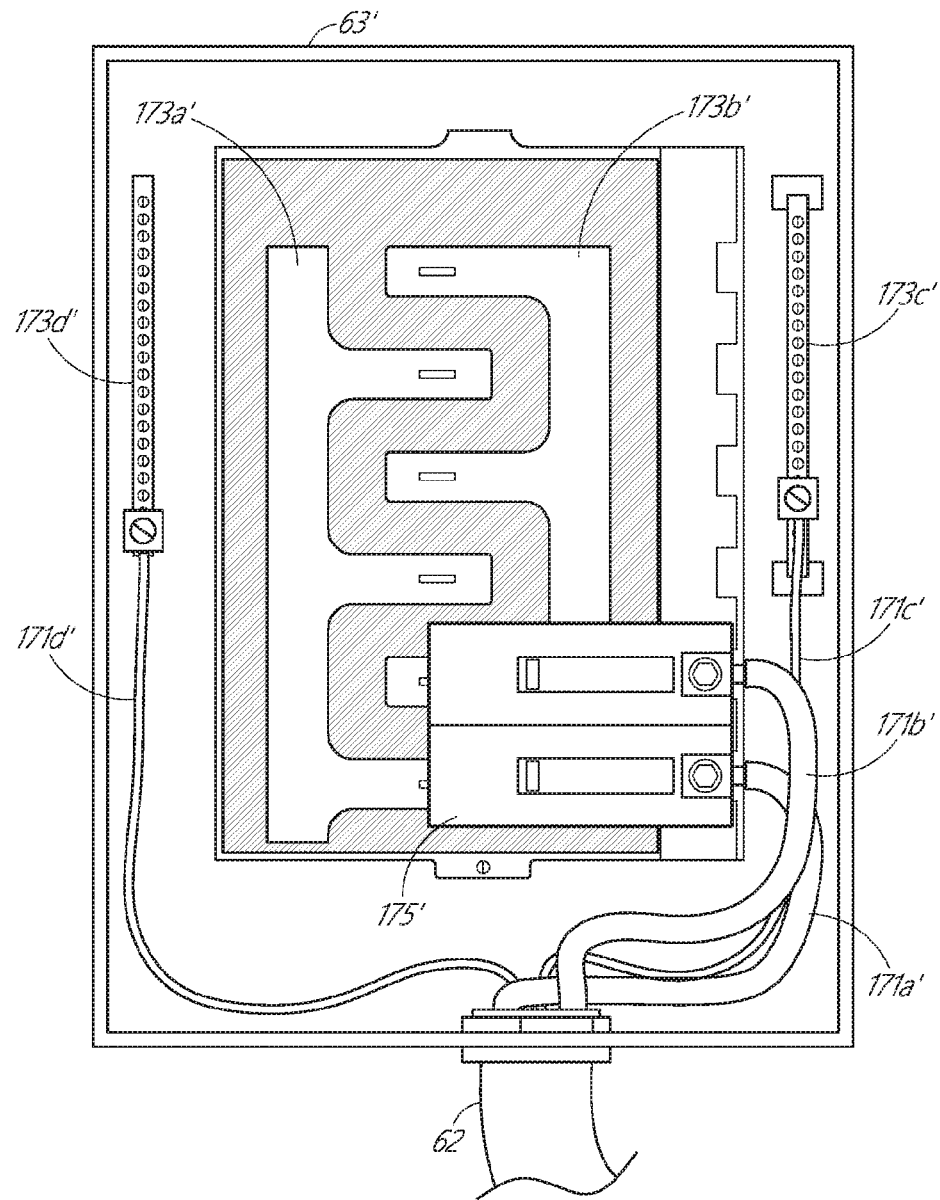
FIG. 7E illustrates a front view of an alternative embodiment of a junction box.

FIG. 7E illustrates a front view of an alternative embodiment of a junction box. The junction box 63' includes similar internal elements to those disposed in junction 63, which can be utilized in some embodiments in lieu of the junction box 63 illustrated and described above in FIGS. 7A-7D. However, the junction box 63' and the junction box 63 differ in the manner in which the respective A-phase and B-phase busbars in each box are powered.

As set described above with respect to FIGS. 7B and 7C, busbars 173a and 173b in junction box 63 are powered by dedicated connections with wires 171a and 171b, respectively, which are in electrical communication with the A-phase 120 VAC and B-phase 120 VAC from the utility. By contrast, the busbars 173a' and 173b' in junction box 63' are only powered when a main circuit breaker 175', into which wires in electrical communication with the A- and B-phase 120 VAC lines from the utility have been inserted, is seated or otherwise installed, on busbars 173a' and 173b' in junction box 63'. In such an arrangement, in the event that alternative breakers (not shown) are installed in junction box 63' downstream of the main breaker 175', toggling of the main breaker 175' will simultaneously shut off all electrical power to those alternative energy breakers. This differs from the manner in which alternative energy breakers are managed in junction box 63, in that any alternative energy breaker(s) disposed in a junction box such as junction box 63, whose busbars are powered by dedicated connections with wires from the utility, can be turned off or on independently of one another.

Figure 7F:
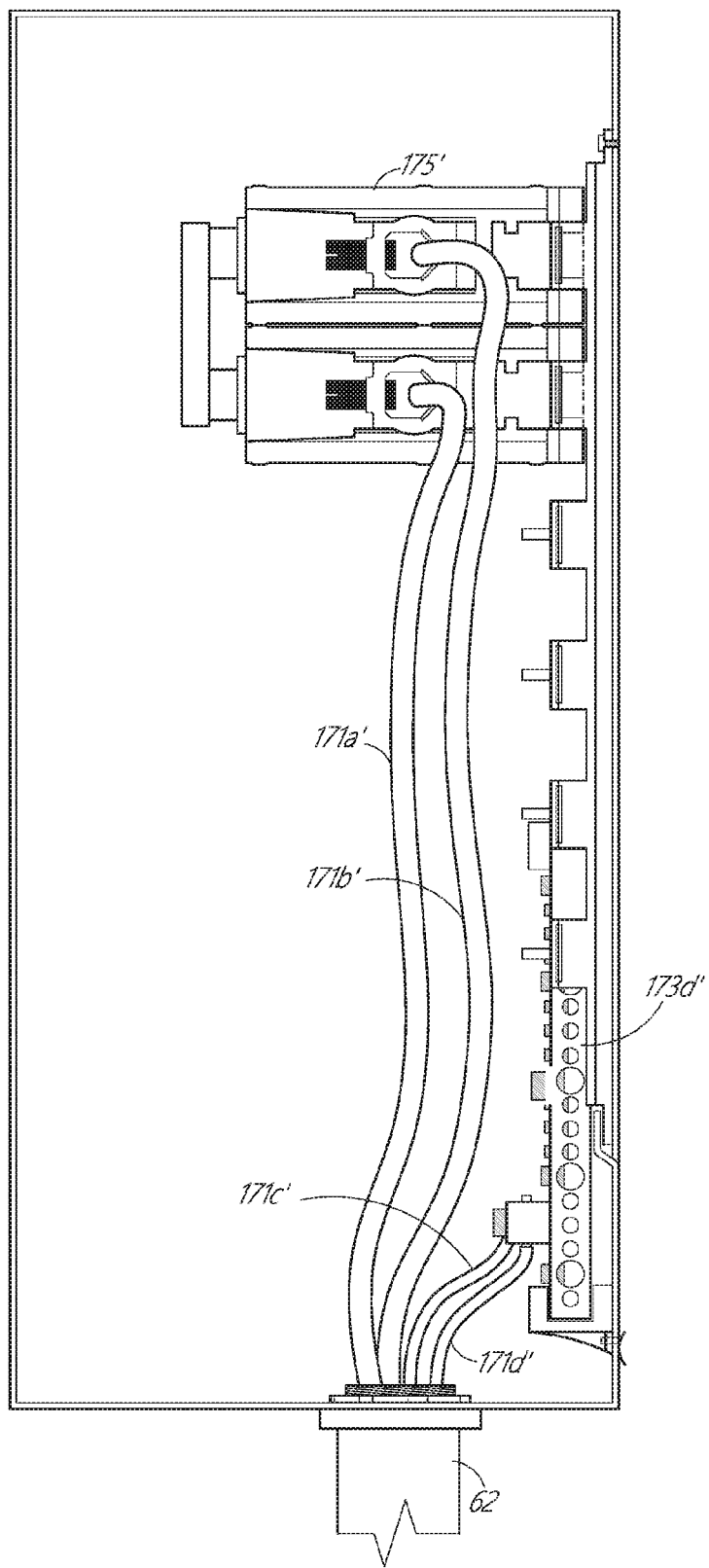
FIG. 7F illustrates an enlarged view a junction box similar to the junction box of FIG. 7E.

FIG. 7F illustrates an enlarged view a junction box similar to the junction box of FIG. 7E. In FIG. 7F it can be seen that main breaker 175' is installed at the opposite end of the busbars 173a' and 173b', to more clearly illustrate the depiction of the connection of wires within the junction box 63'.

Figure 8A:
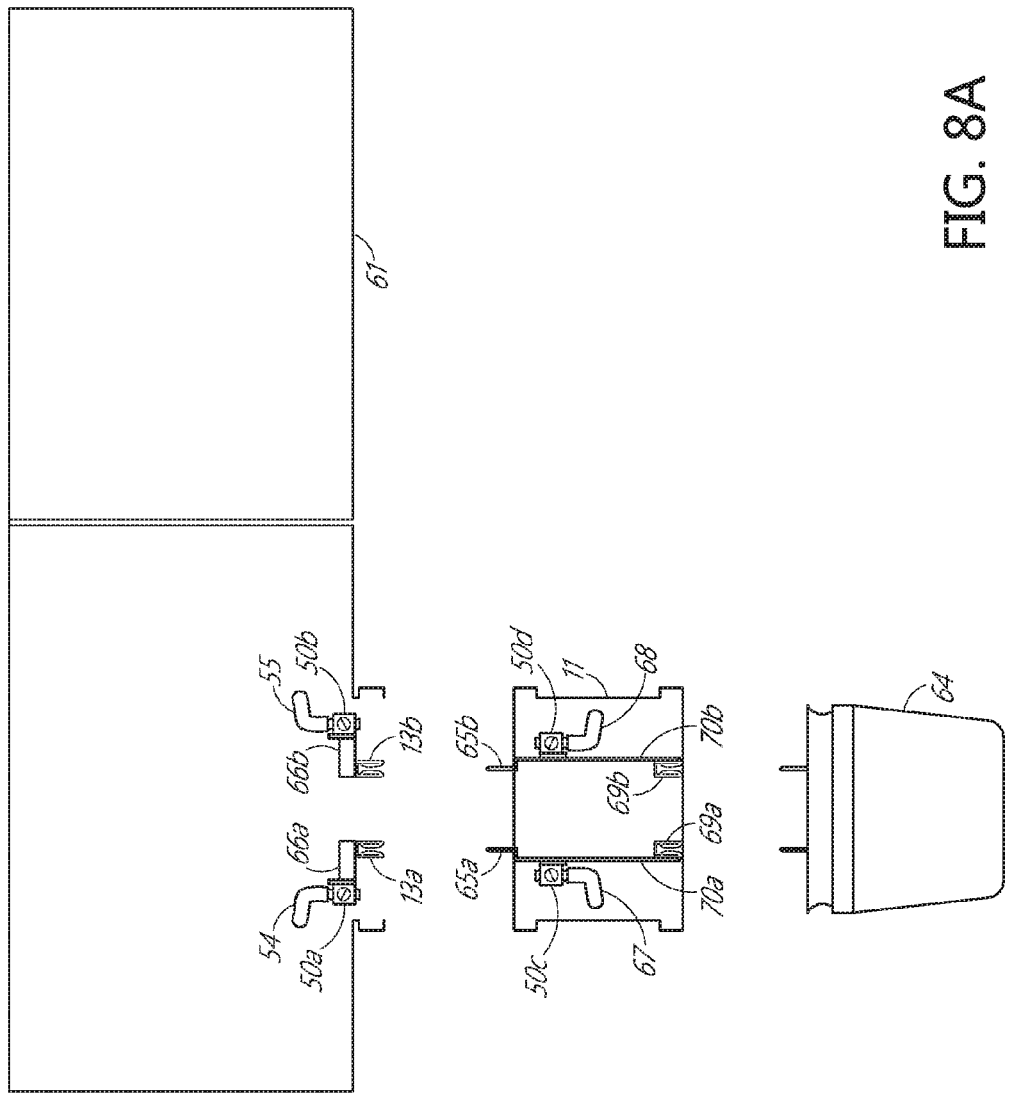
FIGS. 8A through 8C illustrate certain steps in the installation of a meter extension and electric meter in a main panel.
Figure 8B:
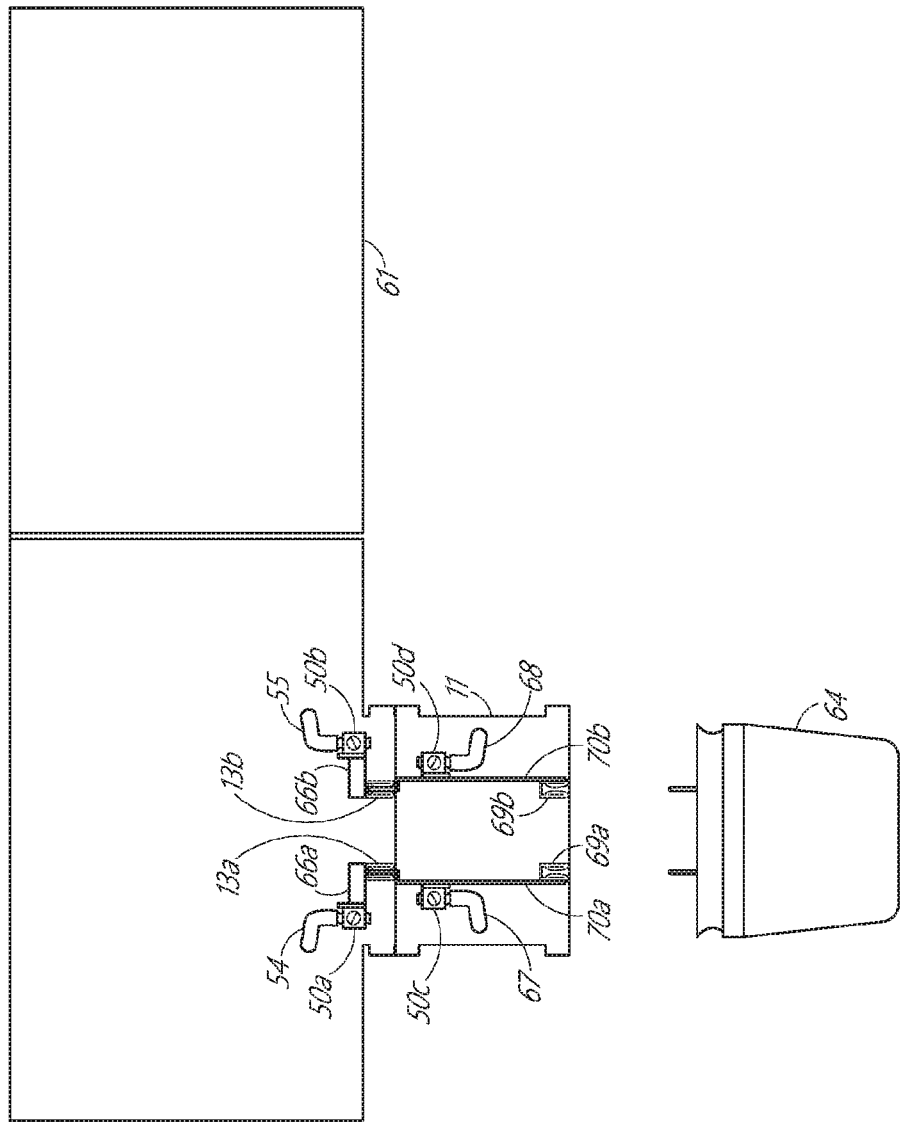
Figure 8C:
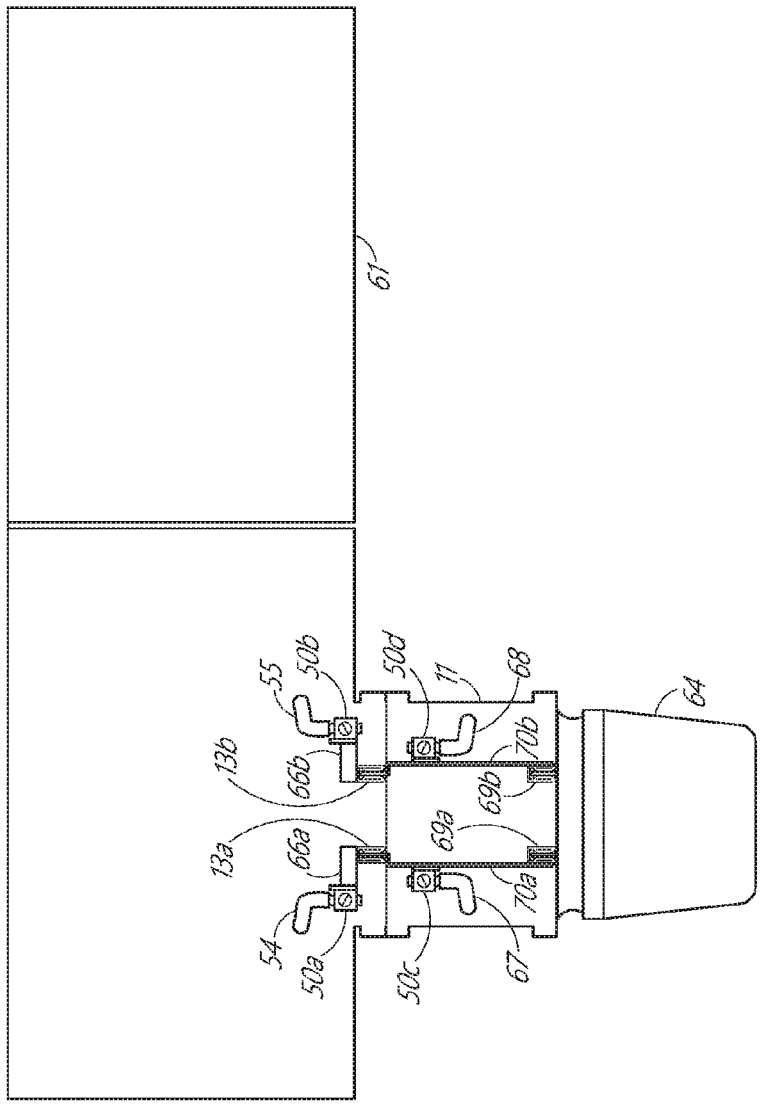

FIGS. 8A through 8C illustrate certain steps in the installation of a meter extension and electric meter in a main panel. FIG. 8A illustrates a meter extension 11, an electric meter 64, and a surface-mount main panel 61 from which electric meter 64 has been pulled. As illustrated, load-side insertion jaw 13a and receiving side member 66a are in mechanical and electrical communication with one another, and electrical lug 50a is in mechanical and electrical communication with receiving side member 66a. One end of wire 54 is secured in electrical lug 50a, and the other end of wire 54 is inserted into and mechanically secured in an electrical lug of main circuit breaker 56 (see FIG. 8C) of the main panel 61.

Similarly, as illustrated, load-side insertion jaw 13b and receiving side member 66b are in mechanical and electrical communication with one another, and electrical lug 50b is in mechanical and electrical communication with receiving side member 66b. One end of wire 55 is secured in electrical lug 50b, and the other end of wire 55 is in inserted into and mechanically secured to an electrical lug of a main circuit breaker of the main panel 61.

Load-side prongs 65a and 65b of meter extension 11 are to be inserted into load-side insertion jaws 13a and 13b, respectively. Line-side prongs are also inserted into line-side insertion prongs (not shown), respectively.

Wires 67 and 68 are bypass taps that are respectively used to bring A-phase 120 VAC to an A-phase busbar and B-phase 120 VAC to a B-phase busbar in the meter extension 11. As illustrated, power transfer bar 70a is in electrical communication with both load-side prong 65a and load-side insertion jaw 69a of meter extension 11. Also as illustrated, power transfer bar 70b is in electrical communication with both load-side prong 65b and load-side insertion jaw 69b of meter extension 11. One end of A-phase tap wire 67 is secured in electrical lug 50c that is in electrical communication with power transfer bar 70a. The other end of A-phase tap wire 67 is connected to an A-phase 120 VAC busbar housed within meter extension 11. One end of B-phase tap wire 68 is secured in electrical lug 50d that is in electrical communication with power transfer bar 70b. The other end of B-phase tap wire 68 is connected to a B-phase 120 VAC busbar housed within meter extension 11, which, as illustrated, is positioned to be inserted into main panel 61 in a subsequent step, as can be seen in FIG. 8B.

In FIG. 8B load-side insertion prongs 65a and 65b of meter extension 11 have been fully inserted into load-side insertion jaw 13a and 13b of main panel 61, respectively. Although not illustrated, line-side insertion prongs (not shown) of meter extension 11 have also been fully inserted into line-side insertion jaws (not shown), respectively, along with the insertion of load-side insertion prongs 65a and 65b of meter extension 11 into load-side insertion jaws 13a and 13b, resulting in the installation of meter extension 11 in main panel 61.

In FIG. 8C the electric meter 64 has been inserted into meter extension 11. This can be accomplished, for example, simply by respectively inserting load-side insertion prongs of the electric meter 64 into load-side insertion jaws of the meter extension 11, and inserting line-side insertion prongs 8a and 8b of electric meter 64 into line-side insertion jaws 69c and 69d, respectively, and ensuring that the meter is fully seated in the meter extension 11. Both the meter extension 11 and electric meter 64 can be respectively secured with retaining rings, to the flange of the surface mount 61 in the case of the meter extension 11, and to the outermost collar of meter extension 11 in the case of the electric meter 64.

Figure 9B:
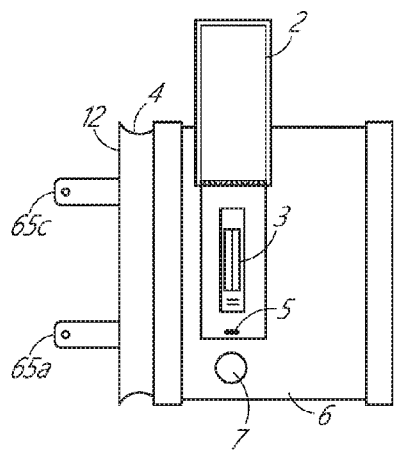
FIG. 9B illustrates a left side view of the meter extension of FIG. 9A.
Figure 9C:
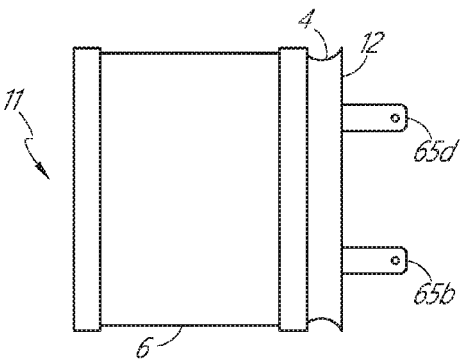
FIG. 9C illustrates a left side view of the meter extension of FIG. 9A.
Figure 9A:
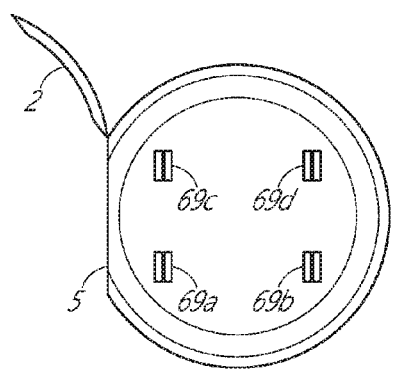
FIG. 9A illustrates a front view of a meter extension that utilizes at least one overcurrent protection device.

FIG. 9A illustrates a front view of a meter extension that utilizes at least one overcurrent protection device. FIG. 9B illustrates a left side view of the meter extension of FIG. 9A. FIG. 9C illustrates a left side view of the meter extension of FIG. 9A. FIG. 9D illustrates a top view of the meter extension of FIG. 9A. FIG. 9E illustrates a back view of the meter extension of FIG. 9A.

As illustrated, the meter extension 11 depicts a slightly recessed meter socket comprising line-side insertion jaws 69c and 69d, and load-side insertion jaws 69a and 69b, in a housing 6. An integral circumferential collar (not numbered) is provided at the outward end of the housing 6 of the meter extension 11, which will facilitate the secured connection of an electric meter (not shown) to the meter extension 11 via a retaining ring (not shown). The meter extension 11 may be circular in cross section, and is shown with an access door 2 open on the left side. A latch 5 is provided to hold down door 2 when it is closed. An aperture 7 or knockout or cutout is dimensioned to accommodate a threaded end of a rigid conduit member (not shown) for connecting an external device to at least one bypass breaker 3 (not shown). For example, an alternative energy source may be connected to the at least one bypass breaker 3 via electrical wires or leads (not shown), which may be guided through the threaded end of the conduit member for connection to bypass breaker 3 (not shown).

As can be seen in FIG. 9B, the meter extension 11 includes at least one bypass breaker 3 on the left side, disposed at least partially within housing 6 of meter extension 11. Also illustrated are load-side insertion prong 65a and line-side insertion prong 65c. (Neither line-side insertion prong 65d nor load-side insertion prong 65b is visible in this view.)

As can be seen in FIG. 9C (FIG. 64, top right figure) illustrates a right side view of the meter extension 11 shown and described above in FIGS. 9A and 9B. As illustrated, meter extension 11 further comprises a line-side insertion prong 65d and a load-side insertion prong 65b. An additional overcurrent protection device is not provided on the right side of the electrical meter 1, but at least one may be in other embodiments.

Figure 10:
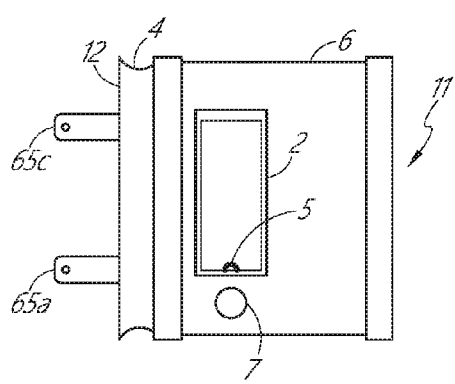
FIG. 10 illustrates a front view of a meter extension that utilizes at least one overcurrent protection device (OCPD).

FIG. 10 illustrates a front view of a meter extension that utilizes at least one overcurrent protection device (OCPD). The meter extension 11 depicts a slightly recessed meter socket comprising line-side insertion jaws 69c and 69d, and load-side insertion jaws 69a and 69b, in a housing 6. An integral circumferential collar (not numbered) is provided at the outward end of the housing 6 of the meter extension 11, and can facilitate the secured connection of an electric meter to the meter extension 11 via a retaining ring (not shown). The meter extension 11 may be circular in cross section, and is shown with an access door 2 closed on the left side. A latch 5 is provided to hold down door 2 when it is closed. An aperture 7 (not shown) is dimensioned to accommodate a threaded end of a rigid conduit member for connecting an external device to at least one bypass breaker covered by the access door 2. For example, an alternative energy source may be connected to the at least one bypass breaker via electrical wires or leads, which may be guided through a threaded end of the conduit member for connection to the bypass breaker.

Figure 11B:
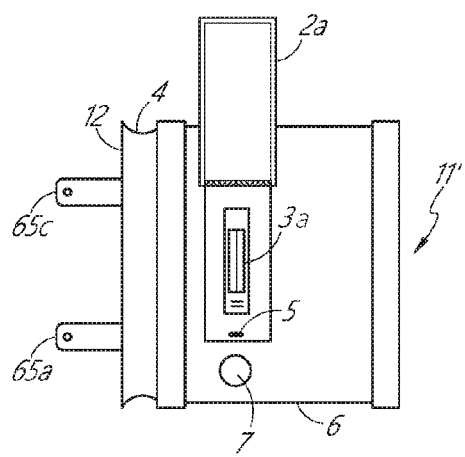
FIG. 11B illustrates a left side view of the meter extension of FIG. 11A.
Figure 11C:
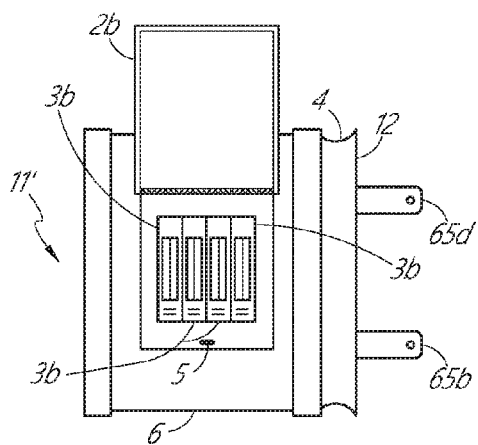
FIG. 11C illustrates a right side view of the meter extension of FIG. 11A.
Figure 11A:
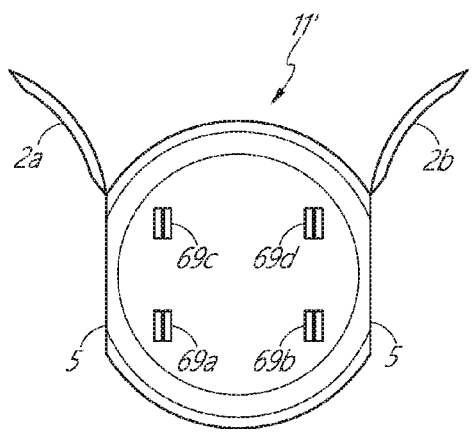
FIG. 11A is a front view of a meter extension that utilizes at least one overcurrent protection device.

FIG. 11A is a front view of a meter extension that utilizes at least one overcurrent protection device. FIG. 11B illustrates a left side view of the meter extension of FIG. 11A. FIG. 11C illustrates a right side view of the meter extension of FIG. 11A. As illustrated, the meter extension 11' depicts a slightly recessed meter socket comprising line-side insertion jaws 69c and 69d, and load-side insertion jaws 69a and 69b, in a housing 6. An integral circumferential collar (not numbered) can be provided at the outward end of the housing 6 of the meter extension 11', which can facilitate the secured connection of an electric meter to the meter extension 11' via a retaining ring (not shown). The meter extension 11' may be circular in cross section, and is shown with an access door 2a open on the left side, and an access door 2b open on the right side. On each side of meter extension 11, a latch 5 is provided to hold down doors 2a and 2b when they are closed. One or more apertures 7 are dimensioned to accommodate a threaded end of a rigid conduit member (not shown) for connecting an external device to at least one bypass breaker on each side of meter extension 11'. For example, an alternative energy source may be connected to the bypass breaker via electrical wires or leads, which may be guided through a threaded end of the conduit member for connection to one of the bypass breakers.

As can be seen in FIG. 11B, the meter extension 11' includes at least one bypass breaker 3a on the left side, disposed at least partially within housing 6 of meter extension 11'. Also illustrated are load-side insertion prong 65a and line-side insertion prong 65c. (Neither load-side insertion prong 65b nor line-side insertion prong 65d is visible in this view.)

As can be seen in FIG. 11C, meter extension 11' further comprises a line-side insertion prong 65d and a load-side insertion prong 65b. Also as illustrated, the right side of meter extension 11' includes multiple bypass breakers 3b disposed at least partially within housing 6 of meter extension 11'. Although a specific embodiment is depicted in FIGS. 11A through 11C, in other embodiments, a meter extension may include zero, one, two, three, four, or more bypass breakers on a given side. As discussed elsewhere, these bypass breakers may be any combination of main and sub breakers, and may include either or both of fixed breakers or interchangeable breakers.

Figure 12B:
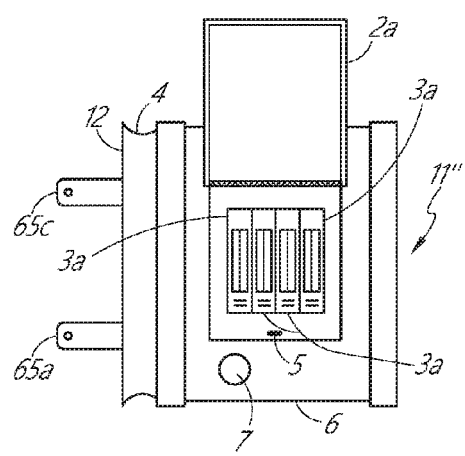
FIG. 12B illustrates a left side view of the meter extension of FIG. 12A.
Figure 12C:
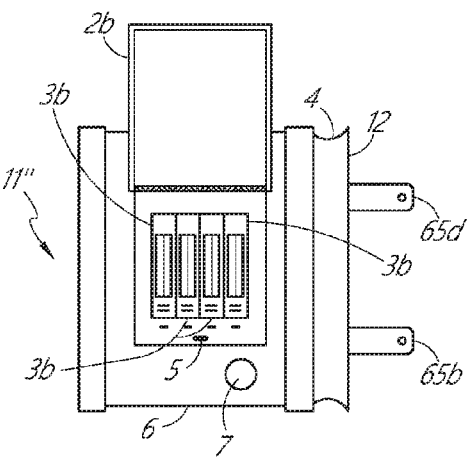
FIG. 12C illustrates a right side view of the meter extension of FIG. 12A.
Figure 12A:
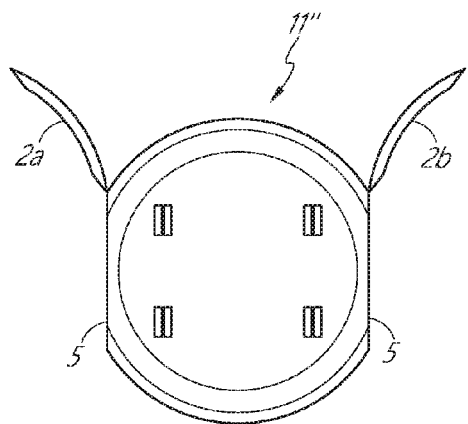
FIG. 12A illustrates a front view of a meter extension that utilizes at least one overcurrent protection device (OCPD).

FIG. 12A illustrates a front view of a meter extension that utilizes at least one overcurrent protection device (OCPD). As illustrated, the meter extension 11" depicts a slightly recessed meter socket comprising line-side insertion jaws 69c and 69d, and load-side insertion jaws 69a and 69b, in a housing 6. An integral circumferential collar (not numbered) is provided at the outward end of the housing 6 of the meter extension 11", which will facilitate the secured connection of an electric meter to the meter extension 11" via a retaining ring (not shown). The meter extension 11" may be circular in cross section, and is shown with an access door 2a open on the left side, and an access door 2b open on the right side. On each side of meter extension 11", latches 5 are provided to hold down door 2a and 2b when they are closed. One or more apertures are dimensioned to accommodate a threaded end of a rigid conduit member (not shown) for connecting an external device to at least one bypass breaker 3 (not shown) on each side of meter extension 11". For example, an alternative energy source may be connected to the at least one bypass breaker 3 via electrical wires or leads (not shown), which may be guided through the threaded end of the conduit member for connection to bypass breaker 3 (not shown).

FIG. 12B illustrates a left side view of the meter extension of FIG. 12A. In the illustrated embodiment, four bypass breakers 3a are disposed at least partially within housing 6 of meter extension 11", although in other embodiments any suitable number of breakers may be included. At least one of the illustrated bypass breakers 3a may be configured to function as a main bypass breaker, with the remaining bypass breakers 3a being configured to function as sub breakers, although other configurations may also be used in other embodiments. As described in greater detail elsewhere in the specification, a main bypass breaker, so disposed, can be used to cut off all power from subsidiary bypass breakers, and thus from any alternative energy sources connected to same in the meter extension 11. Also visible are load-side insertion prong 65a and line-side insertion prong 65c.

FIG. 12C illustrates a right side view of the meter extension of FIG. 12A. As illustrated, at least four bypass breakers 3b are disposed at least partially within housing 6 of meter extension 11". At least one of the bypass breakers 3b may be a main bypass breaker, the remaining bypass breakers 3b being sub breakers. Also visible are line-side insertion prong 65d and a load-side insertion prong 65b.

Figure 13C:
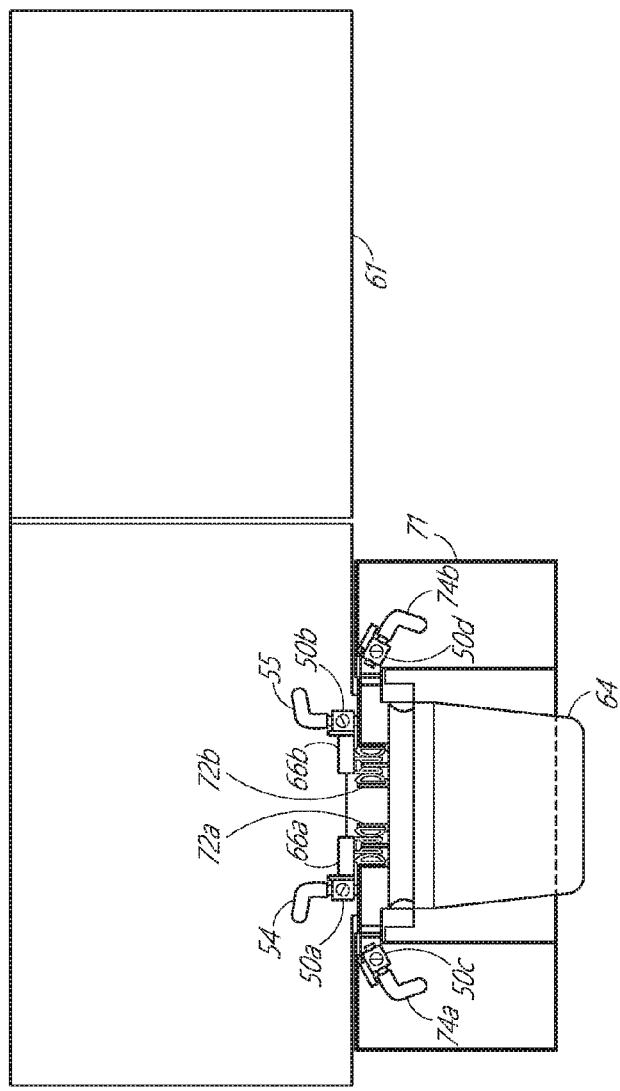

FIGS. 13A through 13C illustrate certain steps in the installation of an offset bypass breaker panel onto a main service panel. FIG. 13A illustrates an offset bypass breaker panel 71 and an electric meter 64 which will be installed onto a main service panel 61. Main service panel 61 comprises, inter alia, a meter socket (not shown in its entirety in this view) having an A-phase load-side insertion jaw 13a that is in electrical communication, via wire 54, with a main breaker (not shown) of main panel 61, and a B-phase load-side insertion jaw 13b that is in electrical communication, via wire 55, with a main breaker (not shown) of main panel 61.

Installation of offset panel 71 onto the main panel 61 is accomplished by first bringing offset bypass breaker panel 71 into approximate vertical and horizontal alignment with the meter socket of main panel 61. Such alignment ensures that two pairs 72a and 72b of electrically conductive gripping elements, respectively, of offset bypass breaker panel 71 are in register with load-side insertion jaws 13a and 13b of the meter socket. As illustrated, power transfer bars 73a and 73b of offset bypass breaker panel 71 respectively connect with the outermost electrically conductive gripping elements of A-phase gripping element pair 72a and B-phase gripping element pair 72b. Power transfer bars 73a and 73b are connected to electrical lugs 50a and 50b, respectively, in which wires 74a and 74b are respectively secured. Wire 74a in electrical communication with an A-phase bus bar (not shown) of offset bypass breaker panel 71, and wire 74b is in electrical communication with a B-phase bus bar (not shown) of offset bypass breaker panel 71. Electrical lugs 50a and 50b, and wires 74a and 74b represent one means of routing A-phase and B-phase 120 VAC, respectively, to the A-phase busbar and B-phase busbar of offset bypass breaker panel 71, although other means may be used in other embodiments. As also described elsewhere in the specification (see, for example, the discussion of FIG. 14A below), power transfer bars in electrical communication with the load-side insertion jaws of main panel 61 may also be configured to be in electrical communication with the A- and B-phase busbars disposed in offset bypass breaker panel 71.

In FIG. 13B, the back surface of offset bypass breaker panel 71 has been pressed in abutting arrangement against the front surface of main panel 61 surrounding (i.e., above, below, and to the sides) the meter socket (not shown) of main panel 61, ensuring that the two pairs of electrically conductive gripping elements 72a and 72b of offset bypass breaker panel 71 are in contact with the outermost lateral surfaces of load-side insertion jaws 13a and 13b. In some embodiments, the gripping elements 72a and 72b may be configured to securely grip the load-side insertion jaws 13a and 13b, but in other embodiments, supplemental securement of the offset breaker panel 71 in place may be provided by appropriate structures, such as adhesives, fasteners, or other securement means.

In FIG. 13C, meter 64 has been reinserted into the load-side insertion jaws 13a & 13b and line-side insertion jaws (not shown) from which it was pulled prior to the installation of offset bypass breaker panel 71. Once so reinstalled, electric meter 64 maintaining substantially the same outward extension beyond the face of main panel 61, in contrast to the additional distance that the meter 64 would extend if a meter extension was used instead of the offset bypass breaker panel 71, was used to bypass the busbars of the main panel 61. This arrangement can provide an advantage over meter extensions with regard to maintaining the original profile of an electric meter while still bypassing the busbars of a main panel. The geometry of this particular arrangement is due to the offset bypass breaker panel 71 described herein establishing electrical communication with the main panel 61 by gripping the outermost lateral surfaces of the load-side insertion jaws 13a and 13b of the meter socket with electrically conductive gripping elements. By making this connection on the outside of the load-side insertion jaws 13a and 13b, this leaves the original slots in the load-side insertion jaws unoccupied, thereby allowing electric meter 64 to be reinserted into the same load-side insertion jaws 13a and 13b from which it was pulled. Attachment screws (not shown) may be used along the periphery of offset bypass breaker panel 71 to provide additional or supplemental securement of offset breaker panel 71 to main panel 61.

The reinsertion of electric meter 64 into the meter socket of main panel 61 reestablishes electrical connection between line-side insertion jaws (not shown) and load-side insertion jaws 13a and 13b of the meter socket of main panel 61. A- and B-phase 120 VAC is provided to the busbars of offset bypass breaker panel 71, from power bars or wires in electrical communication with the two pairs of electrically conductive gripping elements, 72a and 72b, of offset bypass breaker panel 71, which are in electrical communication with the load-side insertion jaws 13a and 13b of the meter socket of main panel 61. A retaining ring (not shown) can be secured about the base of electric meter 64, further securing offset bypass breaker panel 71 to main panel 61.

FIG. 14A illustrates a front view of an integral electric meter-alternative energy breaker panel system. FIG. 14B illustrates a left side view of the integral bypass system of FIG. 14A. As illustrated, integral bypass system 140 comprises an electric meter 141 which can be similar to the electric meter 1 illustrated and described above regarding, among others, FIGS. 1A-1F. In the illustrated implementation the electric meter 141 includes, among other elements, at least one display 10, which may be an LCD or other suitable display device. The bypassing of the busbars of a main service panel (not shown) occurs by tapping, whether inside or outside the meter, the A- and B-phase load-side insertion prongs of the meter socket of a main service panel and connecting these taps, which may in some embodiments be wires or power transfer bars, to A- and B-phase busbars used to power at least one circuit breaker. In some embodiments, the circuit breaker may be a double-pole 120/240 VAC circuit breaker in electrical communication with an alternative energy source.

The integral bypass system 140 depicted in FIGS. 14A and 14B includes a bypass breaker panelboard, which in the illustrated embodiment is incorporated as an integral part of a laterally extending portion on the left side of housing 6 of the integral bypass system 140. This bypass breaker panelboard portion of the housing 6 of integral bypass system 140 is dimensioned to accommodate at least one overcurrent protection device, and is configured with a door or cover 2, which can be held down, when closed, by a latch 5, that provides access to at least one bypass breaker 76 (see FIG. 14B) that may be inserted at least partially within the breaker panel portion of housing 6.

An A-phase busbar and a B-phase busbar (such as the busbars shown in FIGS. 15A and 15B) can be disposed toward the back or rear of the bypass breaker panelboard portion of the housing 6 of integral bypass system 140 The A-phase 120 VAC busbar can be in electrical communication, via a tap, with an A-phase load-side insertion prong of integral bypass system 140, and the B-phase 120 VAC busbar can be in electrical communication, via a tap with the B-phase load-side insertion prong of integral bypass system 140. As described in greater detail elsewhere in the specification, these busbars may be either fixed or interchangeable, and the at least one bypass breaker 76 connected to these busbars may be either fixed or interchangeable.

Also depicted in FIG. 14B (although not specifically illustrated in FIG. 14A) is a flexible or rigid conduit 75, through which A- and B-phase wires can be routed from at least one alternative energy source to be placed in electrical communication with at least one bypass breaker 76 inserted onto the A-phase and B-phase busbars in integral bypass system 140.

As can be seen in FIG. 14B, a breaker cover 79 is disposed within the bypass breaker panelboard portion of housing 6, and a circuit breaker 76, which can serve as an alternative energy bypass breaker and can in some embodiments be a common double-pole 120/240 VAC breaker, is installed. The ability to utilize busbars and breakers 76 in integral bypass system 140 that have been manufactured by the same company that manufactured a main service panel into which integral bypass system 140 is inserted (most notably, the main A- and B-phase 120 VAC busbars and circuit breakers (main and subsidiary or branch) of the main service panel), can enable connection of higher power-output alternative energy systems to integral bypass system 140 than those allowed in systems not having such interchangeability options regarding their busbars and the alternative energy bypass breaker. This benefit is not unique to the particular embodiment of FIGS. 14A and 14B, but can also be applicable to other embodiments discussed herein which utilize interchangeable busbars and breakers.

For example, in the absence of interchangeable breakers, codes, regulations or warranties may limit the rating of generic breakers which can be installed in a bypass breaker device. When the bypass busbars and breakers are manufactured by the same entity or otherwise compatible with the main panel components, a user may be permitted to exceed these generic limits. For example, the use of interchangeable busbars and breakers which have the same manufacturer as the main panel components may allow breakers with ratings higher than 60 amps or any other threshold value, or multiple breakers with a combined rating higher than 60 amps or any other threshold value. This may be of particular use in three-phase installations or commercial installations, in which it may be desirable to utilize breakers with very high ratings. It can also facilitate the simultaneous use of multiple alternative energy devices, which may together exceed a baseline generic rating, especially when peak generation periods of the alternative energy devices occur simultaneously, such as a sunny and windy afternoon when solar and wind power systems will both be very productive.

Like the electric bypass meters described herein, devices such as the embodiment of FIGS. 14A and 14B, in which the breakers are at least partially laterally or otherwise offset from a meter, may cause the electrical meter and associated components to extend a shorter distance outward from a wall or panel than devices which use a meter extension aligned with the meter. By reducing this distance, the electric meter and associated components can be more readily incorporated into spaces with less clearance between a wall or panel and another object. In addition, by reducing the distance that the meter extends outward, the meter may be made more mechanically stable, and impacts or other forces exerted on the end of the meter will be less likely to damage or break the meter due to the shorter effective lever arm. For example, children may be less likely to hurt themselves or damage a meter when climbing or hanging on a meter with an offset breaker device, or integrated breakers.

FIG. 15A illustrates the integral bypass system of FIGS. 14A and 14B with the breaker cover removed. As illustrated, wires 151a and 151b, which may be connect to an alternative energy source, have been routed via conduit 75 into the bypass breaker panelboard portion of housing 6 of integral bypass system 140 and placed in electrical communication with bypass breaker 76 installed in same.

The at least one bypass breaker 76 can be a common double-pole 120/240 VAC circuit breaker that is dedicated to the alternative energy source with which wires 151a and 151b are in electrical communication. Busbars 77 and 78 can be connected to A- and B-phase 120 VAC power via taps from load-side insertion prongs to electrical lugs in respective electrical communication with busbars 77 and 78, in a similar fashion to other embodiments discussed herein. In such an embodiment, busbars 77 and 78 are directly powered, and can alternately be referred to as live busbars or live bussing. In the illustrated embodiment and other embodiments disclosed herein in which live bussing is utilized, main circuit breakers in connection with the live bussing are not used. As a result, each individual circuit breaker used in live-bussed bypass systems only controls the particular alternative energy system (or other system component) with which it is in electrical communication.

As described in greater detail elsewhere in the specification, each of the embodiments of bypass systems disclosed herein may be configured to have either live bussing, in which (at least for residential service applications) tapped A- and B-phase 120 VAC can be in direct electrical communication with the A- and B-phase bussing via soldering or securement in electrical lugs connected to the busbars, or bussing in which A- and B-phase 120 VAC is provided to the busbars through a main circuit breaker. In bypass systems in which either single- or three-phase power to the busbars is provided to the busbars via main circuit breakers, all subsidiary (or branch) alternative energy breakers connected to the busbars below the main circuit breaker could be shut off simultaneously simply by toggling off the main circuit breaker.

Figure 15B:
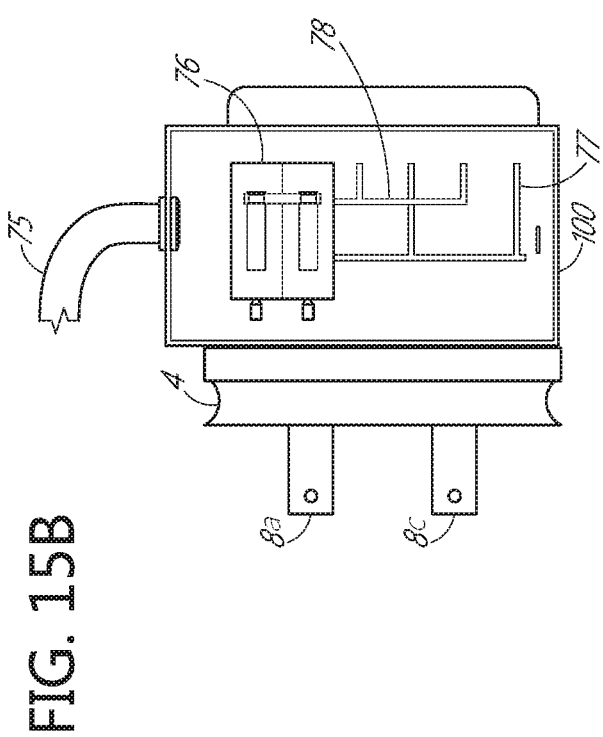
FIG. 15B illustrates an alternative embodiment of an integral bypass system that differs from the integral bypass system of FIG. 15A in that its busbars are not live, but are instead powered through the use of a main circuit breaker.

FIG. 15B illustrates an alternative embodiment of an integral bypass system that differs from the integral bypass system of FIG. 15A in that its busbars are not live, but are instead powered through the use of a main circuit breaker. This means that wires that respectively tap A- and B-phase 120 VAC from load-side insertion prongs of the integral bypass system 140' are inserted into main circuit breaker 76, and as long as main circuit breaker 76 is toggled on, busbars 77 and 78 are powered by A- and B-phase 120 VAC, respectively.

Figure 16:
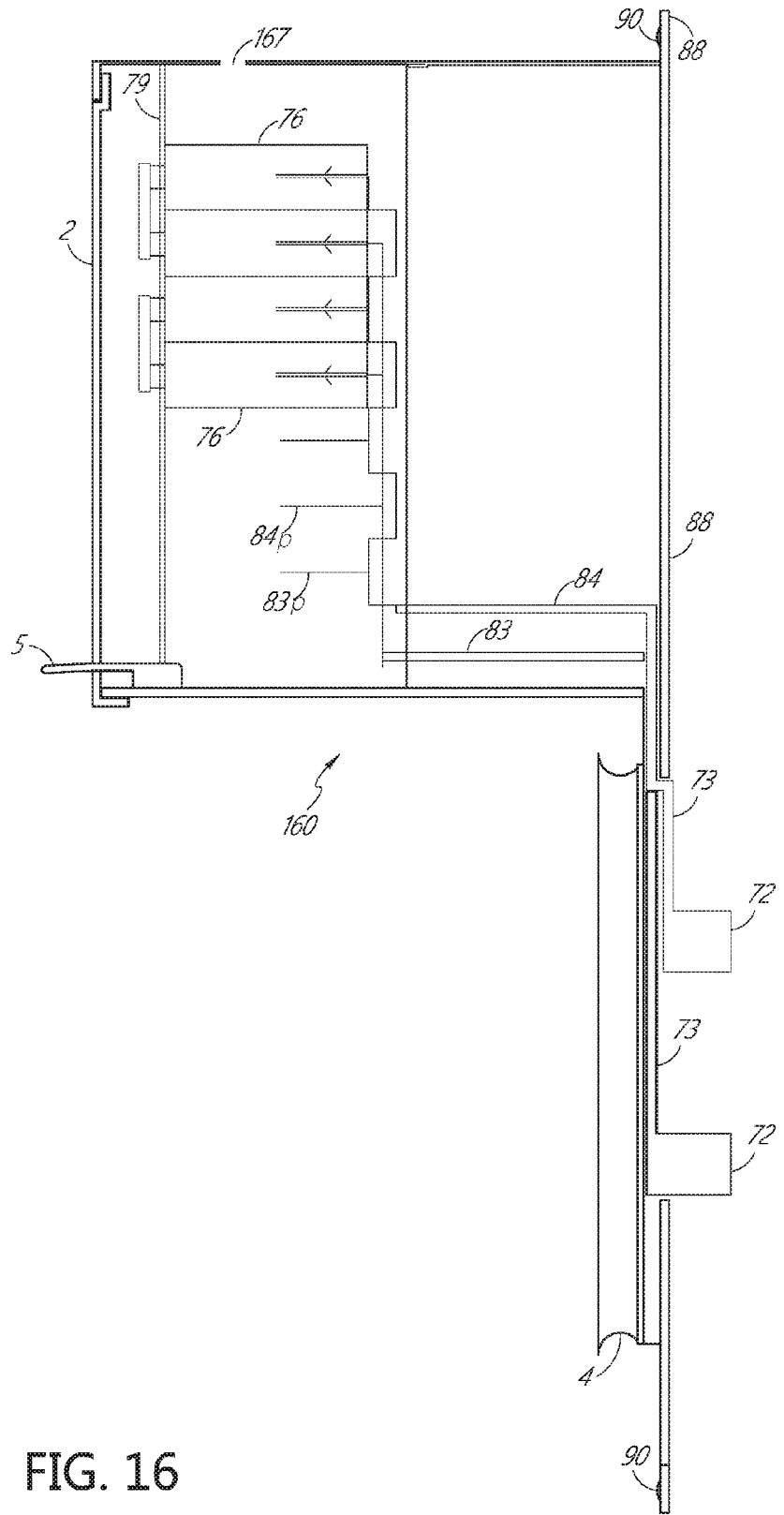
FIG. 16 illustrates a cross-sectional side view of an offset bypass breaker panel.

FIG. 16 illustrates a cross-sectional side view of an offset bypass breaker panel. The offset bypass breaker panel 160 can be used to bypass the busbars of a main surface panel, which can in some embodiments be a surface-mounted main service panel or a flush-mounted main service panel. After removing an existing electric meter of the main service panel, electrically conductive gripping elements 72 of offset bypass breaker panel 160 can grip outermost lateral surfaces of the A- and B-phase load-side insertion jaws of the meter socket of the main service panel, as described elsewhere herein. Power transfer bars 73 (only one of which is visible in profile) transfer A- and B-phase 120 VAC power to A-phase bussing 84 and B-phase bussing 83. Breakers 76, such as common double-pole 120/240 VAC breakers, are shown installed on prongs (84p, 83p) of A- and B-phase bussing 84 and 83. Breaker cover 79, which can has knock-outs (not shown) for accommodating additional alternative energy breakers beneath breakers 76 in the panelboard portion of the offset bypass breaker panel 160, is provided behind a door 2, which may a waterproof door held down by latch 5. Although illustrated as coming in from the top of the panel 160, the conduit may enter the panel 160 from any suitable side, and multiple cutouts may be provided in an offset bypass breaker panel to allow a variety of installation options.

As illustrated, a cutout 167 is provided at the top surface of panelboard housing, into which the threaded end of a rigid conduit (not shown) may be secured. A-phase and B-phase wires from at least one alternative energy source can be routed through a rigid conduit to be placed, pairwise, with individual alternative energy breakers 76. Waterproofing gasket 88, made of any suitable waterproofing material, can be disposed on the rearmost surface of offset bypass breaker panel 160 and four attachment screws 90 can be provided to redundantly secure offset bypass breaker panel 160 to a main service panel to which it has been inserted, or to any other suitable structure.

The installation of offset bypass breaker panel 160 can include the reinsertion of the original electric meter into the meter socket of the main service panel, and can also include the placement and tightening of a retaining ring around the base of the electric meter.

Figure 17A:
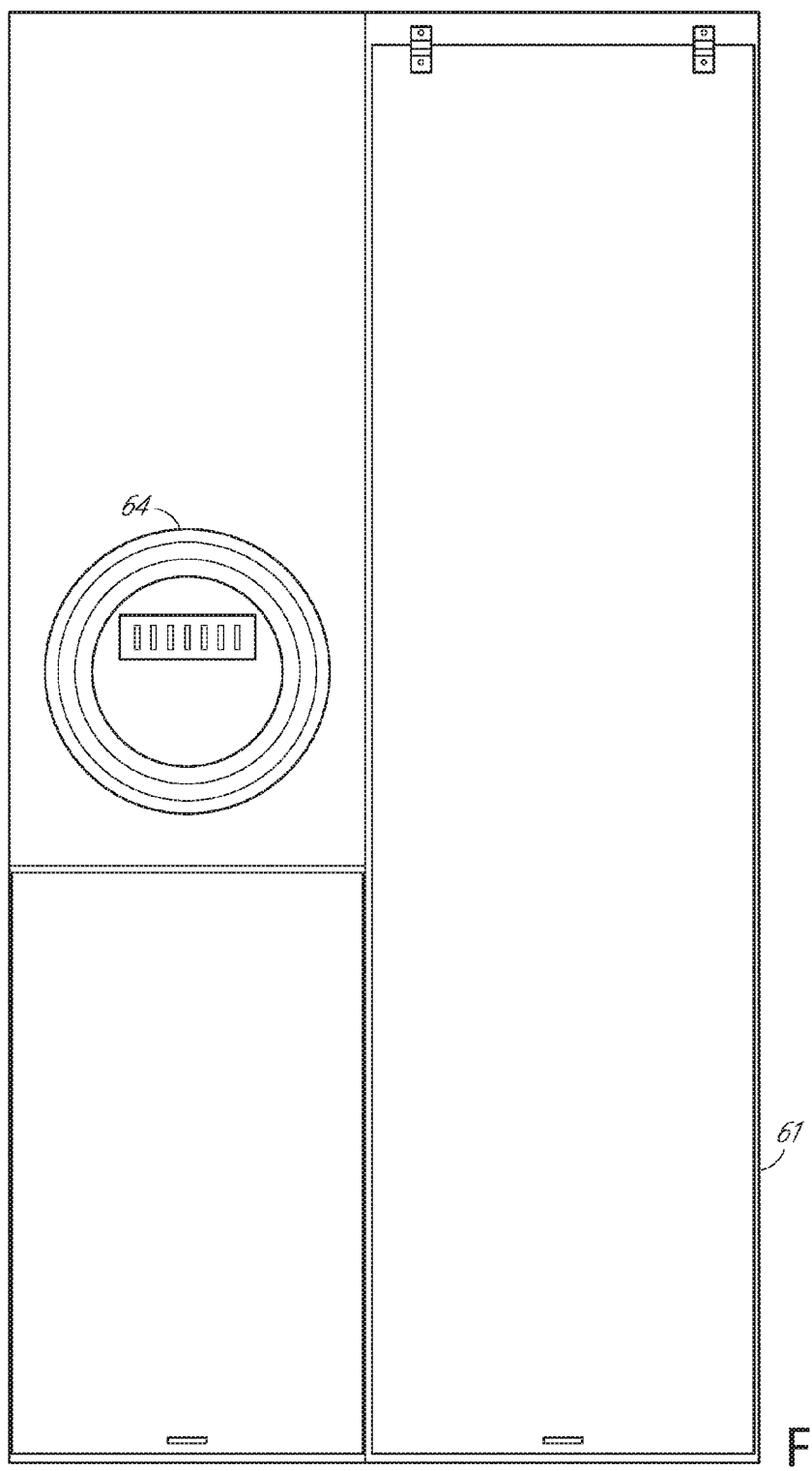
FIG. 17A illustrates a front view of a surface-mounted or flush-mounted main service pane.
Figures 17B, 17C:
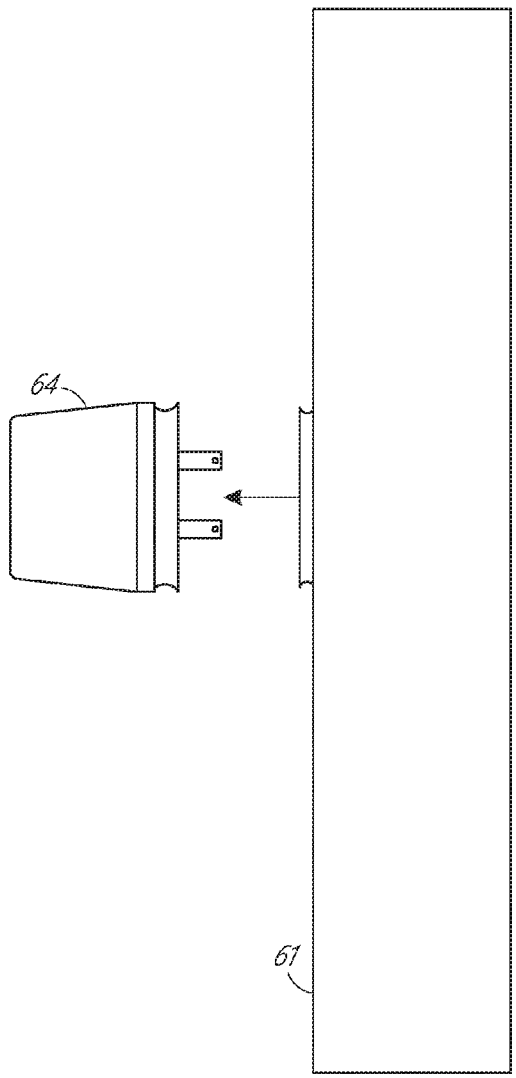
FIG. 17B illustrates a right side view of the main panel of FIG. 17A.
FIG. 17C illustrates the removal of the electric meter from the main service panel of FIG. 17A.

FIG. 17A illustrates a front view of a surface-mounted or flush-mounted main service pane. FIG. 17B illustrates a right side view of the main panel of FIG. 17A. For single-phase residential service, a conventional electric meter 64 has four insertion prongs: A- and B-phase line-side insertion prongs, and A- and B-phase load-side insertion prongs. As described elsewhere herein, these insertion prongs are can be respectively seated in four meter socket insertion jaws.

The A- and B-phase line-side insertion jaws of the meter socket of main service panel 61 are in respective electrical communication with A- and B-phase 120 VAC wires from the utility, whereas the A- and B-phase 120 VAC load-side insertion jaws of the meter socket of main service panel 61 are in electrical communication with a main breaker in the circuit breaker panelboard of main service panel 61.

Because the A- and B-phase line-side insertion prongs of electric meter 64 are in electrical communication inside the electric meter 64 with the A- and B-phase load-side insertion prongs of the electric meter 64, A- and B-phase 120 VAC is respectively electrically communicated, via A- and B-phase tapping wires to the main breaker in the circuit breaker panelboard of main service panel 61. It is in this manner that the main circuit breaker of main service panel 61, is provided with A- and B-phase 120 VAC, thereby energizing the A- and B-phase main busbars of main service panel 61.

FIG. 17C illustrates the removal of the electric meter from the main service panel of FIG. 17A. Prior to the removal of electric meter 64 from the meter socket of main panel 61, a main circuit breaker in the circuit breaker panelboard of main panel 61 should be toggled off, thereby turning off electrical power to all circuits connected to the circuit breaker panel board of main panel 61. If no main circuit breaker is disposed in the circuit breaker panelboard of main panel 61, each circuit breaker disposed therein should be toggled off.

Although the removal of electric meter 64 from the meter socket of main panel 61 cuts off all electrical power to the circuit breaker panelboard, A- and B-phase insertion jaws of the meter socket of main panel 61 can remain energized by virtue of their being in electrical communication with the A- and B-phase 120 VAC from utility service wires, from utility service which can in some embodiments be either overhead or underground utility service.

Figure 17D:
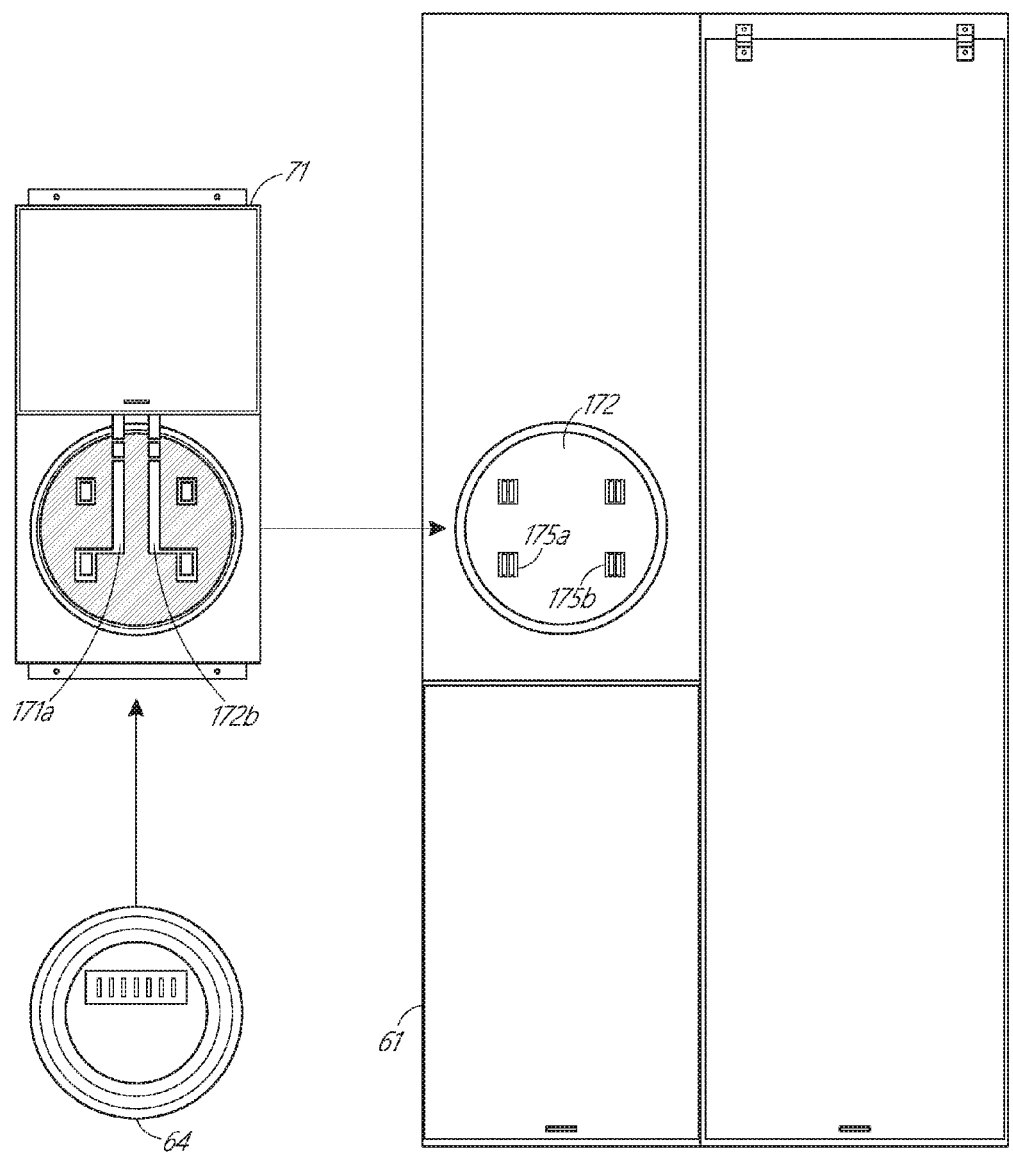
FIG. 17D illustrates a front view of components used in the installation of an offset bypass breaker panel in the main service panel of FIG. 17A.
Figure 17E:
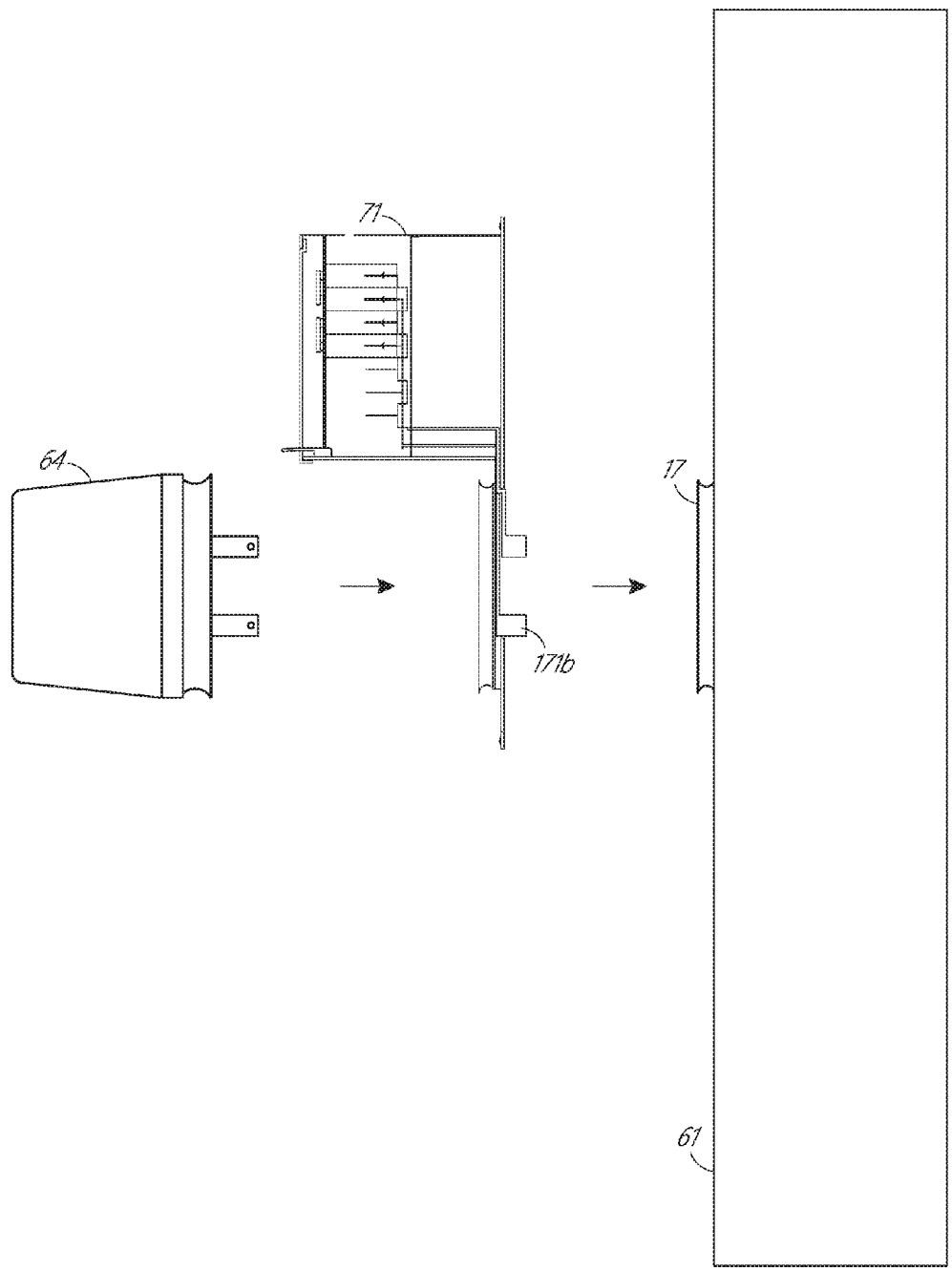
FIG. 17E illustrates a right side view of the components of FIG. 17D, depicted aligned with one another.

FIG. 17D illustrates a front view of components used in the installation of an offset bypass breaker panel in the main service panel of FIG. 17A. FIG. 17E illustrates a right side view of the components of FIG. 17D, depicted aligned with one another. The installation process may be similar in some respects to the process described with respect to FIGS. 13A-13C. As illustrated, offset bypass breaker panel 71 comprises, inter alia, A- and B-phase power transfer bars 171a and 171b. After offset bypass breaker panel 71 has been installed onto meter socket 172 of main panel 61, and electric meter 64 has been reinserted into meter socket 172, the power transfer bars 171a and 171b will be in respective electrical communication with A- and B-phase 120 VAC power. This connection will be made by the lower extremities of power transfer bars 171a and 171b being in mechanical and electrical communication with the outermost lateral surfaces of A- and B-phase load-side insertion jaws 175a and 175b of meter socket 172 of main panel 61. Because the upper extremities of power transfer bars 171a and 171b are respectively secured in electrical lugs or other conductive structures in respective mechanical communication with the A- and B-phase busbars of offset bypass breaker panel 71, A- and B-phase 120 VAC power is provided to the A- and B-phase busbars of offset bypass breaker panel 71 after both the offset bypass breaker panel 71 has been installed in meter socket 172 of main panel 61 and electric meter 64 has been reinserted and secured to main panel 61. The A- and B-phase busbars of this embodiment of offset bypass breaker panel 71 will thus be live, so long as the utility lines are powered and a main circuit breaker is not disposed in panel 71.

However, at least one alternative energy bypass breaker may be disposed in the panelboard area of offset bypass breaker panel 71, and electrical communication between at least one alternative energy source and the at least one alternative energy bypass breaker can established via the routing of A- and B-phase wires from the at least one alternative energy source. As discussed above, this wiring can be routed through a rigid conduit, the threaded end of which is inserted in a cutout in the housing of panelboard of offset bypass breaker panel, and the stripped ends of the alternative energy breaker can be secured in the at least one alternative energy bypass breaker.

Figure 17F:
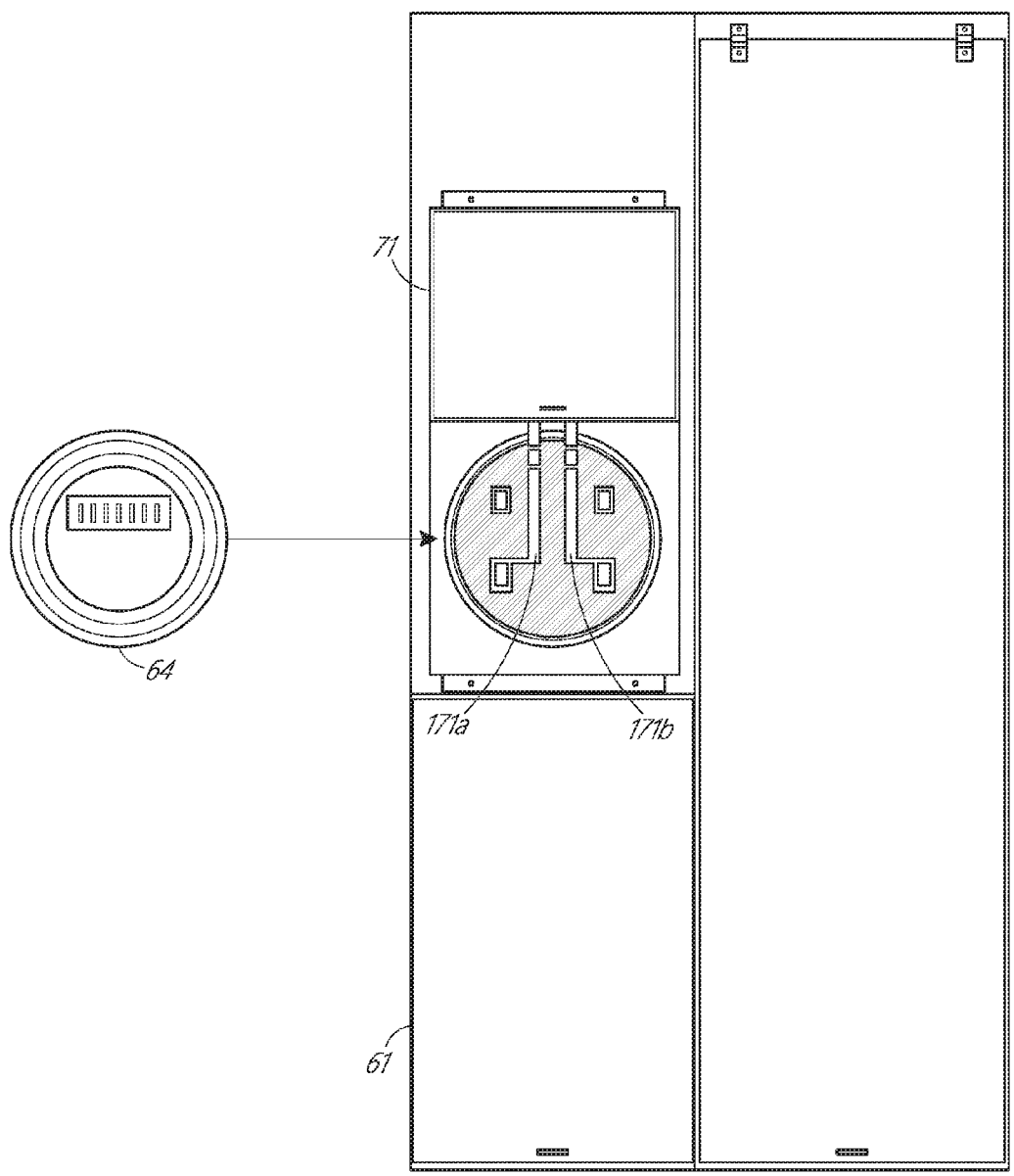
FIG. 17F illustrates a front view of a subsequent step in the installation of the components of FIG. 17D.
Figure 17G:
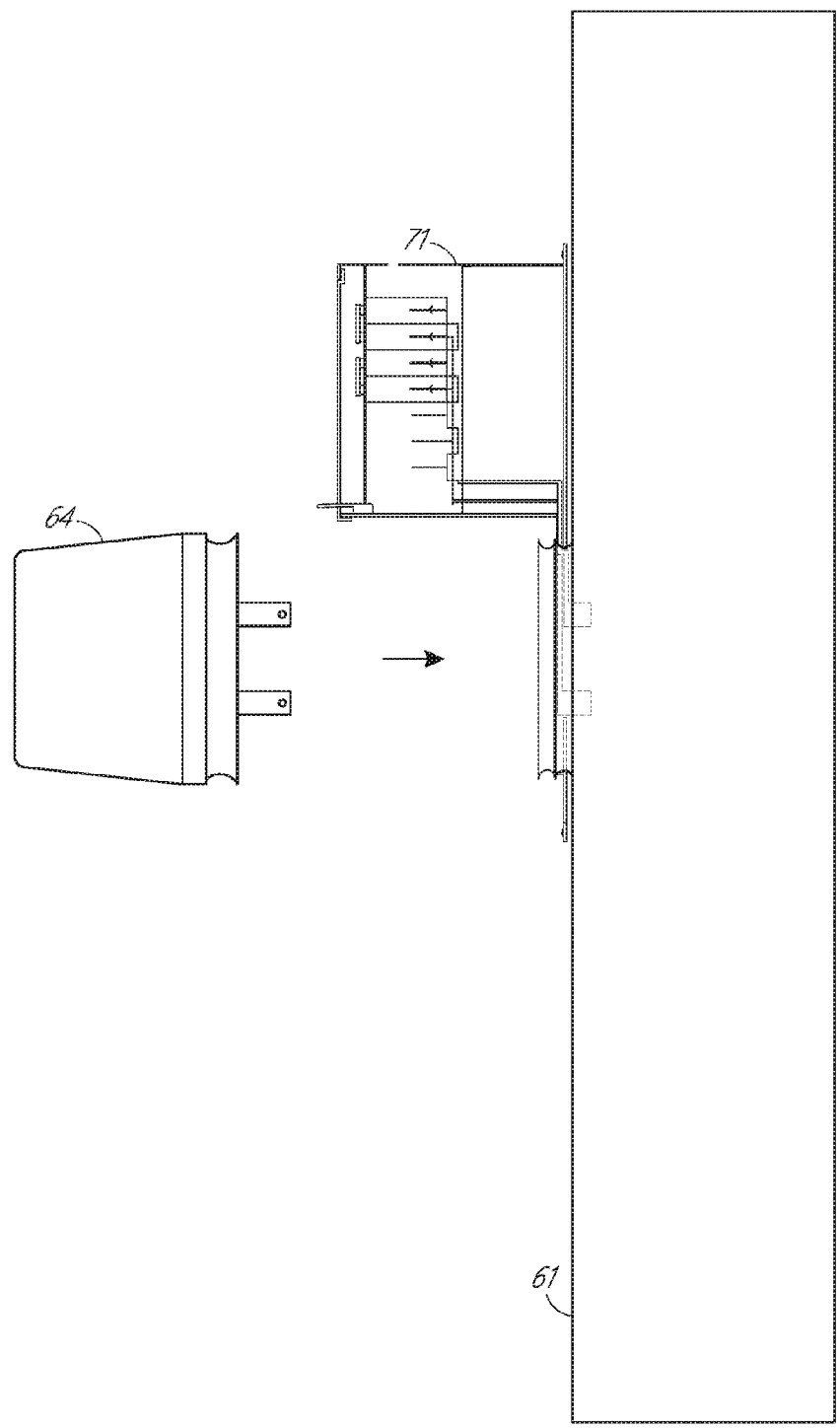
FIG. 17G illustrates a right side view of this subsequent step.

FIG. 17F illustrates a front view of a subsequent step in the installation of the components of FIG. 17D. FIG. 17G illustrates a right side view of this subsequent step. In FIG. 17G, it can be seen that the offset bypass breaker panel 171 has been installed into the meter socket 172.

Figure 17H:
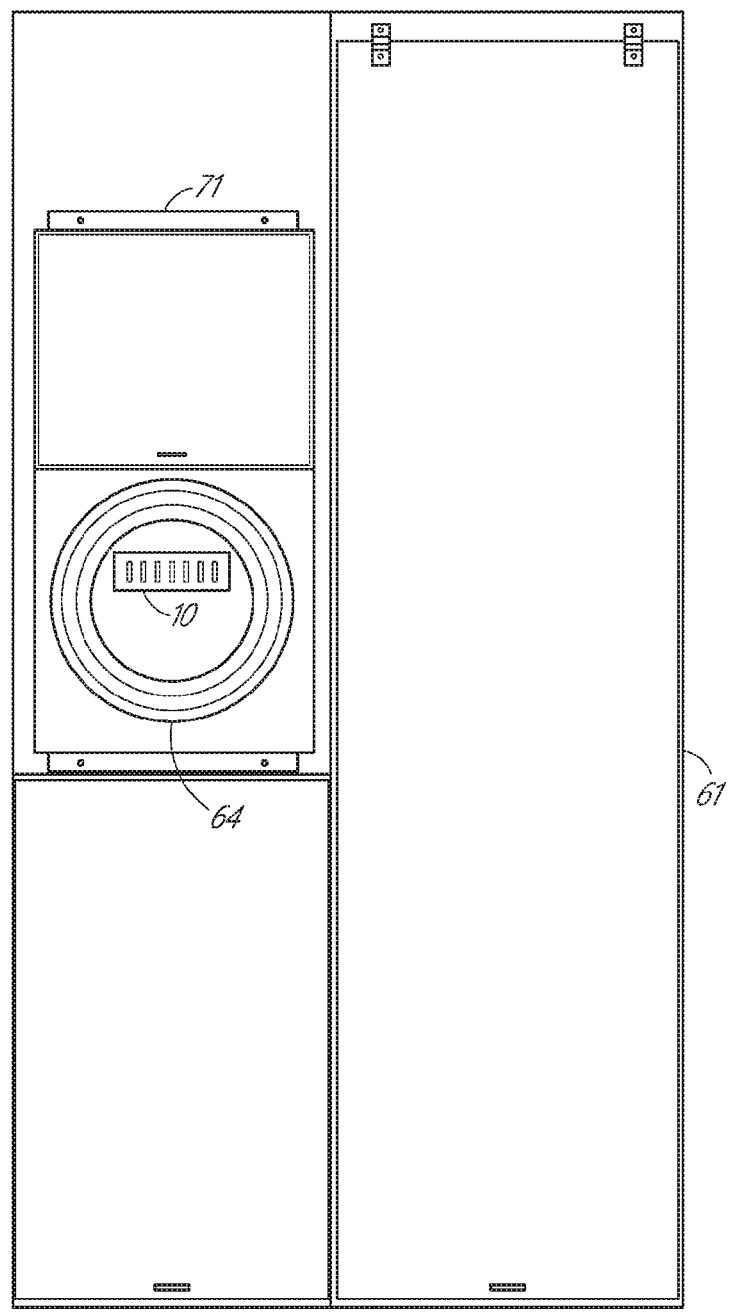
FIG. 17H illustrates a front view of the installed components of FIG. 17D.
Figure 17I:
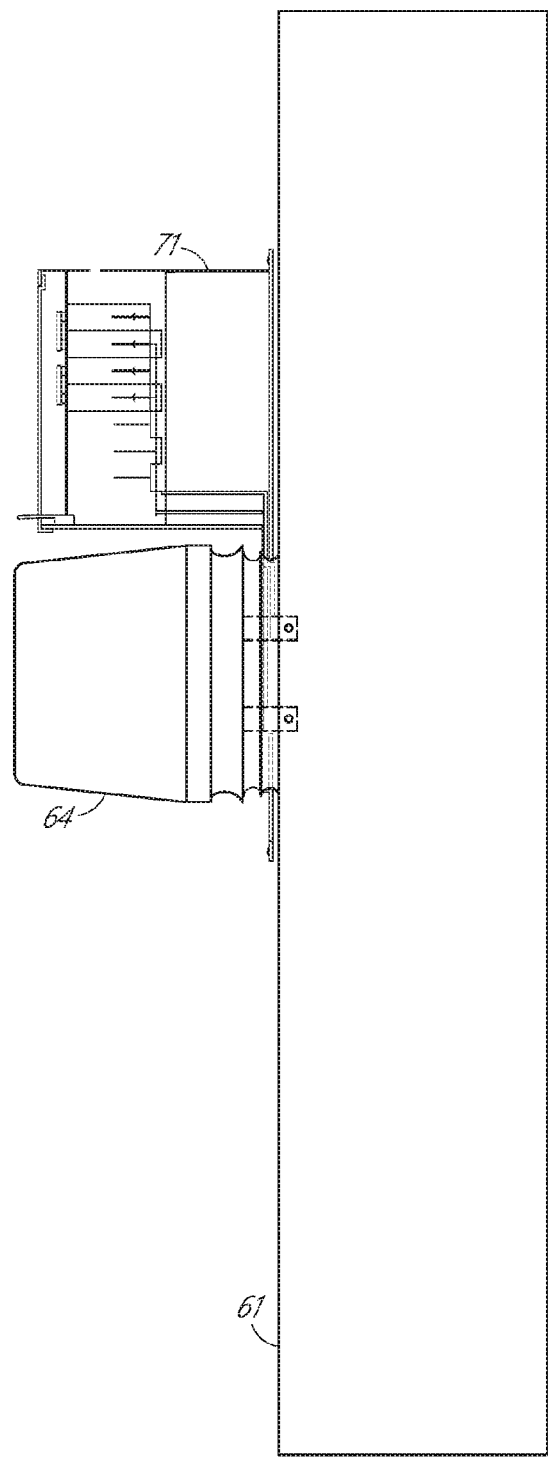
FIG. 17I illustrates a right side view of the installed components of FIG. 17H.

FIG. 17H illustrates a front view of the installed components of FIG. 17D. FIG. 17I illustrates a right side view of the installed components of FIG. 17H. In these figures, the offset bypass breaker panel 71 and an electric meter 64 are fully installed in a main service panel 61.

In certain embodiments of the various bypass devices described herein, one or both of the bypass busbars and the bypass breakers may be interchangeable. In such embodiments, one or both of the busbars or the breakers can be installed within the bypass device prior to installation of the bypass device. As discussed above, such embodiments can allow the use of busbars and breakers in a bypass device which are from the same manufacturer as the breakers and busbars in a main panel, potentially allowing the use of higher-rated breakers in bypass devices than would otherwise be permissible.

FIGS. 18A-18C illustrate front cutaway views of various steps in the installation of both interchangeable bussing and interchangeable breakers in a bypass electric meter. As illustrated, bypass electric meter 1 includes a housing 6 having access doors 2a and 2b on the left and right sides of the bypass electric meter 1. The electric meter 1 also includes A- and B-phase 120 VAC line-side insertion prongs 8a and 8b, and A- and B-phase 120 VAC load-side insertion prongs 8c and 8d. In the illustrated embodiment, A- and B-phase bussing power transfer bars 84 and 83 of bypass electric meter 1 respectively tap the load-side insertion prongs 8c and 8d in bypass electric meter 1. After bypass electric meter 1 is inserted into a meter socket of a main service panel, the power transfer bars 84 and 83 will provide A- and B-phase 120 VAC power to installed interchangeable bussing assemblies and the interchangeable breakers attached to the same in bypass electric meter 1.

In FIG. 18A at least one interchangeable busbar 85b has been installed via the opening adjacent cover 2b. At least one interchangeable busbar 85a is being inserted via the opening adjacent cover 2a. These two busbars 85a and 85b may be of any suitable rating or amperage level, and may in some embodiments be manufactured by the same company that manufactured the main service panel into which the bypass electric meter 1 will be installed. In the illustrated embodiment, the busbars 85a and 85b are oriented vertically along their longest dimension, end to end, and can be installed by inserting a first end of the busbar into a retaining structure 181 and then bringing the second end of the busbar against a supporting surface and securing the opposite end in place using a hold-down screw or other appropriate securement method. The busbars 85a and 85b include one or more cleats 182 at one end of the busbars 85a and 85b, which can be used to support a portion of a breaker, as described in greater detail in the following figures.

In FIG. 18B, one interchangeable breaker 76b has been installed via the opening adjacent door 2B and another interchangeable breaker 76a is being installed via the opposite opening adjacent door 2a. As can best be seen with respect to the partially installed interchangeable breaker 76a, a notched lower corner of the breaker 76a is seated on the cleat 182 of the interchangeable busbar 85a. Subsequently, the breaker 76a can be rotated toward the busbar 85a while the notched lower corner is seated on the cleat 182, so that the breaker 85a will begin to engage the outwardly extending portions of the bussing prongs, also referred to as "stabs." In FIG. 18B, these bussing prongs are depicted in profile as a rectangular projection, but other sizes and shapes of prongs may be used in other embodiments. The number of bussing prongs which will be engaged by a breaker will depend on the particular power configuration. In the illustrated single-phase embodiment, each breaker will engage an A-phase bussing prong and a B-phase bussing prong.

In the illustrated implementation, the busbars 85a and 85b are oriented in a substantially vertical arrangement, with the cleats located at the base of the busbars 85a and 85b. While such an arrangement may facilitate the installation of breakers 76a and 76B, any other arrangement of the busbars 85a and 85b may also be provided.

In FIG. 18C, the interchangeable breaker 76a has also been installed and each of the circuit breakers 76a and 76B are fully seated on the A-phase and B-phase busbars. In addition, a cover 79 has been installed over or around the installed interchangeable breaker 76b. The cover 79 can in some embodiments cover substantially the entire breaker 76b, allowing the reset button to extend therethrough, or can in other embodiments cover exposed space within the opening surrounding the breaker 76b.

FIGS. 19A-19C illustrate front cutaway views of various steps in the installation of interchangeable breakers in a bypass electric meter having fixed bussing. In FIG. 19A, in contrast to the embodiment of the bypass electric meter illustrated in FIG. 18A, it can be seen that fixed busbars 82a and 82b have been previously installed. The A- and B-phase bussing power transfer bars 84 and 83 of the bypass electric meter 1' illustrated in this embodiment operate as described above with regard to the A- and B-phase bussing power transfer bars 84 and 83 of the bypass electric meter illustrated in FIG. 18A, except that in the embodiment of bypass electric meter 1' illustrated in FIG. 19A, the A- and B-phase bussing power transfer bars 84 and 83 are in electrical communication with fixed busbars 82a and 82b, not with, as illustrated in FIGS. 18A-18C, interchangeable busbars 85a and 85b.

In FIG. 19B, two interchangeable breakers 76a and 76b, respectively, have been installed in bypass electric meter 1'. Other than the use of fixed busbars 82a and 82b on each side of the bypass electric meter 1' shown in FIGS. 19A-19C, as opposed to the utilization of interchangeable busbars 85a and 85b on each side of the bypass electric meter 1 shown in FIGS. 18A-18C, the installation of interchangeable breakers 76a and 76b in FIG. 19B can be performed in substantially the same fashion as the description of the installation of interchangeable breakers 76a set out above with respect to of FIG. 18B.

FIG. 20 illustrates a cutaway view of another embodiment of a bypass electric meter which utilizes fixed bussing. Fixed busbars 82a' and 82b' differ slightly in structure from the fixed busbars of FIG. 19A, and represent one of many alternative structures that can be used to provide interchangeable components within a bypass device. The particular shape, size, and arrangement of busbars and bussing power transfer bars 84 and 83 can vary significantly in different embodiments, and the illustrated embodiments are not intended to be the only manner in which such components can be arranged within a bypass device.

FIGS. 21A-21C illustrate front cutaway views of the installation of interchangeable bussing and breakers in a meter bypass extension. In the illustrated embodiment, the interchangeable bussing 85a and 85b and interchangeable breakers 76a and 76b are installed in a similar manner to that set out above in the description of the installation of same in the bypass electric meter illustrated in FIGS. 18A-18C, differing in that the installation is performed in a meter bypass extension 11, not a bypass electric meter 1. However, in other embodiments, the size, shape, and arrangements of the components may differ, due for example to the different components (or lack thereof) within a meter bypass extension when compared to a bypass electric meter.

FIG. 21D illustrates a left side view of the meter extension bypass of FIGS. 21A-21C. It can be seen that both access covers 2a and 2b are closed against their respective latches 5.

FIGS. 22A and 22B illustrate front cutaway views of the installation of interchangeable breakers in a meter extension having fixed bussing. In the illustrated embodiment, the interchangeable breakers 76a and 76b are installed in a similar manner to that set out above in the description of the installation of same in the bypass electric, differing in that the installation is performed in a meter bypass extension 11', not a bypass electric meter 1'. As noted above, however, in other embodiments, the size, shape, and arrangements of the components may differ.

FIG. 22C illustrates a left side view of the meter extension bypass 11' described above with regard to FIGS. 22A and 22B, but with both access covers 2a and 2b closed against their respective latches 5.

Figure 23B:
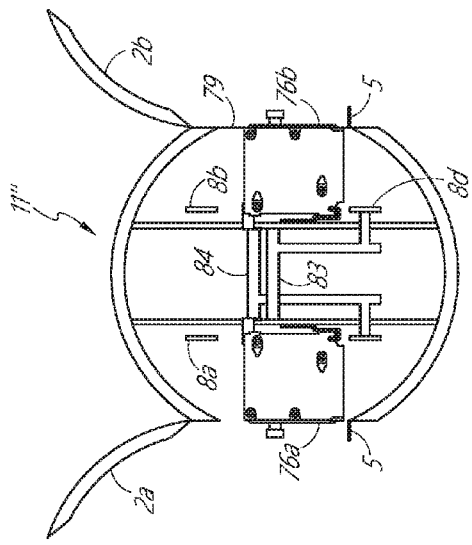
FIG. 23B illustrates a front cutaway view of a meter extension bypass with fixed bussing and factory-fixed breakers.
Figure 23C:
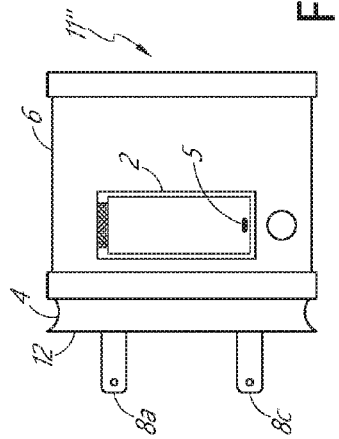
FIG. 23C illustrates a left side view of the meter extension bypass of FIG. 23A but with both access covers closed against their respective latches.
Figure 23A:
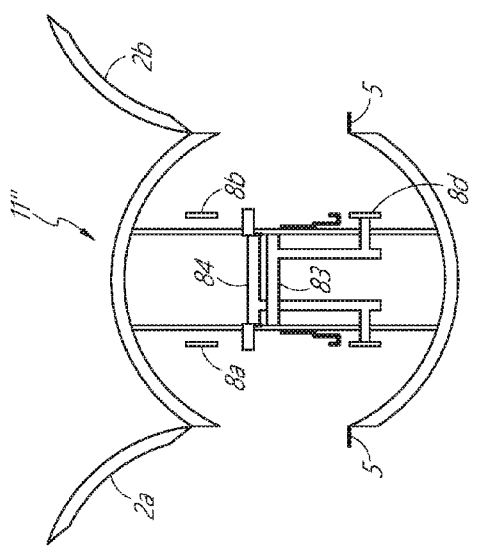
FIG. 23A illustrates a front cutaway view of a meter extension bypass that has fixed busing.

FIG. 23A illustrates a front cutaway view of a meter extension bypass that has fixed busing. The internal structures are, in the illustrated embodiment, substantially the same as those described with respect to FIG. 20, differing in that the fixed bussing is disposed within the meter extension bypass 11" and not in a bypass electric meter 1". FIG. 23B illustrates a front cutaway view of a meter extension bypass with fixed bussing and factory-fixed breakers. The internal structures are, in the illustrated embodiment, substantially the same as those of FIG. 23A, except that factory fixed breakers 76a and 76b have been installed. FIG. 23C illustrates a left side view of the meter extension bypass of FIG. 23A but with both access covers closed against their respective latches.

Figure 24:
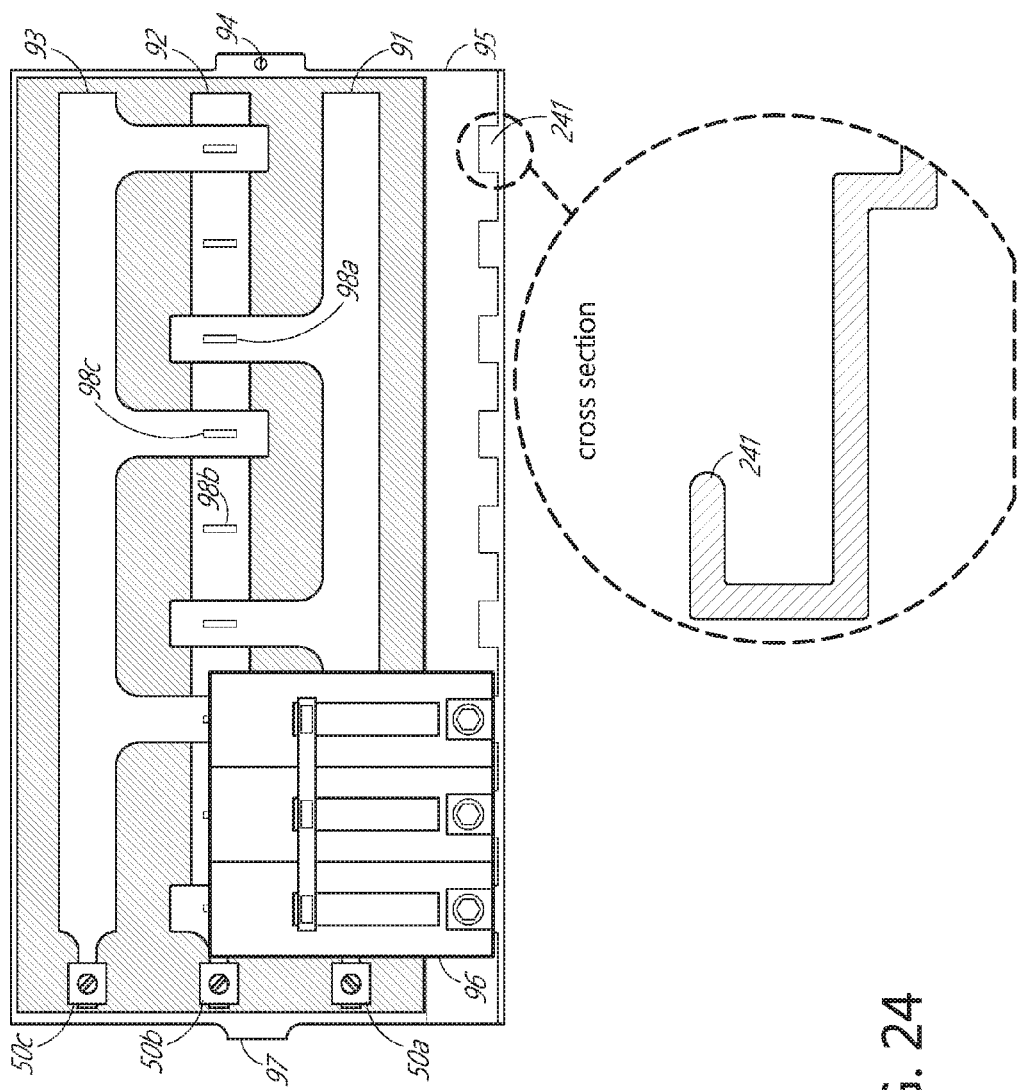
FIG. 24 illustrates a three-phase, lug-type bussing assembly.

FIG. 24 illustrates a three-phase, lug-type bussing assembly. The lug-type bussing assembly 95, alternately referred to as a live bussing assembly, can be used in any of the bypass embodiments disclosed herein, including bypass electric meters, meter extension bypasses, or offset bypass breaker panels. The bussing assembly includes an A-phase busbar 91, also referred to as an L1 busbar, a B-phase busbar 92, also referred to as an L2 busbar, and a C-phase busbar 93, also referred to as an L3 busbar. Each of busbars 91, 92, and 93 have bussing prongs 98a, 98b, and 98c, respectively, which can be used to stab into and transfer three-phase power to at least one three-phase alternative energy breaker 96 installed onto three-phase bussing assembly 95. The three-phase power is provided to bussing assembly 95 via three wires WL1, WL2, and WL3 (not shown) that are in respective electrical communication with three-phase utility mains (via overhead or underground service). These wires WL1, WL2, and WL3 can be respectively secured in electrical lugs 50a, 50b, and 50c that are in respective electrical communication with busbars 91, 92, and 93 of assembly 95. Hold down prong 97 can be used for securing one end of bussing assembly 95 in a bypass system, and the other end of assembly 95 can be secured with screw 94, although other securement methods and structures can alternatively be used. Cleats 241, disposed on one side of three-phase bussing assembly 95 (and depicted in profile in the enlarged cross section detail in FIG. 24) can be utilized when installing the at least one three-phase alternative energy breaker 96 on the bussing assembly 95.

Figure 25:
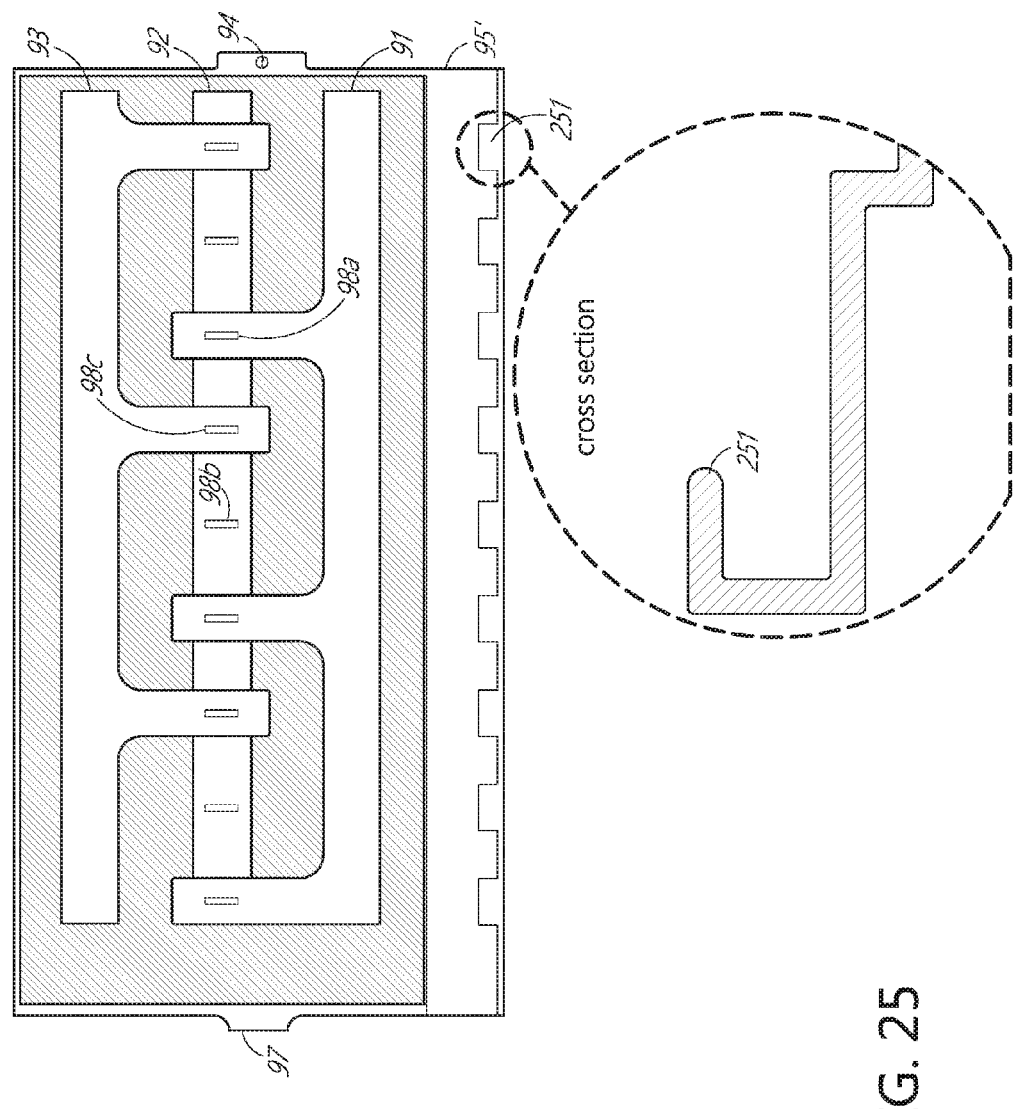
FIG. 25 illustrates another embodiment of a three-phase bussing assembly.

FIG. 25 illustrates another embodiment of a three-phase bussing assembly. The three-phase bussing assembly 95' utilizes a three-phase main circuit breaker (not shown) in respective electrical communication with three-phase utility power wires to provide three-phase power to its busbars 91, 92, and 93—and thus to at least one three-phase alternative energy breaker (not shown) via busbar prongs 98a, 98b, and 98c. Bussing assembly 95' also comprises breaker-mounting cleats 251.

Figure 26:
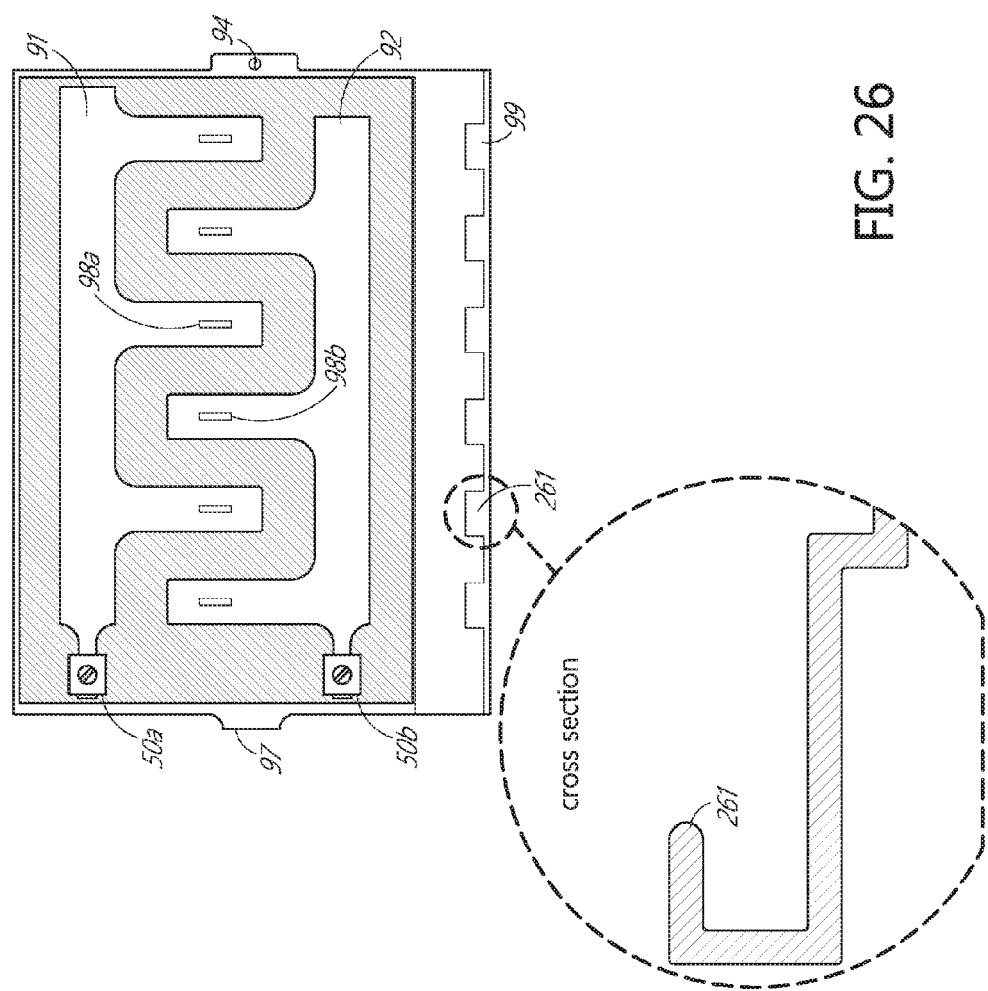
FIG. 26 illustrates a single-phase, lug-type bussing assembly.

FIG. 26 illustrates a single-phase, lug-type bussing assembly. The lug-type or live bussing assembly 99 can be used in any of the bypass embodiments disclosed herein, including bypass electric meters, meter extension bypasses, or offset bypass breaker panels. The bussing assembly 99 comprises an A-phase busbar 91 and a B-phase busbar 92. Busbars 91 and 92 are in respective electrical communication with electrical lugs 50a and 50b, which in turn are in electrical communication with utility A- and B-phase 120 VAC power. Busbars 91 and 92 also have bussing prongs 98a and 98b, respectively that transfer both A- and B-phase 120 VAC to at least one double-pole 240 VAC alternative energy breaker (not shown). The bussing assembly also comprises breaker-mounting cleats 261.

Figure 27:
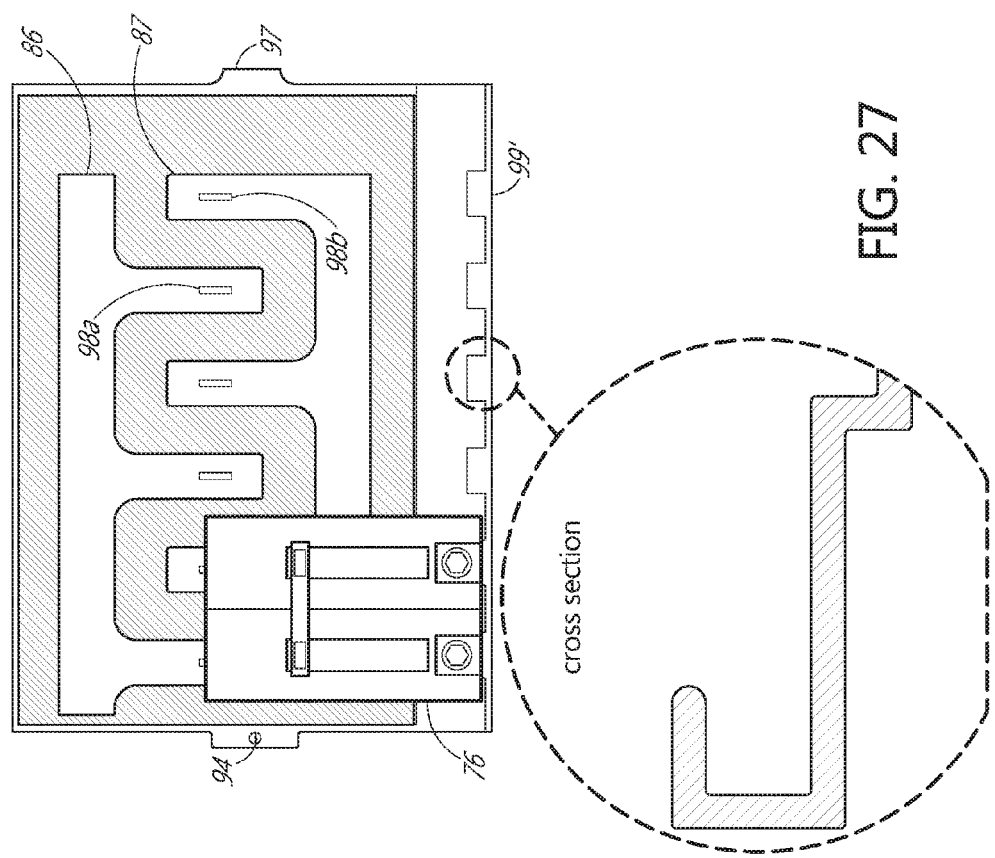
FIG. 27 illustrates another embodiment of a single phase bussing assembly.

FIG. 27 illustrates another embodiment of a single phase bussing assembly. The bussing assembly 99' is similar to bussing assembly 99 described above with regard to FIG. 26. Unlike the bussing assembly of FIG. 26, in which the busbars 91 and 92 are powered via respective electrical connection to wires in electrical communication with utility A- and B-phase 120 VAC power, the busbars 86 and 87 of bussing assembly 270 are powered via a main circuit breaker in electrical communication with both A- and B-phase 120 VAC utility power and prongs 98A and 98B, respectively of busbars 86 and 87.

Figure 28B:
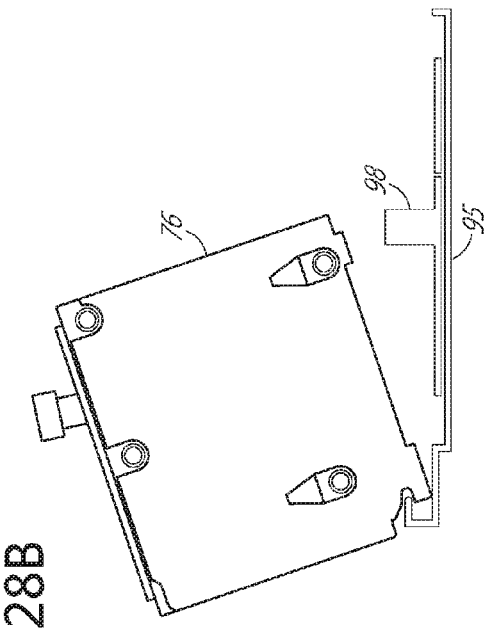
FIGS. 28A through 28C illustrate a side view of steps in the installation of a three-phase interchangeable breaker onto a three-phase bussing assembly.
Figure 28A:
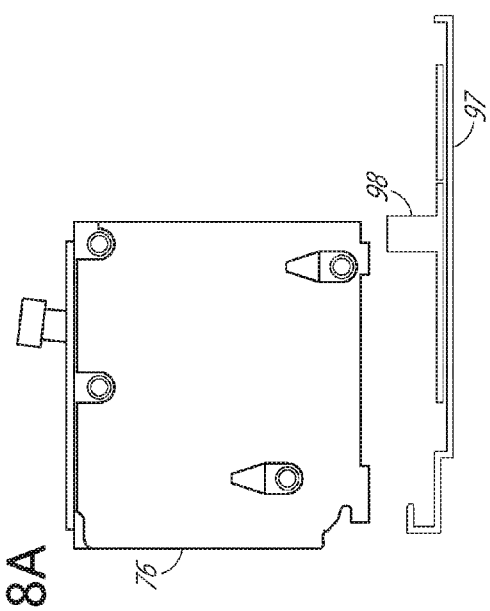
Figure 28C:
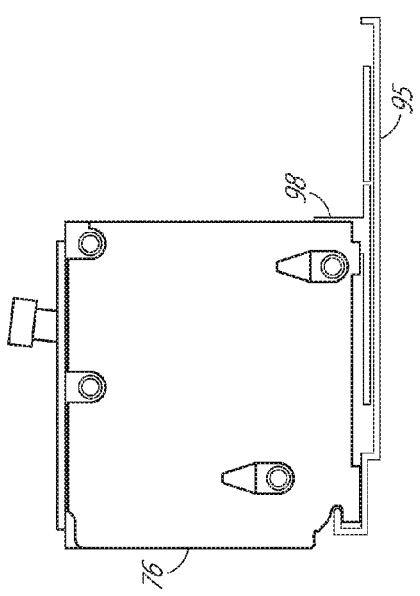

FIGS. 28A through 28C illustrate a side view of steps in the installation of a three-phase interchangeable breaker onto a three-phase bussing assembly. In a similar fashion to the installations described elsewhere in the application, the notched corner of the interchangeable breaker is hooked into the cleats 281, and the interchangeable breaker 76 is then pushed onto the bussing prongs 98 of bussing assembly 99, securing it in place.

FIGS. 29A and 29B illustrate a side view of the installation and securement of an interchangeable, single-phase, lug-type bussing assembly. FIG. 29C illustrates a top view of the bussing assembly with an installed breaker. In FIG. 29A, a prong 97 at the end of a bussing assembly 99 is inserted into a retaining structure 292 of a bypass device. In FIG. 29B, the opposite end of the bussing assembly 99 is then secured in place via a screw 94.

FIGS. 30A and 30B illustrate a side view of the installation and securement of an interchangeable, single-phase, bussing assembly connected to a main breaker. FIG. 30C illustrates a top view of the bussing assembly with an installed breaker. The installation proceeds in a similar fashion to that illustrated in FIGS. 29A and 29B. Once installed, the bussing assembly 99 can be connected to a main breaker (not shown), in electrical communication with utility A- and B-phase power, as opposed to the lug-based powering of the busbars of the bussing assembly of FIG. 29A.

Figure 31:
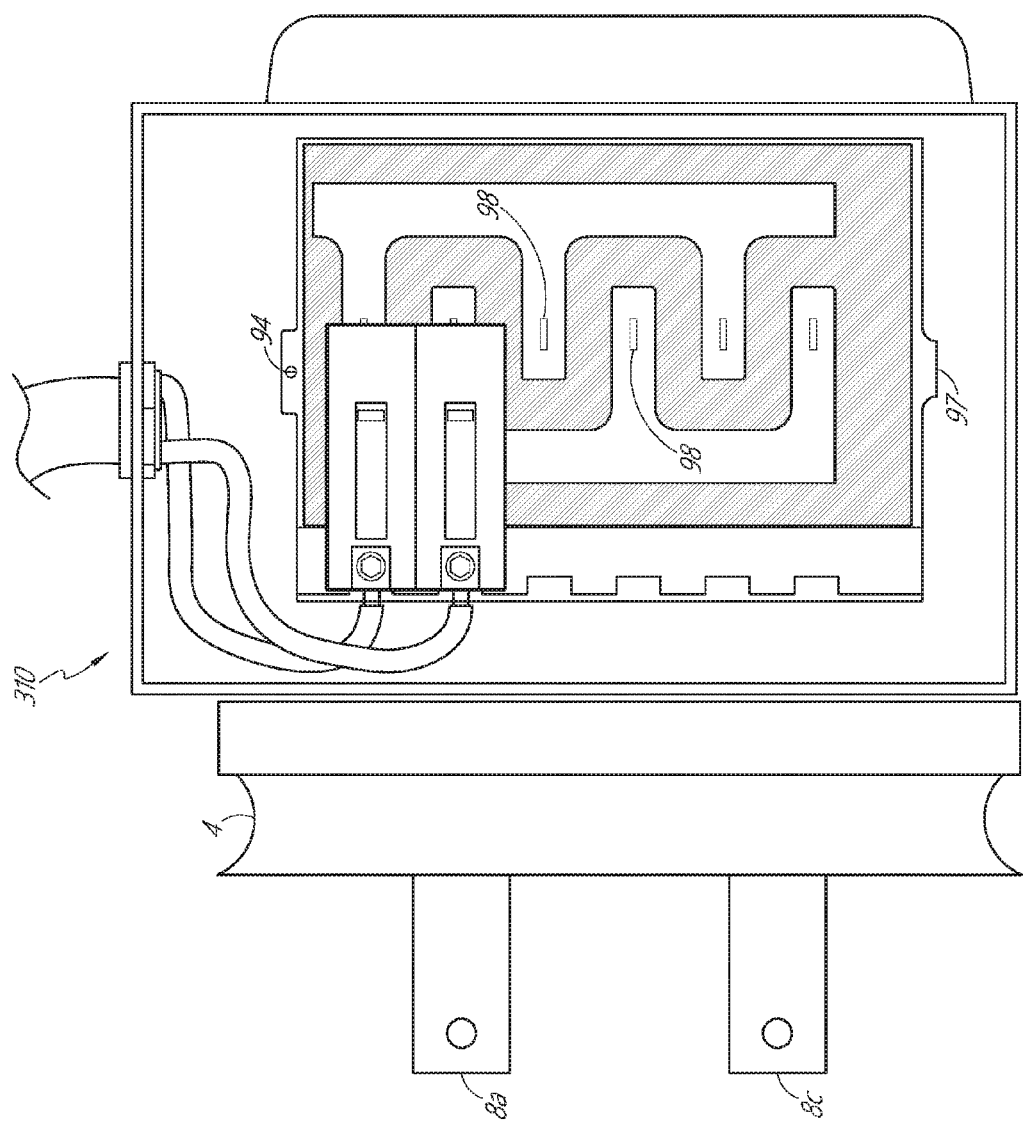
FIG. 31 illustrates a cutaway left side view of an integral bypass device having an installed bussing assembly.

FIG. 31 illustrates a cutaway left side view of an integral bypass device having an installed bussing assembly. The integral bypass system 310 is similar to the bypass system 140 of FIGS. 14A and 14B. The bussing assembly 99 of the bypass system 310 is an interchangeable, no-lug, single-phase bussing assembly.

Figure 32:
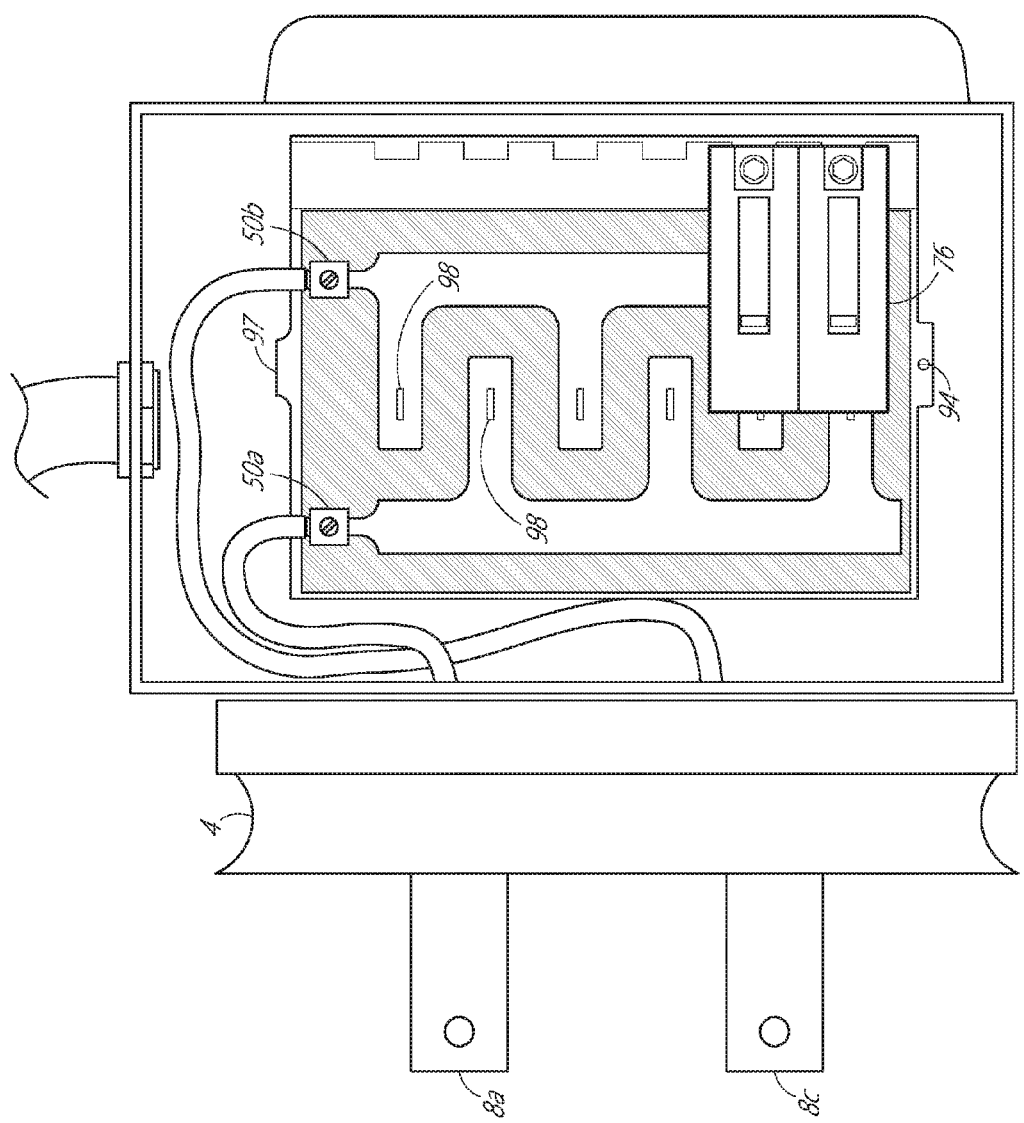
FIG. 32 illustrates a cutaway left side view of an integral bypass device having an installed bussing assembly.

FIG. 32 illustrates a cutaway left side view of an integral bypass device having an installed bussing assembly. Like the bypass device of FIG. 31, the bypass device of FIG. 32 is similar to the bypass system 140 of FIGS. 14A and 14B. However, in contrast to the bypass device of FIG. 31, the bypass device of FIG. 32 is a lug-based or live bussing assembly 99, which includes lugs 50A and 50B connected to the bussing assembly 99.

Figure 33:
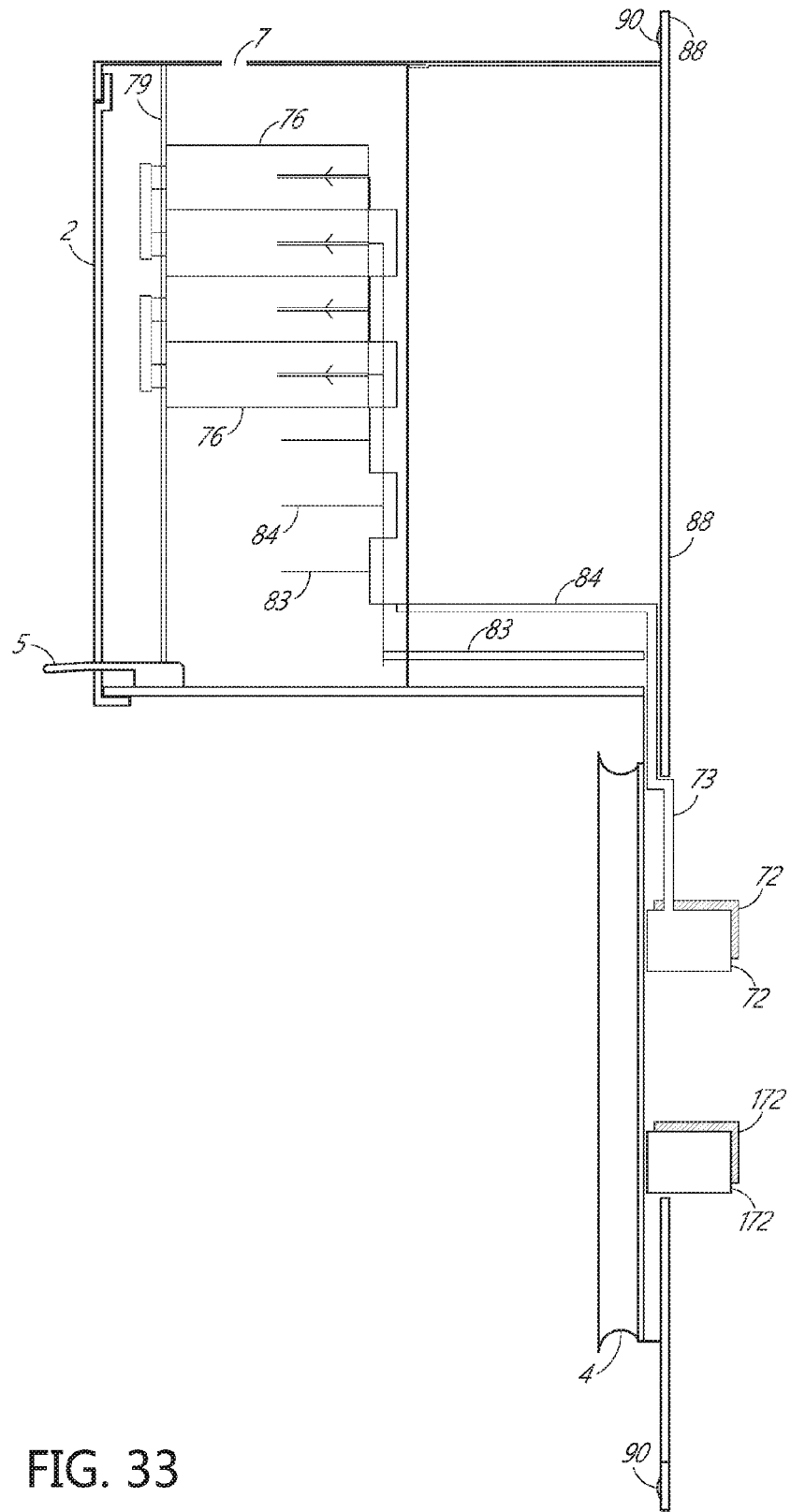
FIG. 33 illustrates a cutaway right side view of an embodiment of an offset bypass breaker panel.

FIG. 33 illustrates a cutaway right side view of an embodiment of an offset bypass breaker panel. The offset breaker bypass panel of FIG. 33 is similar to the offset bypass breaker panel described in detail above with regard to FIG. 16. However, the offset bypass breaker panel also includes non-conductive rectangular securement elements 72 that, upon the installation of the offset panel grip the outermost elements of the line-side insertion jaws of the meter socket of a main service panel 61, thereby contributing to a more secure attachment of offset bypass breaker panel to a main panel than would be provided without these non-conductive securement elements 72.

Although various embodiments discussed herein relate primarily to load-side tapping, which among other benefits can enable a property owner to receive credit for alternative energy power backfed to a utility, the bypass devices described herein can alternatively be configured for line-side tapping rather than load-side tapping. Although certain benefits of load-side tapping may not be realized when utilizing line-side tapping, many other benefits can still be retained, such as the ability to incorporate alternative power sources without upgrading or replacing a main electrical panel.

Figure 34:
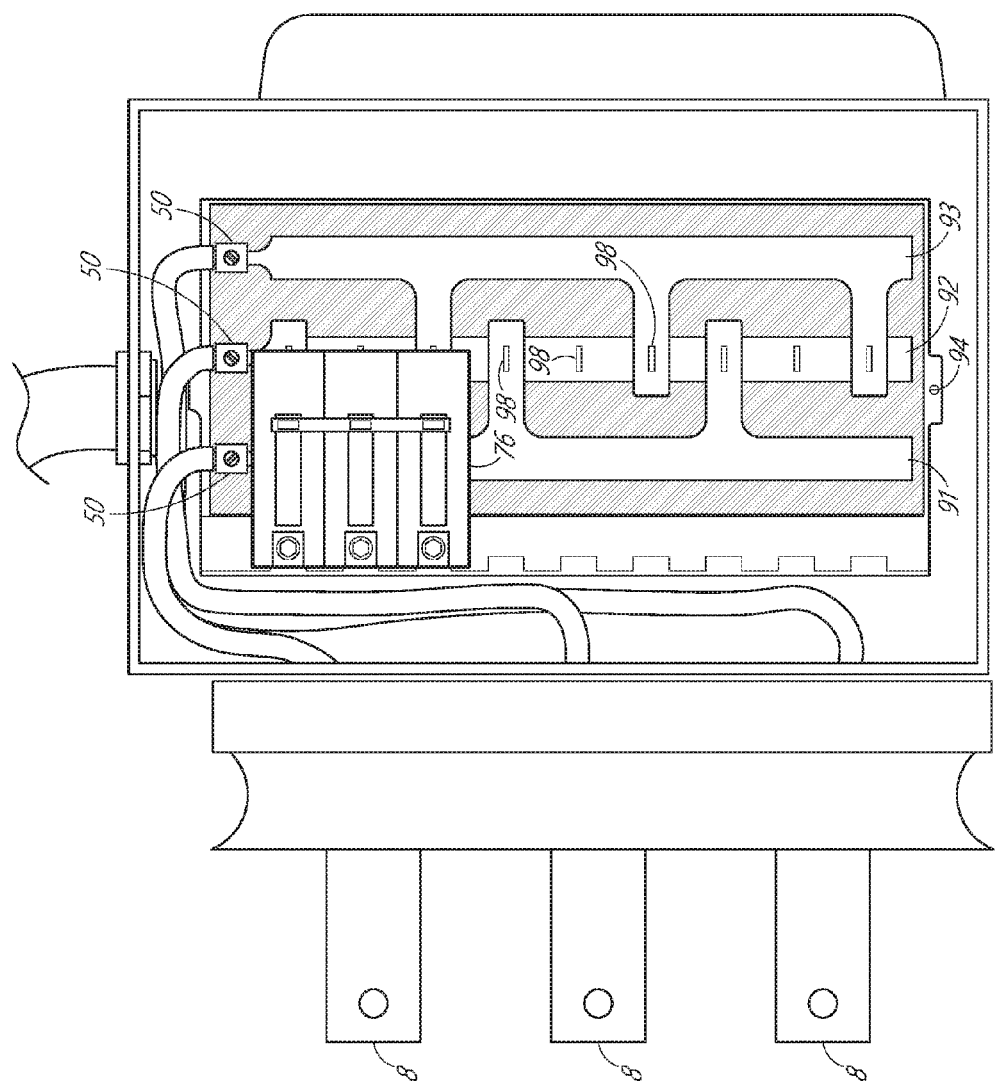
FIG. 34 illustrates a side cutaway view of an interchangeable, lug-based, three-phase bussing assembly installed in a three-phase, integral bypass system.

FIG. 34 illustrates a side cutaway view of an interchangeable, lug-based, three-phase bussing assembly installed in a three-phase, integral bypass system. As can be seen in FIG. 34, the bussing assembly 95, similar to the bussing assembly of FIG. 24, is installed in a three-phase integral bypass system.

Figure 35:
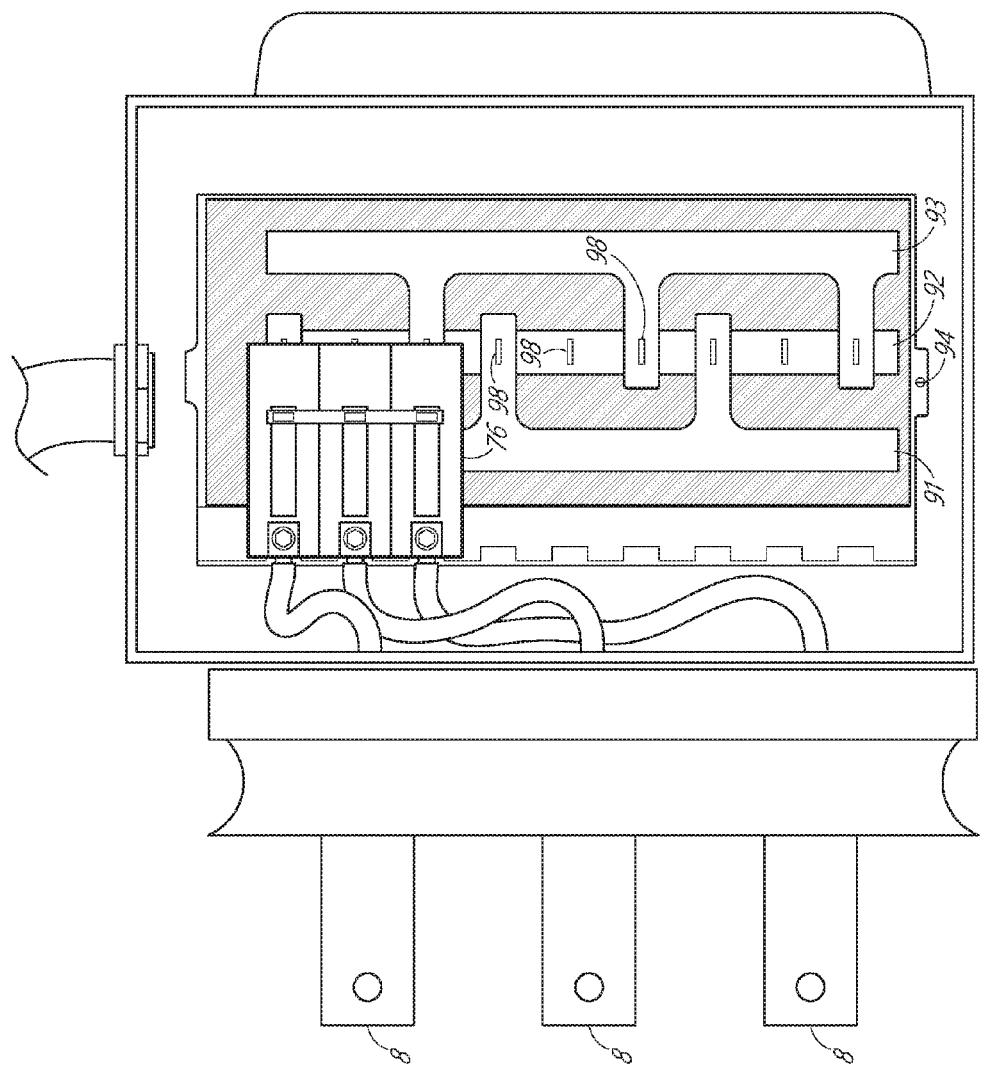
FIG. 35 illustrates a side cutaway view of an interchangeable, no-lug, three-phase bussing assembly installed in a three-phase, integral bypass system.

FIG. 35 illustrates a side cutaway view of an interchangeable, no-lug, three-phase bussing assembly installed in a three-phase, integral bypass system. The integral bypass system uses a main circuit breaker 76 to power the busbars, rather than electrical lugs in connection with the three-phase power.

FIGS. 36A and 36B illustrate a side view of the installation and securement of an interchangeable, no-lug, three-phase bussing assembly. FIG. 36C illustrates a top view of the bussing assembly 95".

FIGS. 37A and 37B illustrate a side view of the installation and securement of an interchangeable, lug-type, three-phase bussing assembly. FIG. 36C illustrates a top view of the bussing assembly 95", with an installed breaker 96.

Figures 38A, 38B:
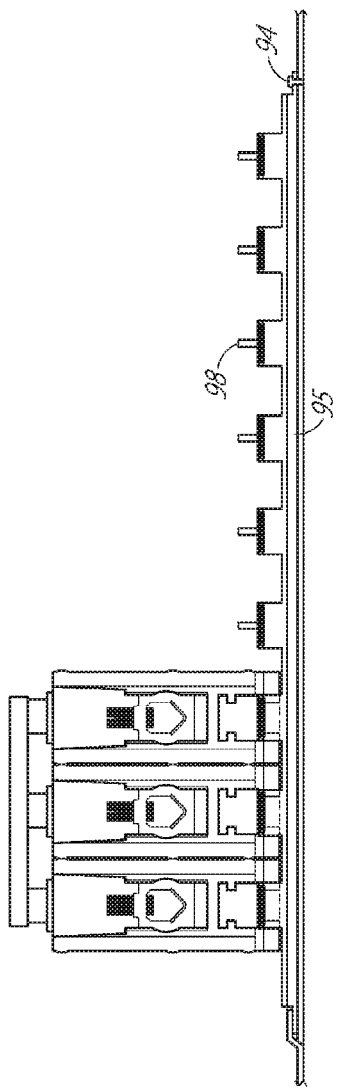
FIG. 38A illustrates a side view of an interchangeable, lug-type, three-phase bussing assembly, with an installed breaker.
FIG. 38B is a top view of the bussing assembly of FIG. 38A.

FIG. 38A illustrates a side view of an interchangeable, lug-type, three-phase bussing assembly, with an installed breaker. FIG. 38B is a top view of the bussing assembly of FIG. 38A.

FIG. 39A illustrates a side view of an interchangeable, lug-type, single-phase bussing assembly with an installed breaker. FIG. 39B is a top view of the bussing assembly of FIG. 39A.

Figure 40:
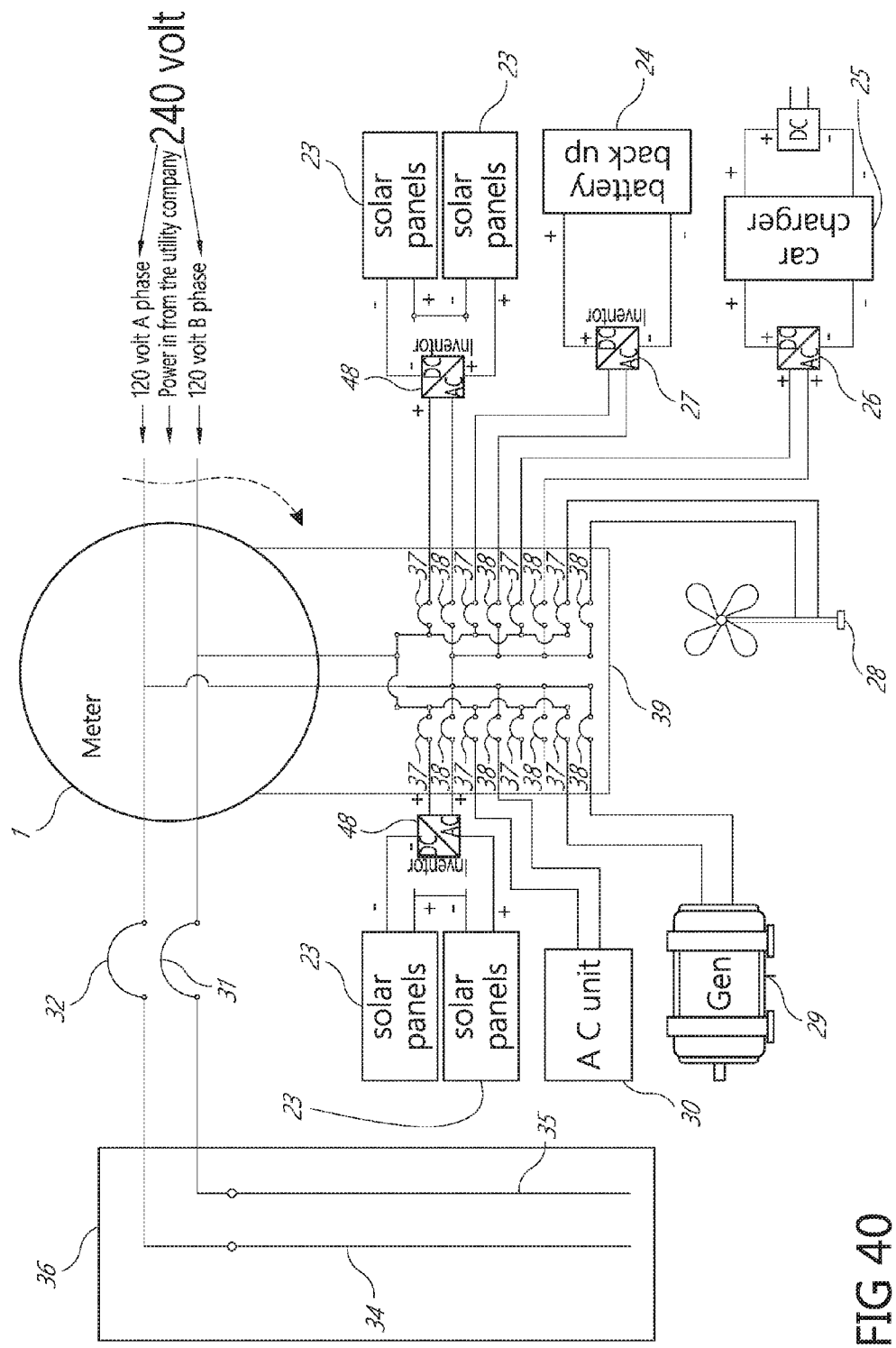
FIG. 40 is a one line diagram showing an example of a solar power system with multiple inverters, wind turbine, car charger, battery backup, and a generator.

FIG. 40 is a one line diagram showing an example of a solar power system with multiple inverters, wind turbine, car charger, battery backup, and a generator.

Figure 41:
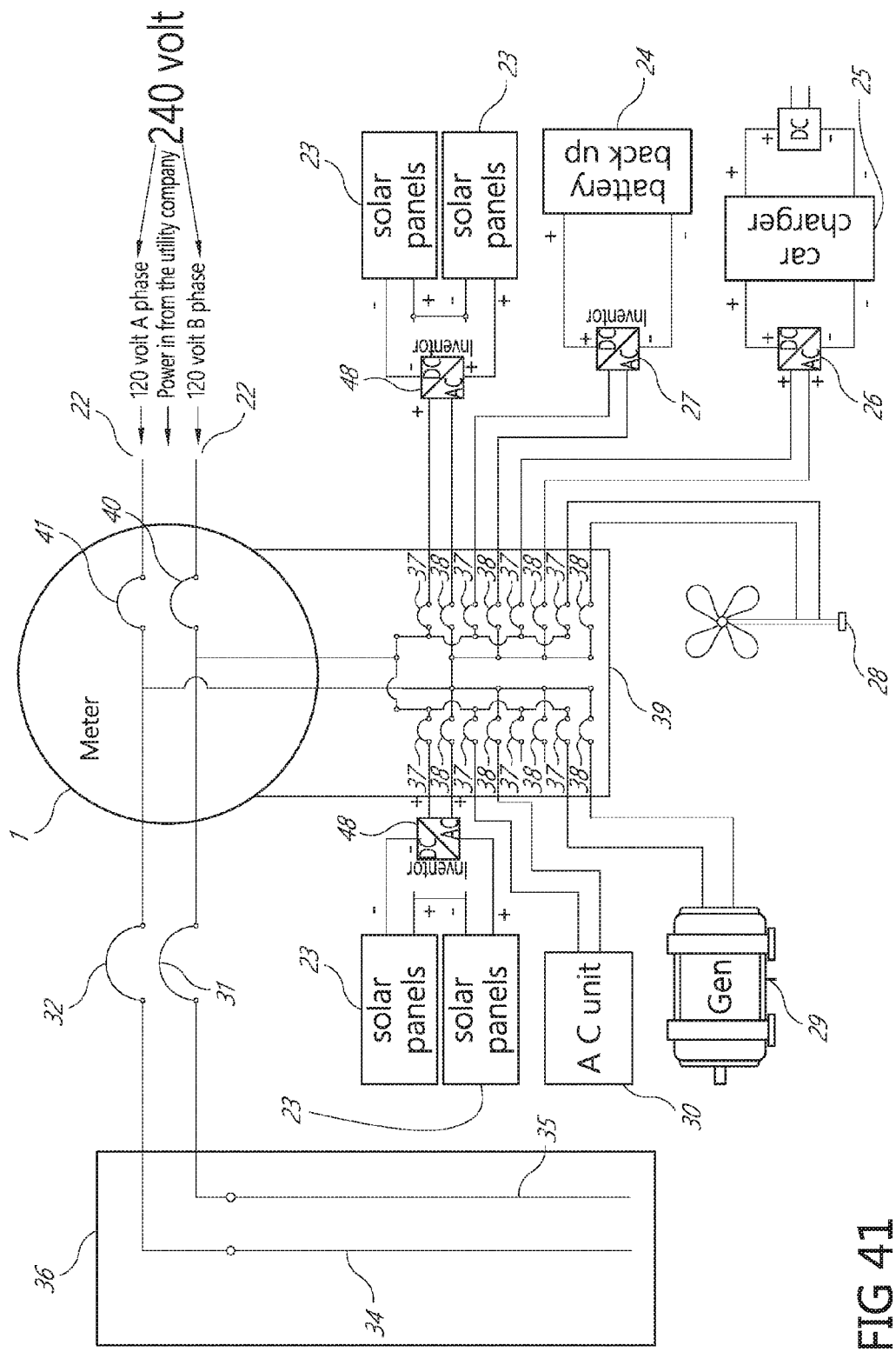
FIG. 41 is a one line diagram showing an example of a solar power system with multiple inverters, wind turbine, car charger, battery backup, and a generator, with a main breaker controlling the whole system and the power to the main panel.

FIG. 41 is a one line diagram showing an example of a solar power system with multiple inverters, wind turbine, car charger, battery backup, and a generator, with a main breaker controlling the whole system and the power to the main panel.

Figure 42:
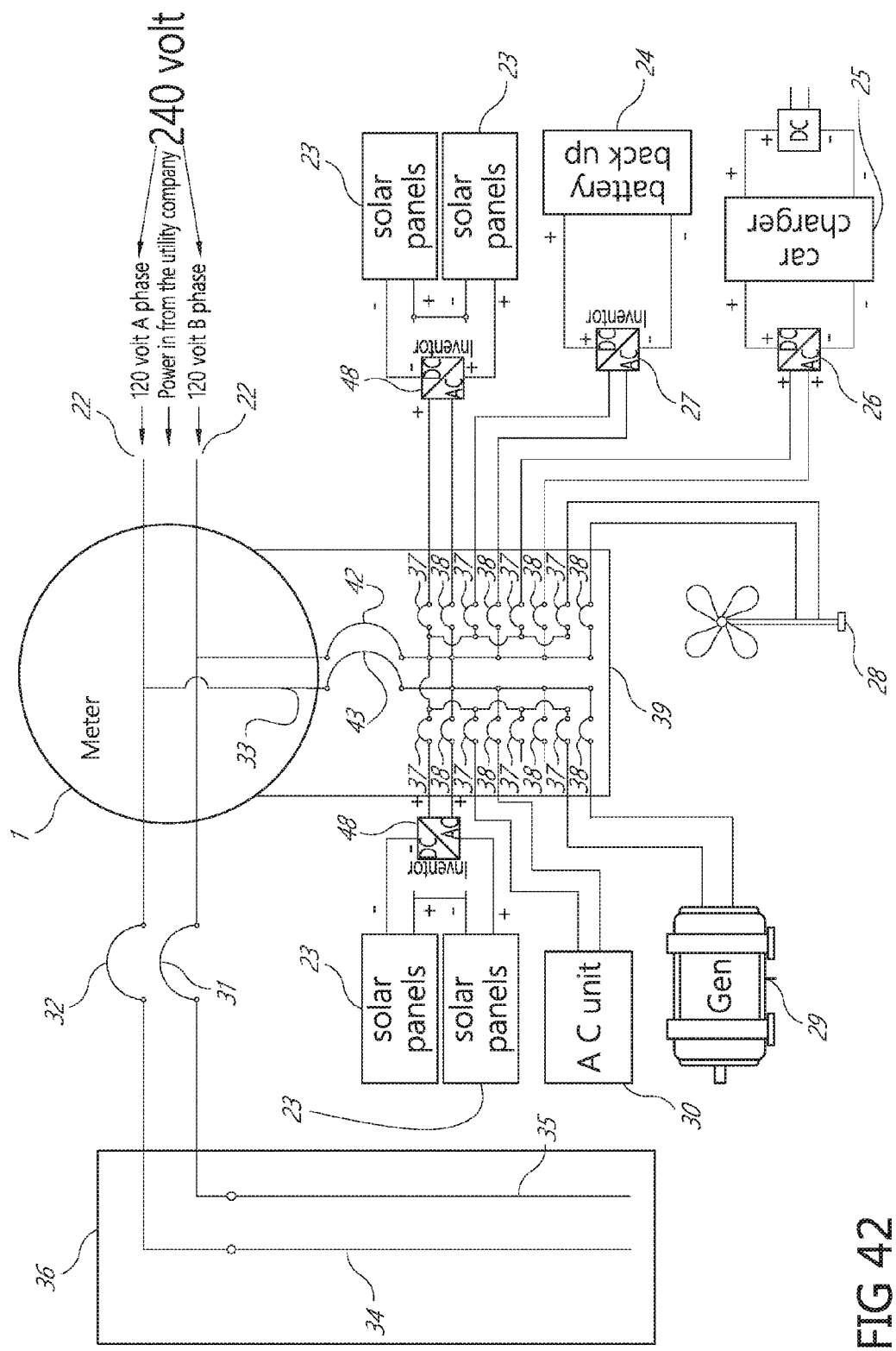
FIG. 42 is a one line diagram showing an example of a solar power system with multiple inverters, wind turbine, car charger, battery backup, and a generator, with a main breaker controlling the whole system.

FIG. 42 is a one line diagram showing an example of a solar power system with multiple inverters, wind turbine, car charger, battery backup, and a generator, with a main breaker controlling the whole system.

Figure 43:
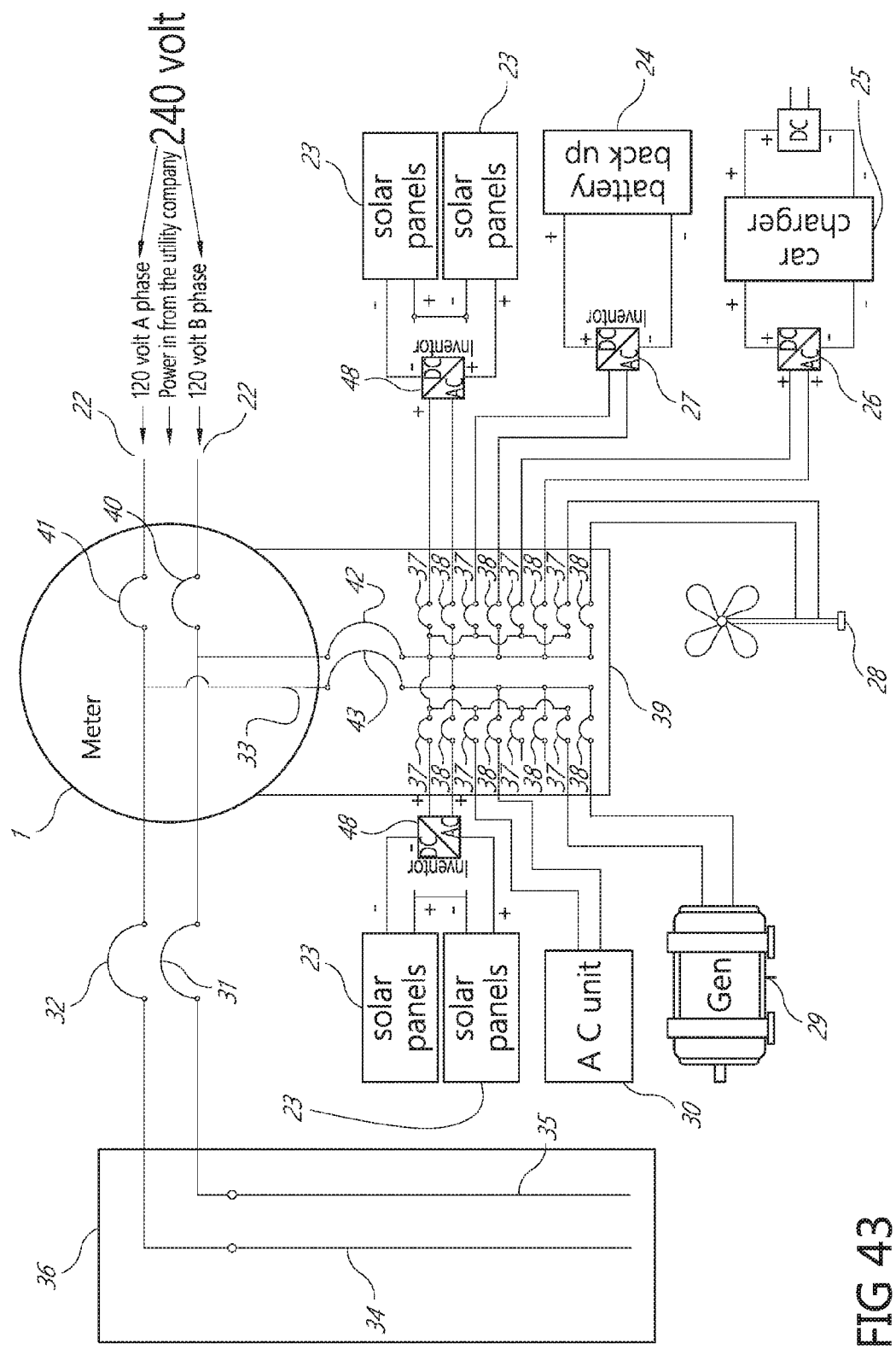
FIG. 43 is a one line diagram showing an example of a solar power system with multiple inverters, wind turbine, car charger, battery backup, and a generator, with a main breaker controlling the whole system and main controlling main panel as well.

FIG. 43 is a one line diagram showing an example of a solar power system with multiple inverters, wind turbine, car charger, battery backup, and a generator, with a main breaker controlling the whole system and main controlling main panel as well.

Figure 44:
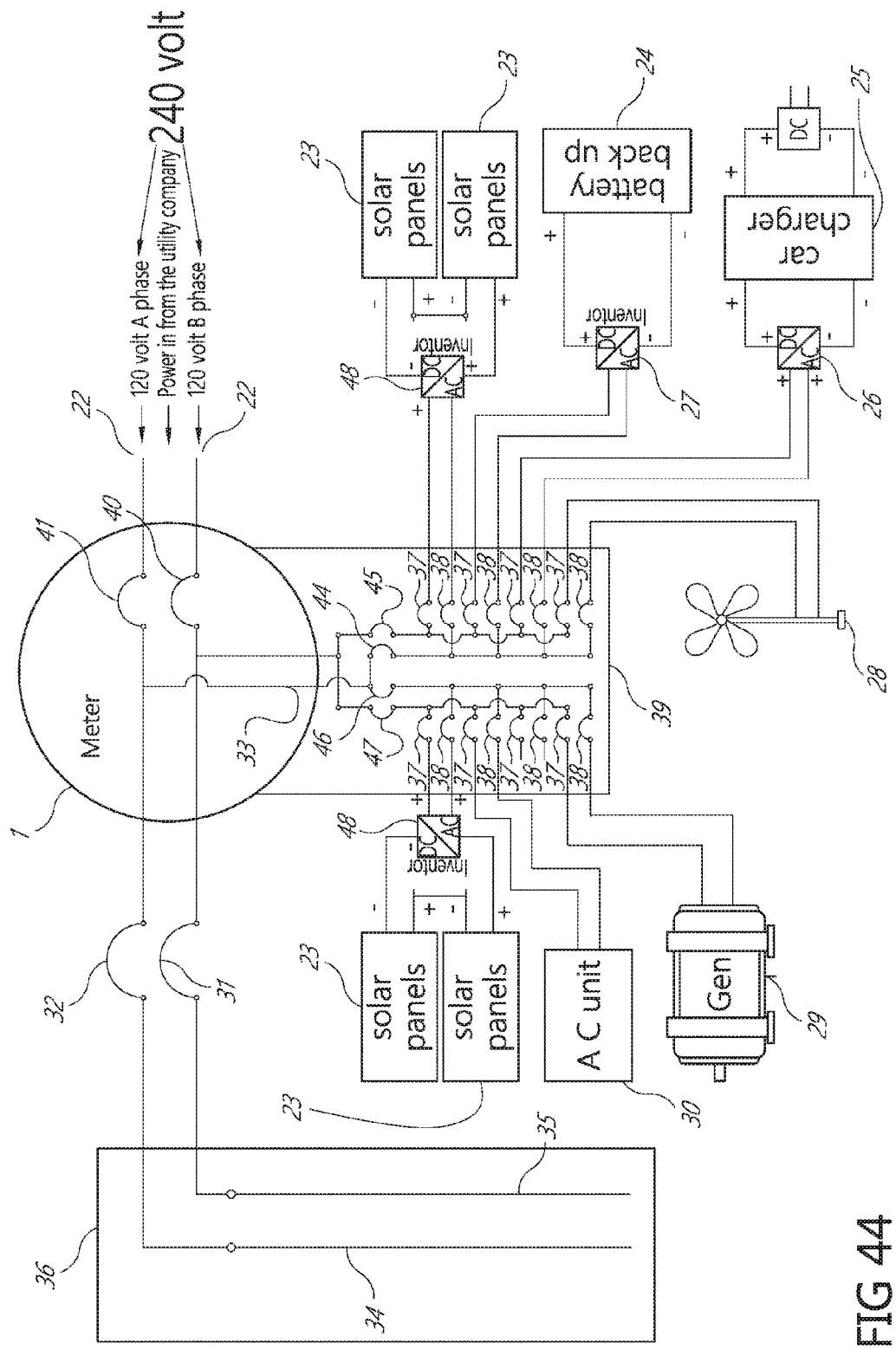
FIG. 44 is a one line diagram showing an example of a solar power system with multiple inverters, wind turbine, car charger, battery backup, and a generator, with a main breaker controlling the right side of the system, and a main controlling the left side of the system, with a main that controls everything, including the main panel.

FIG. 44 is a one line diagram showing an example of a solar power system with multiple inverters, wind turbine, car charger, battery backup, and a generator, with a main breaker controlling the right side of the system, and a main controlling the left side of the system, with a main that controls everything, including the main panel.

Figure 45:
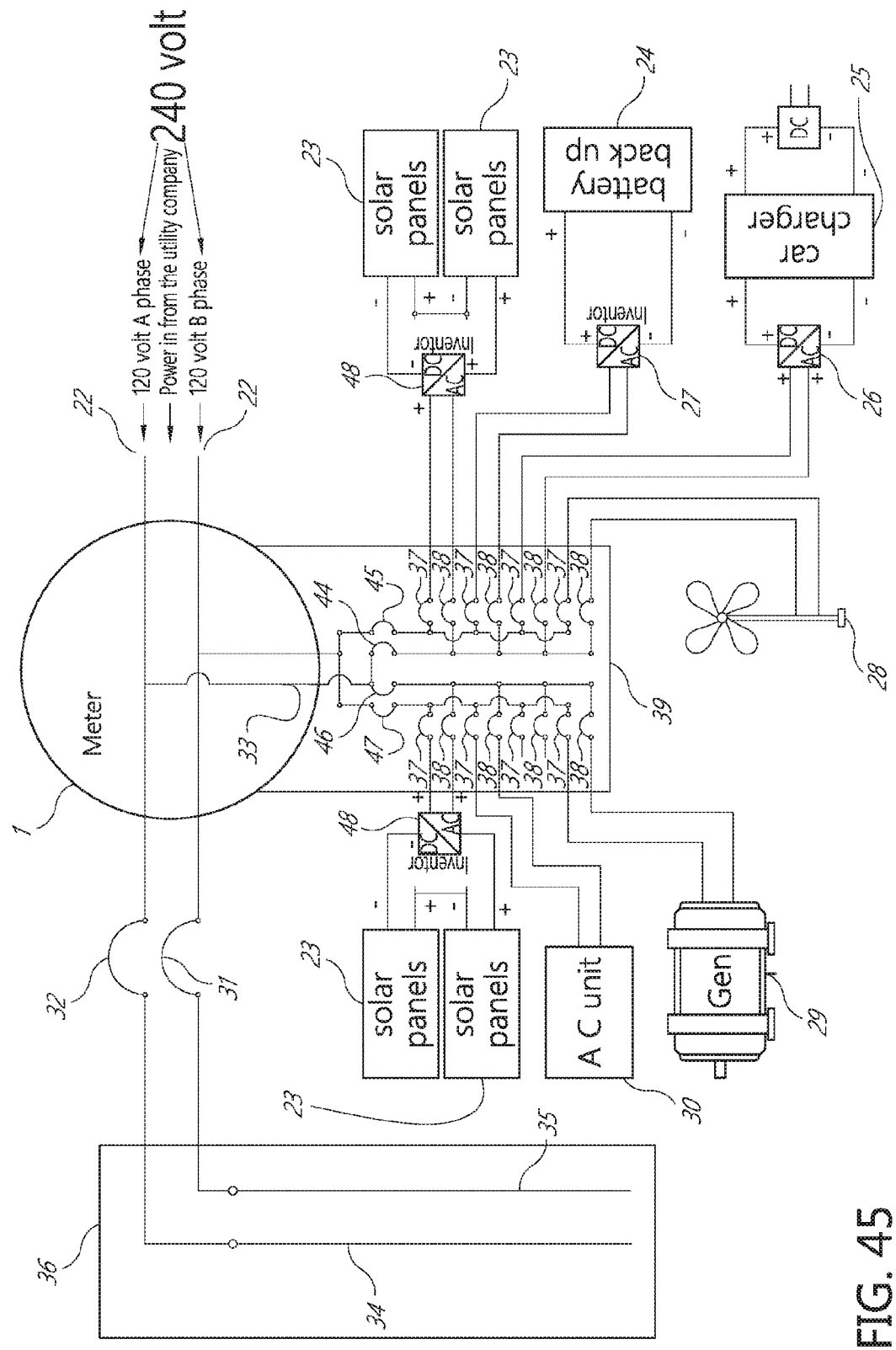
FIG. 45 is a one line diagram showing an example of a solar system with multiple inverters, wind turbine, car charger, battery backup, and a generator, with a main breaker controlling the right side of the system and a main controlling the left side of the system.

FIG. 45 is a one line diagram showing an example of a solar system with multiple inverters, wind turbine, car charger, battery backup, and a generator, with a main breaker controlling the right side of the system and a main controlling the left side of the system.

Figure 46:
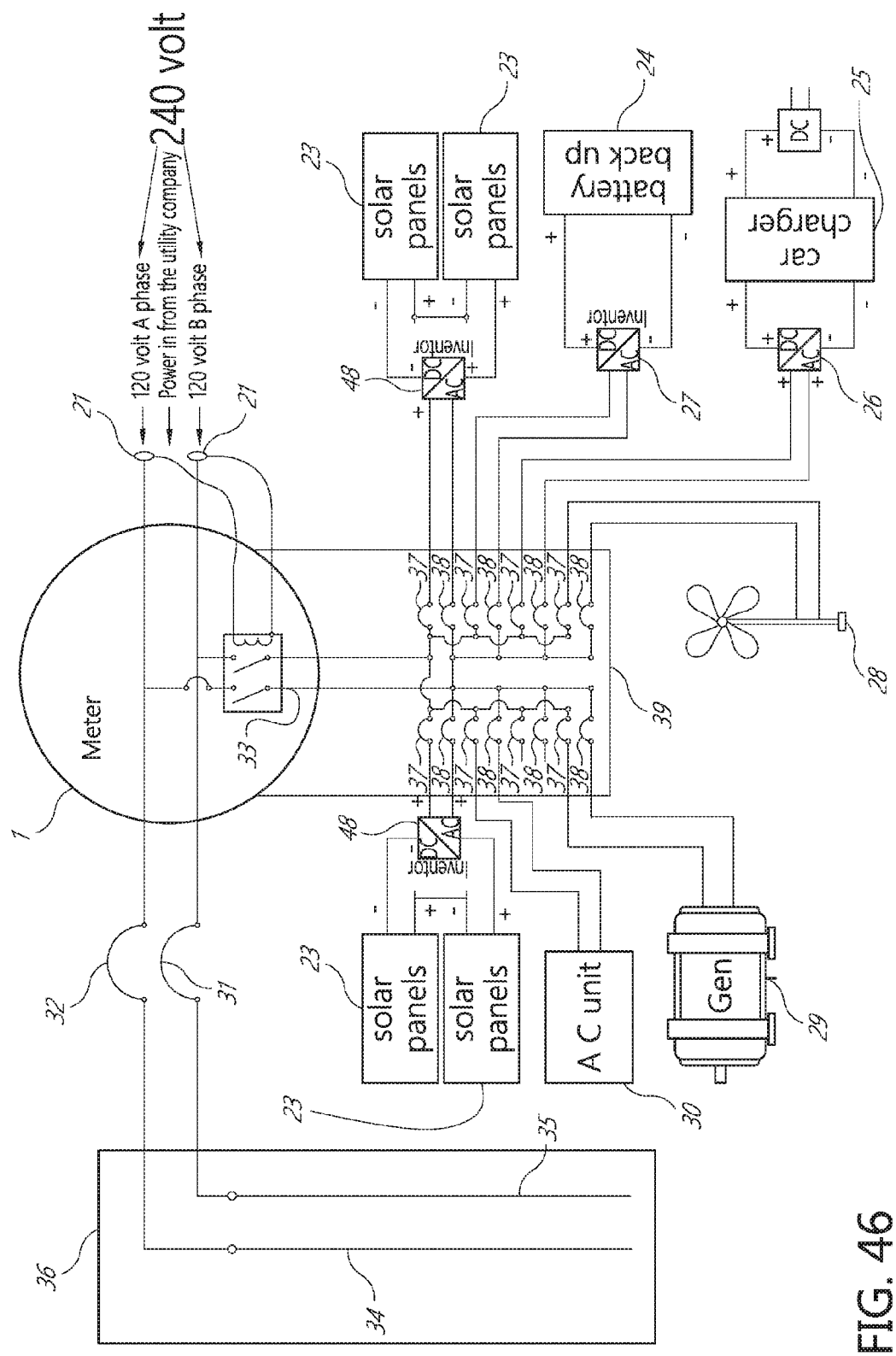
FIG. 46 is a one line diagram showing an example of a solar power system with multiple inverters, wind turbine, car charger, battery backup, and a generator, with a transfer system that can disconnect from the grid when the grid goes down.

FIG. 46 is a one line diagram showing an example of a solar power system with multiple inverters, wind turbine, car charger, battery backup, and a generator, with a transfer system that can disconnect from the grid when the grid goes down.

Figure 47:
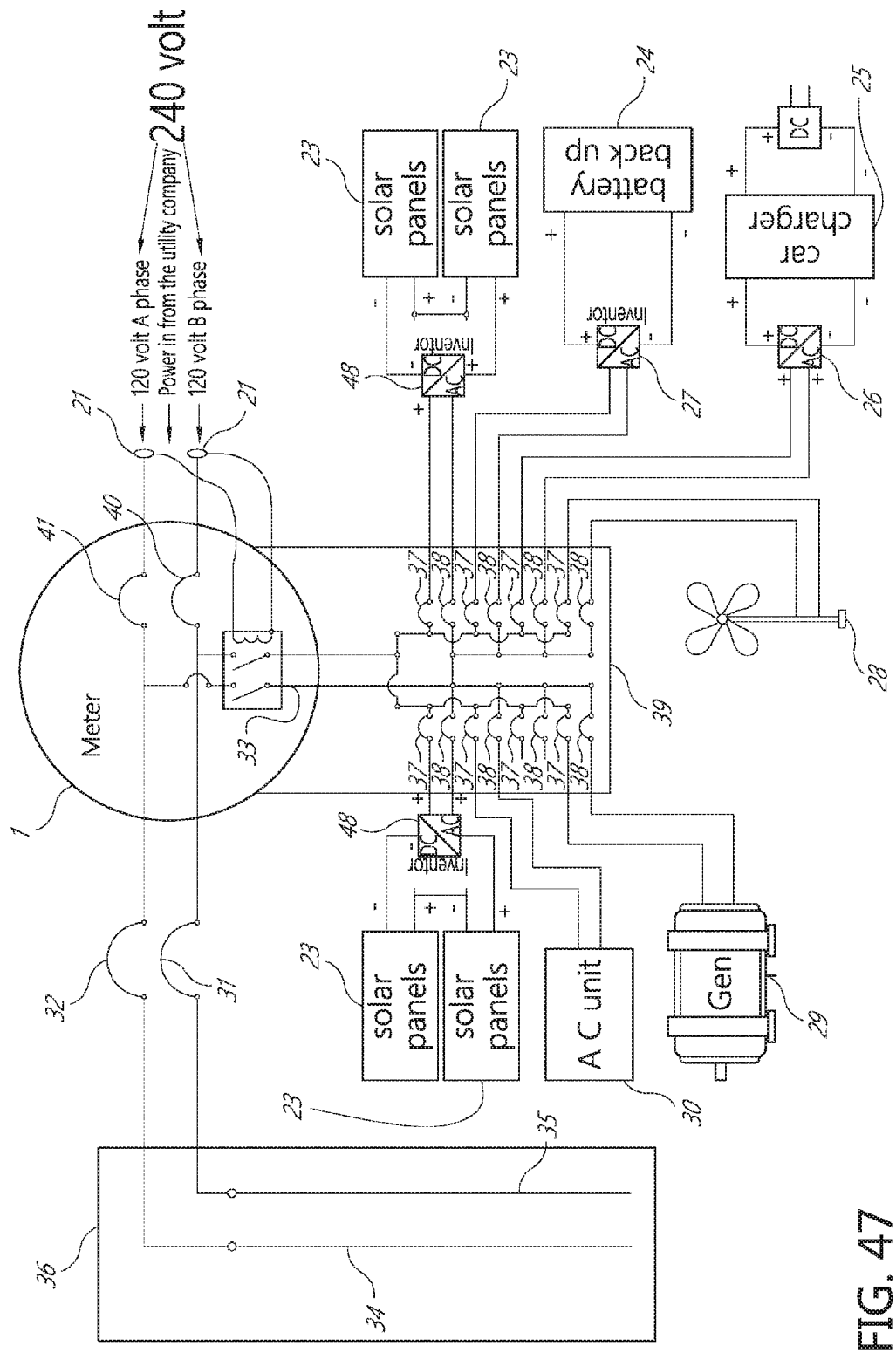
FIG. 47 is a one line diagram showing an example of a solar power system with multiple inverters, wind turbine, car charger, battery backup, and a generator, with a transfer system that can disconnect itself from the grid when the grid goes down, and has a main breaker that can control the whole system, including the main panel.

FIG. 47 is a one line diagram showing an example of a solar power system with multiple inverters, wind turbine, car charger, battery backup, and a generator, with a transfer system that can disconnect itself from the grid when the grid goes down, and has a main breaker that can control the whole system, including the main panel.

Figure 48:
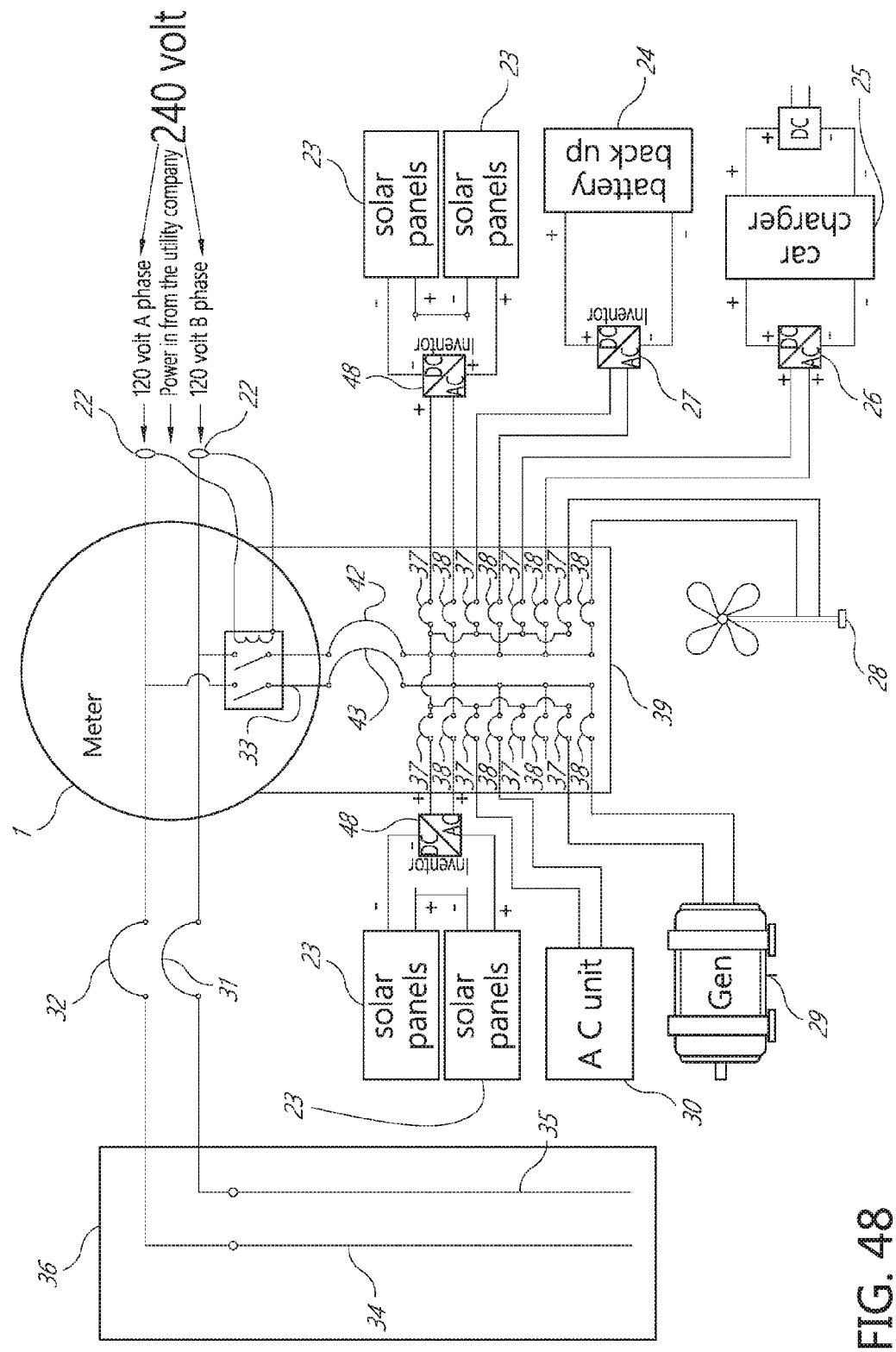
FIG. 48 is a one line diagram showing an example of a solar power system with multiple inverters, wind turbine, car charger, battery backup, and a generator, with a transfer system that can disconnect itself from the grid when the grid goes down, and has a main breaker that can control the meter/bypass.

FIG. 48 is a one line diagram showing an example of a solar power system with multiple inverters, wind turbine, car charger, battery backup, and a generator, with a transfer system that can disconnect itself from the grid when the grid goes down, and has a main breaker that can control the meter/bypass.

Figure 49:
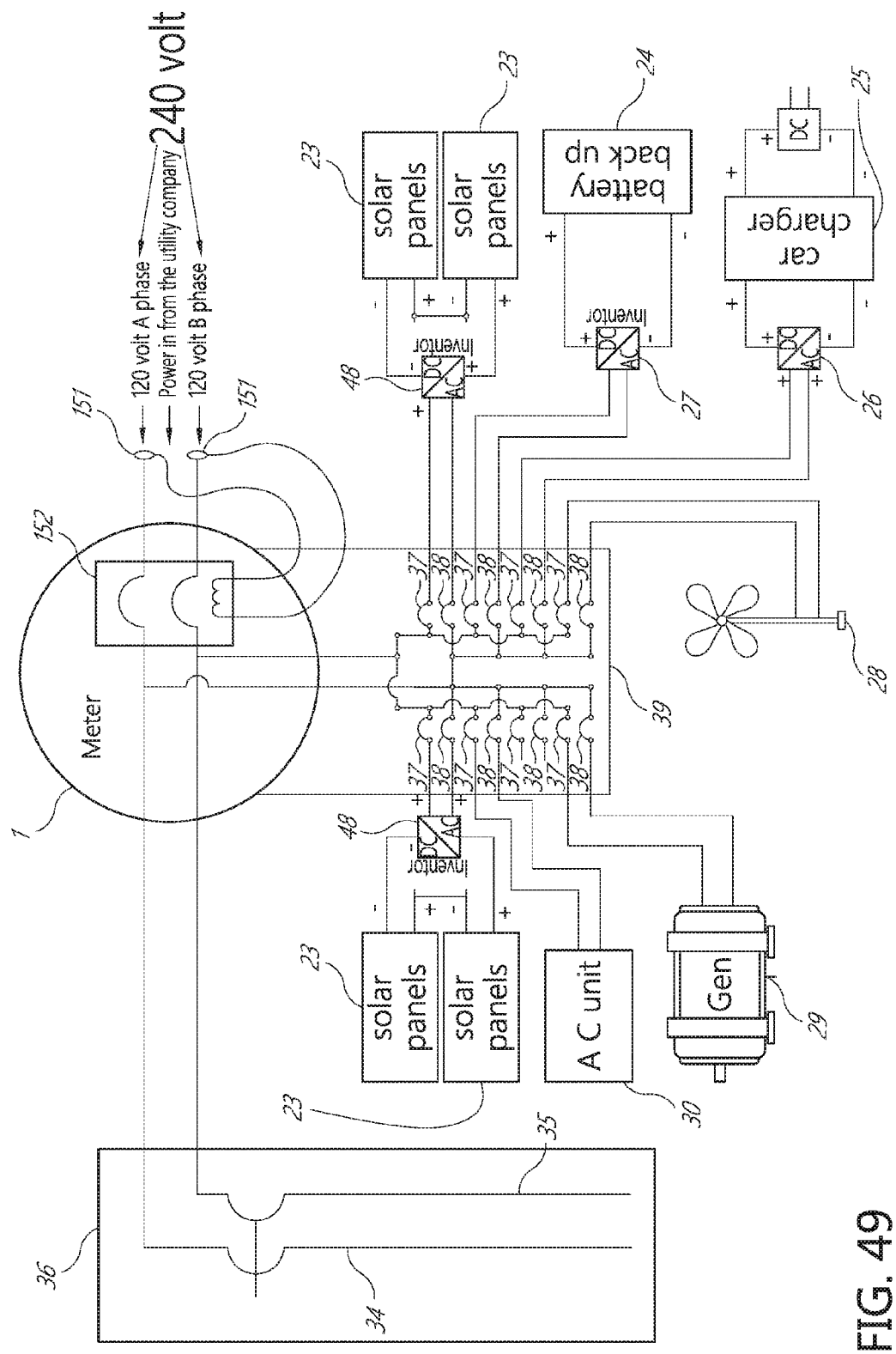
FIG. 49 is a one line diagram showing an example of a solar power system with multiple inverters, wind turbine, car charger, battery backup, and a generator, with a transfer system that can disconnect itself from the grid, when the grid goes down, and has a main breaker that can control the meter/bypass, and a main breaker that can control everything, including the main panel.

FIG. 49 is a one line diagram showing an example of a solar power system with multiple inverters, wind turbine, car charger, battery backup, and a generator, with a transfer system that can disconnect itself from the grid, when the grid goes down, and has a main breaker that can control the meter/bypass, and a main breaker that can control everything, including the main panel.

In particular, the system may include an AC coupler 152 with associated probes 151, which can monitor one or more of AC voltage, current, and frequency to detect disruptions or outages on the utility side of the system. When detected, the AC coupler can disengage the utility power and operate the system on alternative energy sources such as solar power, generators, battery backup, or any combination of such alternative energy sources. Although not specifically depicted in other embodiments described herein, such a device or capability can be integrated into any such bypass system. For example, an offset bypass panel such as the offset bypass panel of FIG. 33 can include an AC coupler disposed within the panel and probes in contact with the system at an appropriate location. Similar modifications can be made to any of the other embodiments disclosed herein. The AC coupler or similar device can also be a separate component disposed outside of the bypass system or bypass components.

The AC coupler 152 need not be configured to disconnect the system from the utility only when the utility undergoes a disruption. Rather, the AC coupler 152 can be configured to disconnect the system from the utility for any of a variety of reasons, such as a threshold of power being generated by the alternative energy sources, or during more expensive pricing periods for the utility power, such as during particular times of day, utilizing one or both of alternative energy or battery backup.

Figure 50:
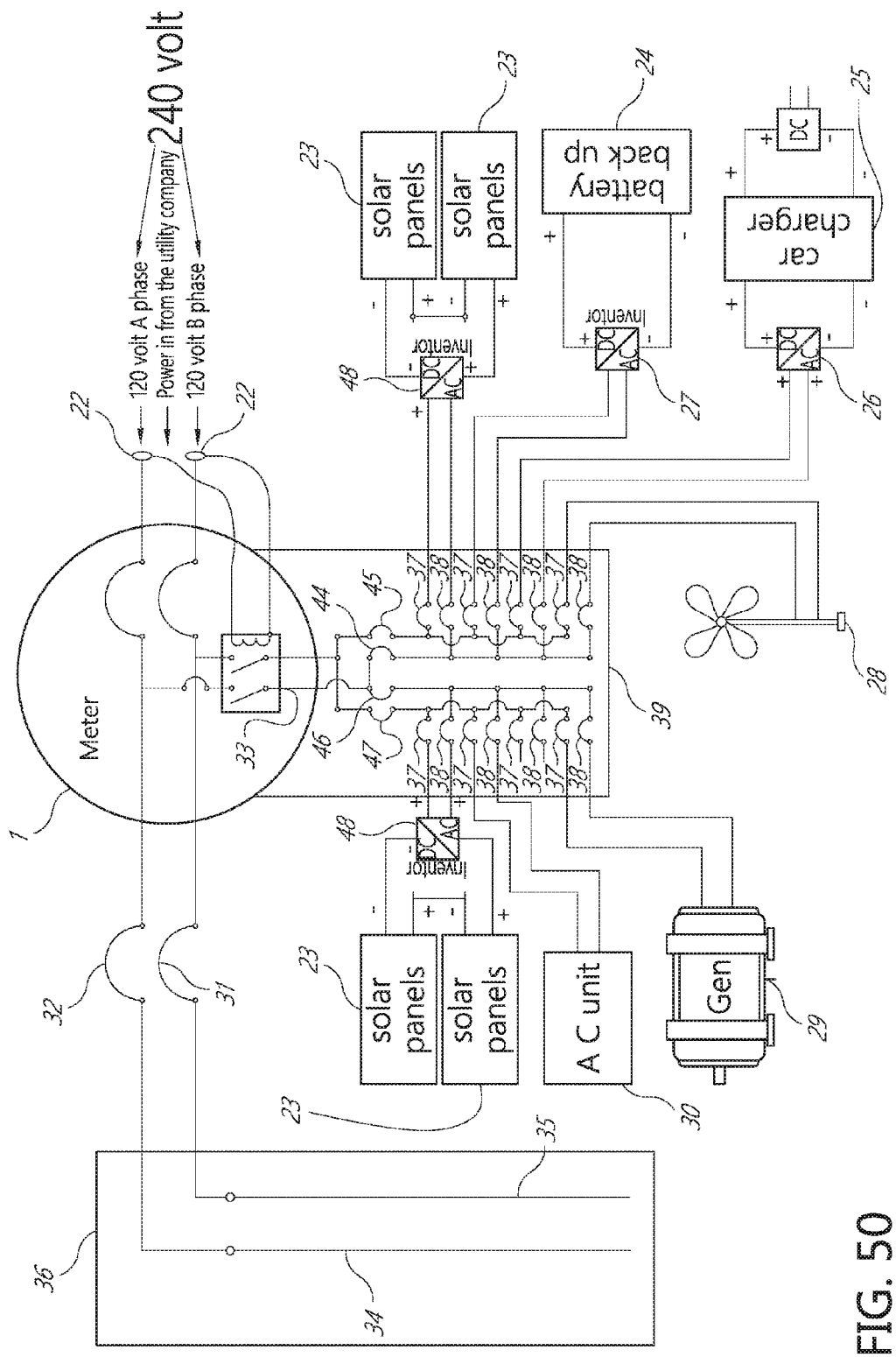
FIG. 50 is a one line diagram showing an example of a solar power system with multiple inverters, wind turbine, car charger, battery backup, and a generator, with a transfer system, that can disconnect itself from the grid, when the grid goes down, and has two main breakers, one for the left side, and one for the right, and a main breaker that can control everything, including the main panel.

FIG. 50 is a one line diagram showing an example of a solar power system with multiple inverters, wind turbine, car charger, battery backup, and a generator, with a transfer system, that can disconnect itself from the grid, when the grid goes down, and has two main breakers, one for the left side, and one for the right, and a main breaker that can control everything, including the main panel.

Figure 51:
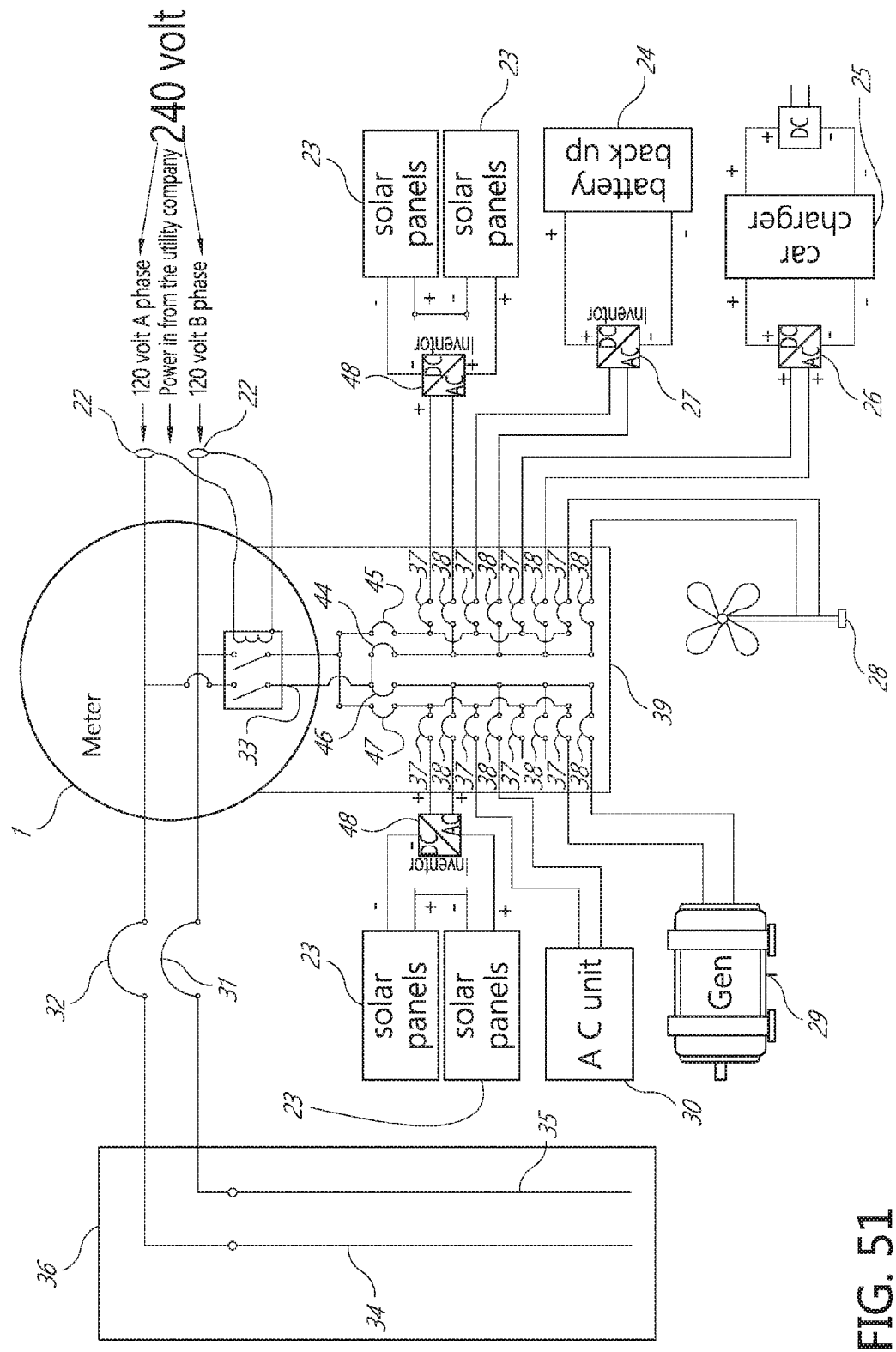
FIG. 51 is a one line diagram showing an example of a solar power system with multiple inverters, wind turbine, car charger, battery backup, and a generator, with a transfer system that can disconnect itself from the grid, when the grid goes down, and has a two main breakers, one for the left side, and one for the right.

FIG. 51 is a one line diagram showing an example of a solar power system with multiple inverters, wind turbine, car charger, battery backup, and a generator, with a transfer system that can disconnect itself from the grid, when the grid goes down, and has a two main breakers, one for the left side, and one for the right.

Figure 52:
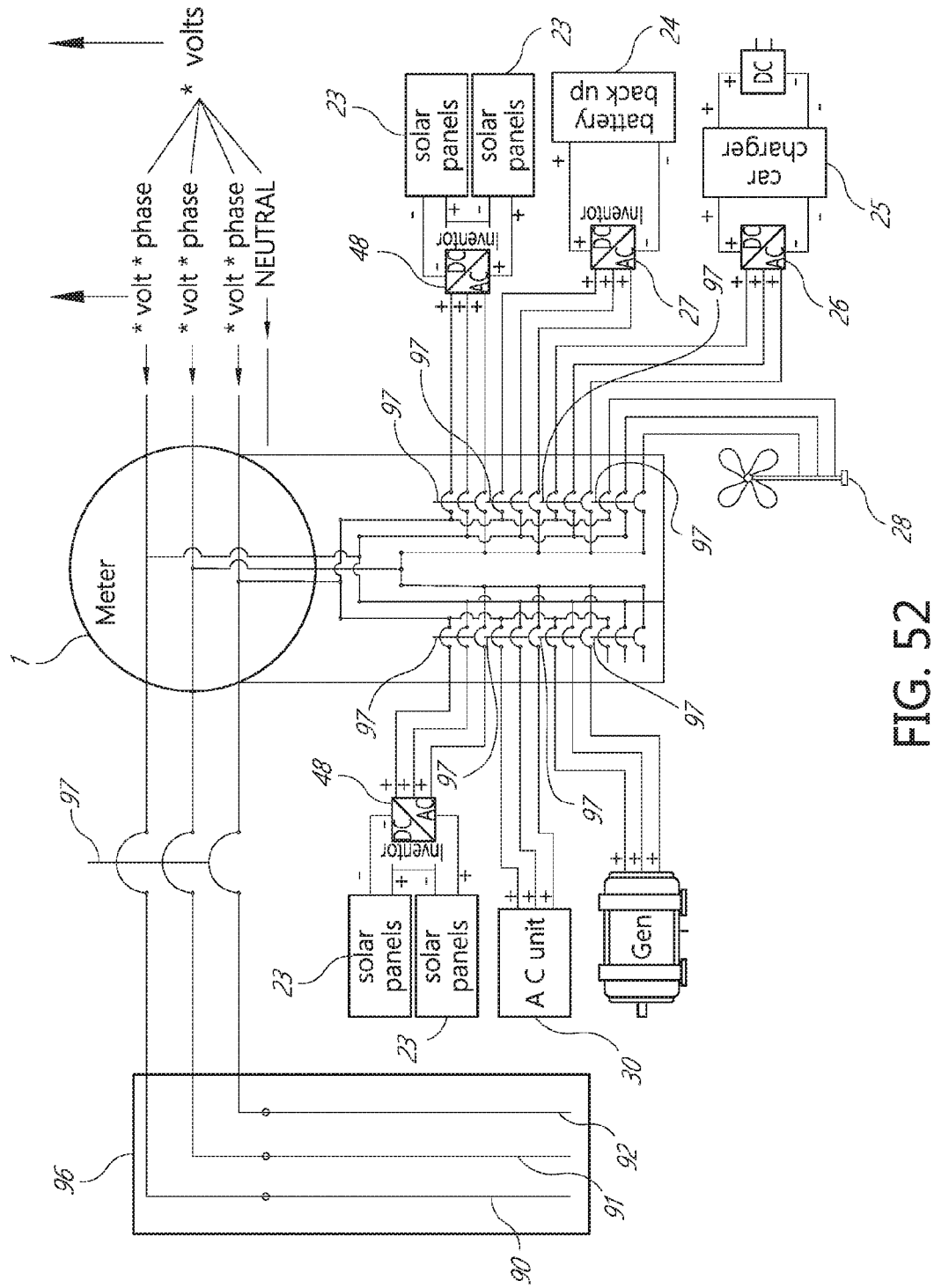
FIG. 52 is a 3 phase meter bypass one line diagram, for live busing, with no main breaker.
Figure 53:
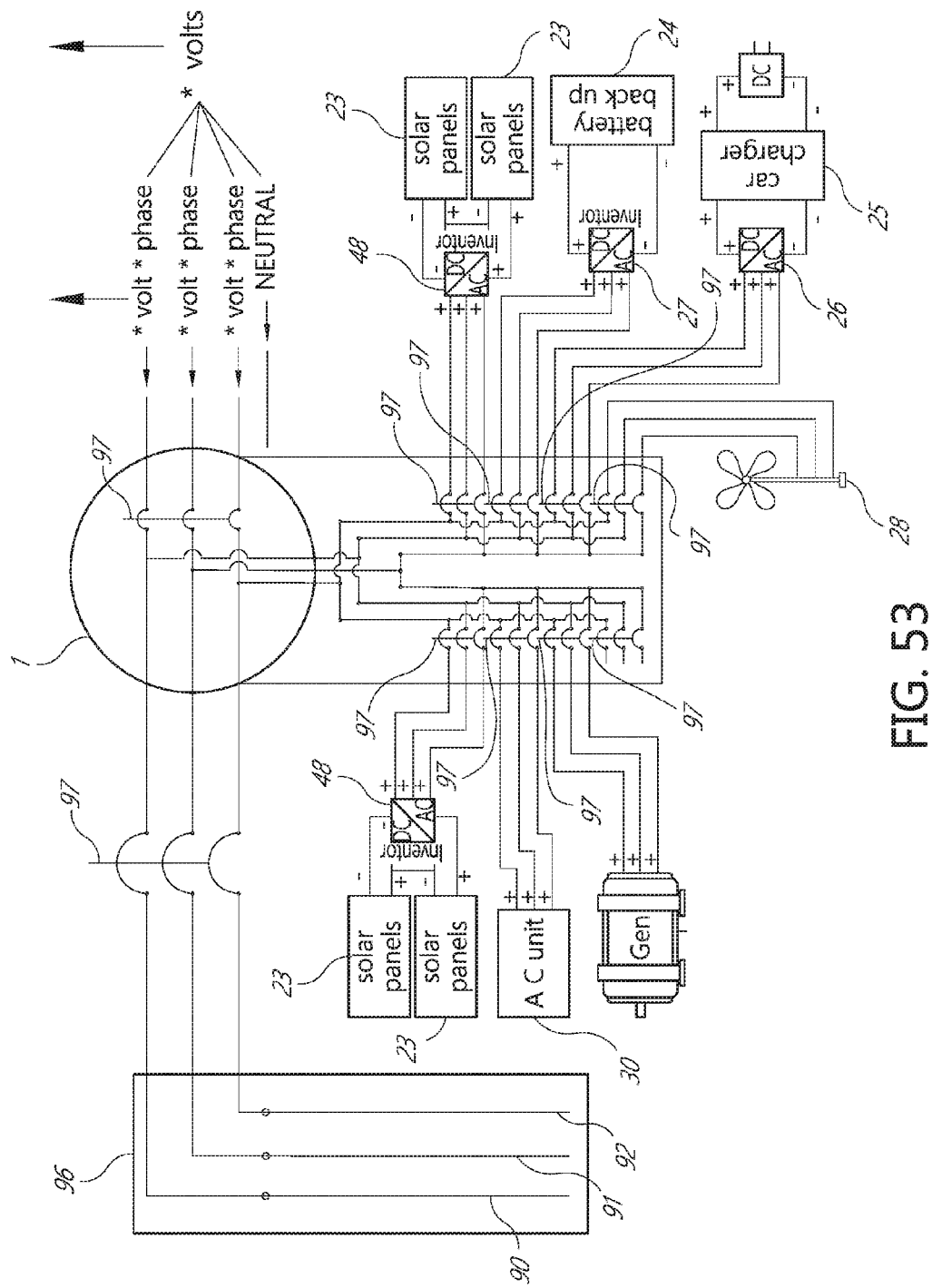
FIG. 53 is a 3 phase meter bypass one line diagram, for live busing, with a main breaker, that shuts off all power.

FIG. 52 is a 3 phase meter bypass one line diagram, for live busing, with no main breaker, FIG. 53 is a 3 phase meter bypass one line diagram, for live busing, with a main breaker, that shuts off all power.

Figure 54:
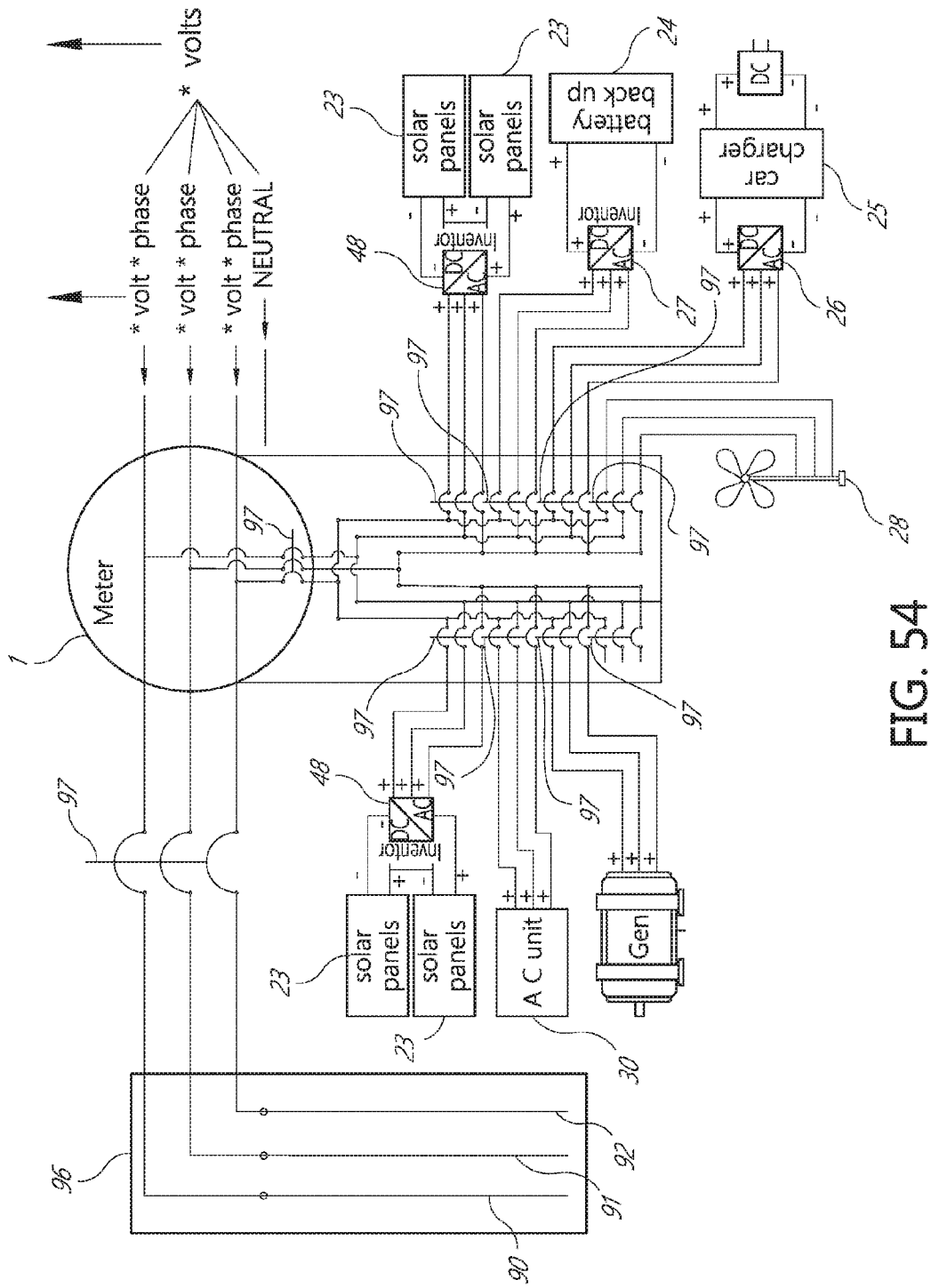
FIG. 54 is a 3 phase meter bypass one line diagram, with a main breaker, that shuts off the meter bypass area.

FIG. 54 is a 3 phase meter bypass one line diagram, with a main breaker, that shuts off the meter bypass area.

Figure 55:
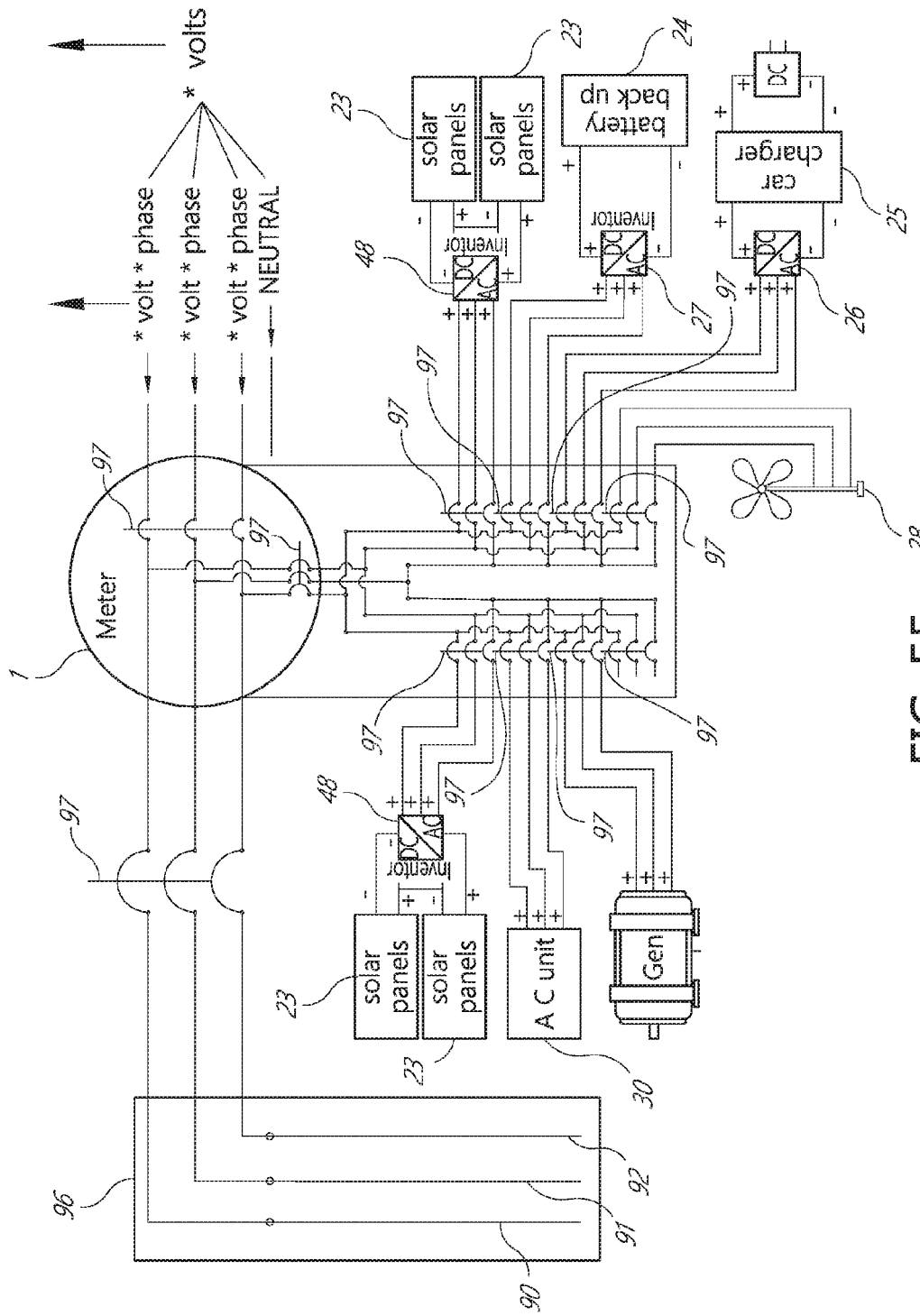
FIG. 55 is a 3 phase meter bypass one line diagram, with a main breaker, that shuts off the meter bypass area, and a breaker that shuts off all power.

FIG. 55 is a 3 phase meter bypass one line diagram, with a main breaker, that shuts off the meter bypass area, and a breaker that shuts off all power.

Figure 56:
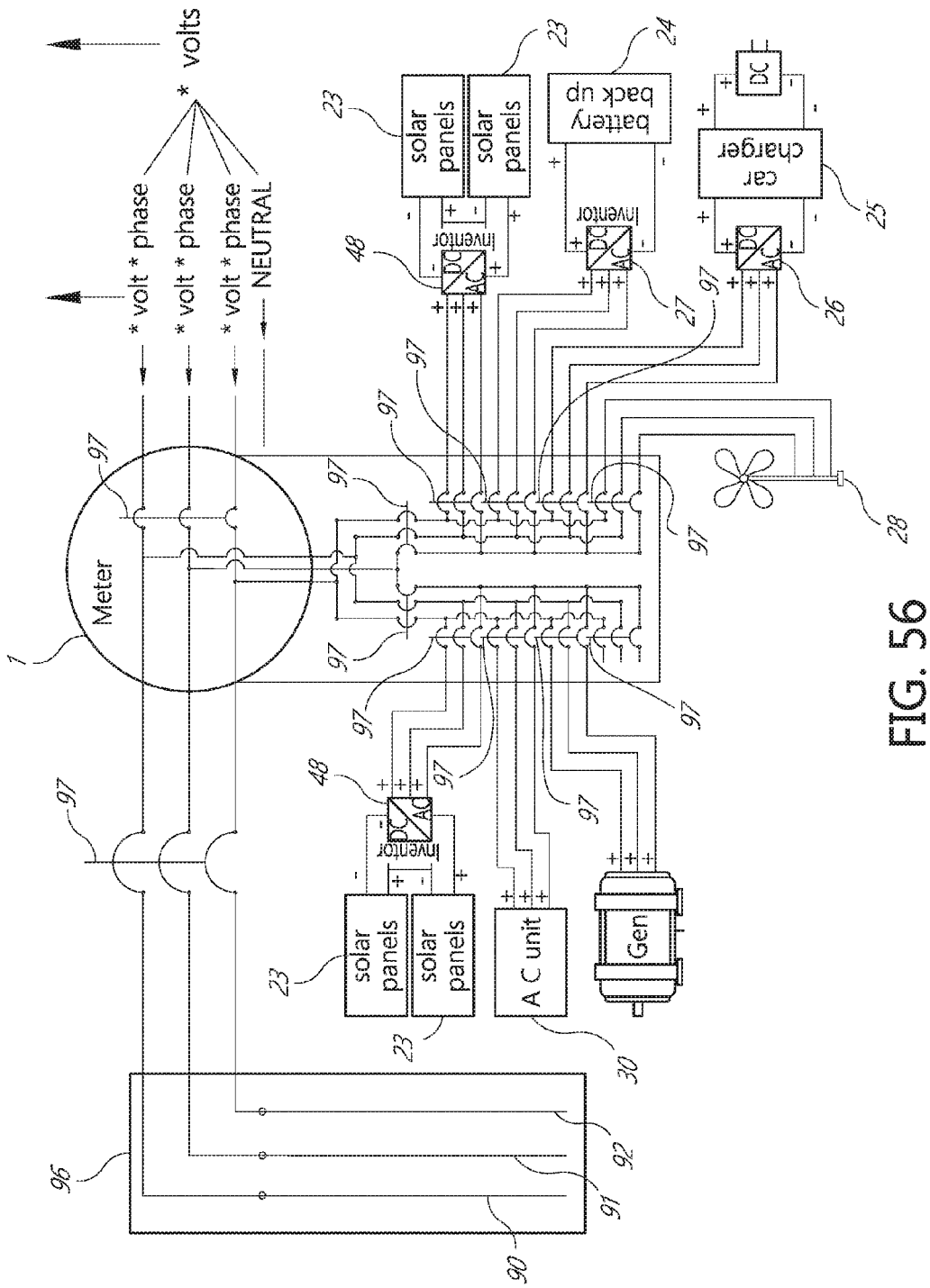
FIG. 56 is a 3 phase meter bypass one line diagram, with 2 main breaker, that shuts off the right, and left sides of the meter bypass area, and a breaker that shuts off all power.

FIG. 56 is a 3 phase meter bypass one line diagram, with 2 main breaker, that shuts off the right, and left sides of the meter bypass area, and a breaker that shuts off all power.

Figure 57:
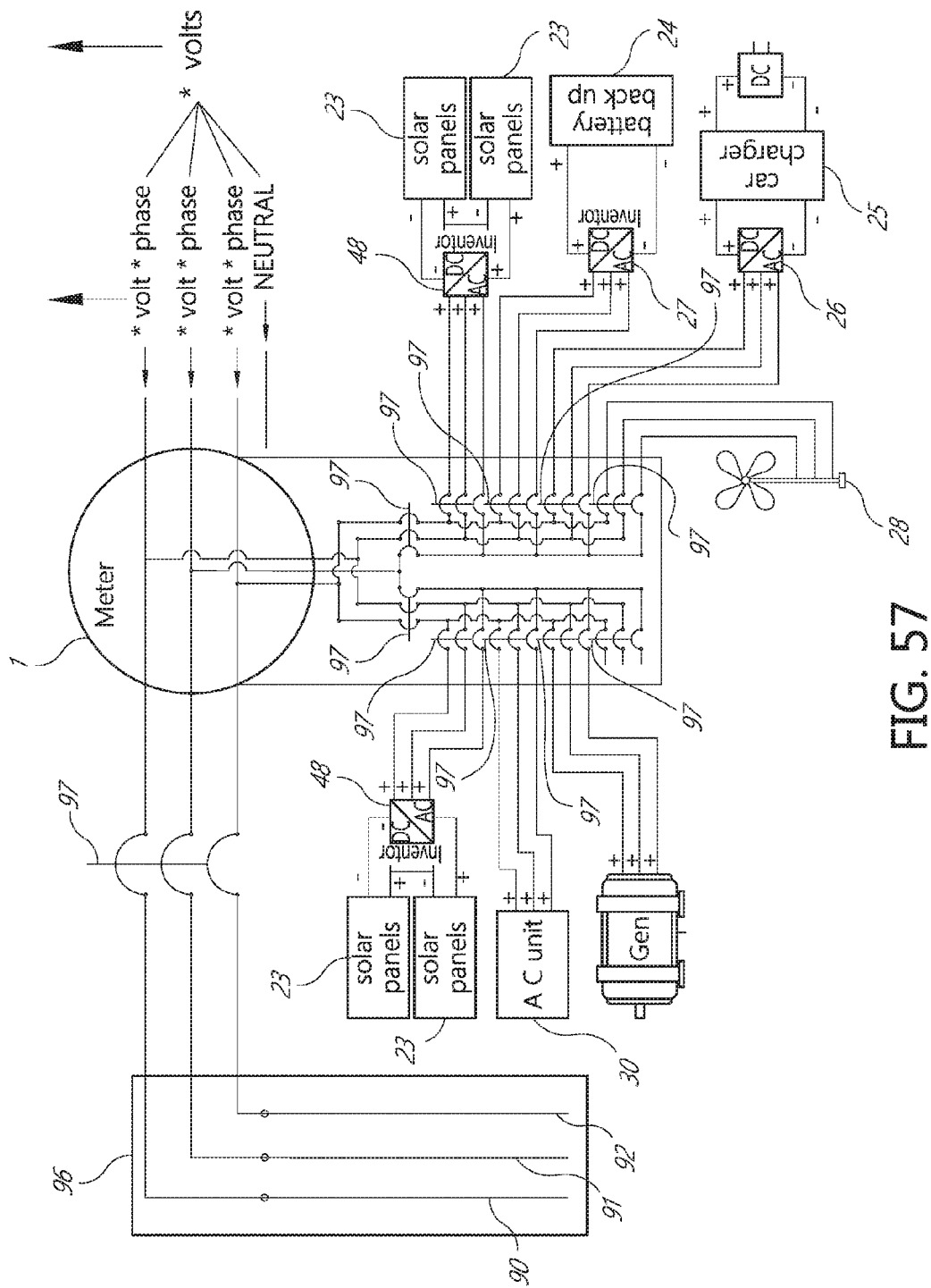
FIG. 57 is a 3 phase meter bypass one line diagram, with 2 main breaker, that shuts off the right, and left sides of the meter bypass area.

FIG. 57 is a 3 phase meter bypass one line diagram, with 2 main breaker, that shuts off the right, and left sides of the meter bypass area.

Figure 58:
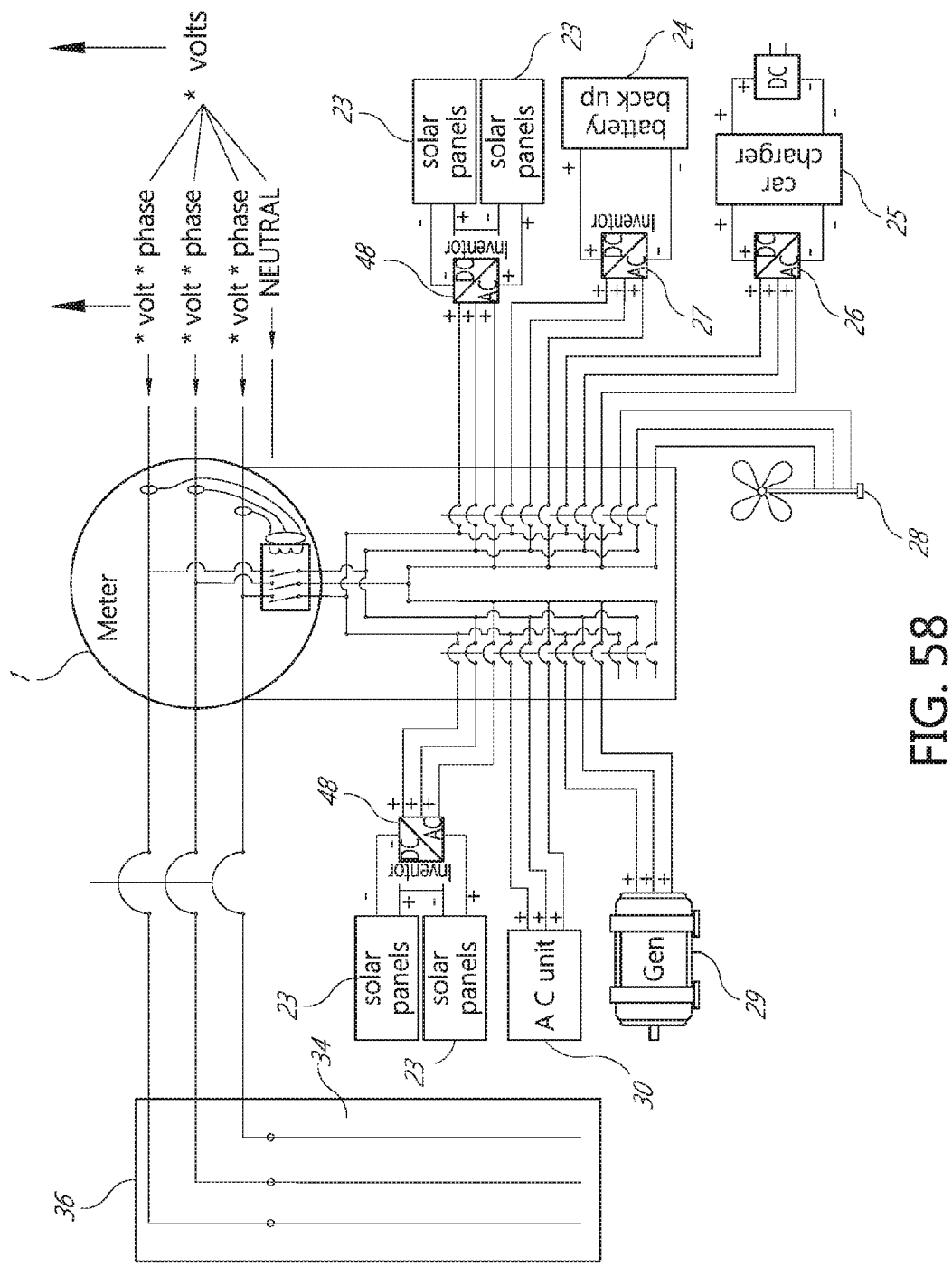
FIG. 58 is a 3 phase meter bypass one line diagram, for live busing, with no main breaker, and automatic transfer/AC Coupling system.

FIG. 58 is a 3 phase meter bypass one line diagram, for live busing, with no main breaker, and automatic transfer/AC Coupling system.

Figure 59:
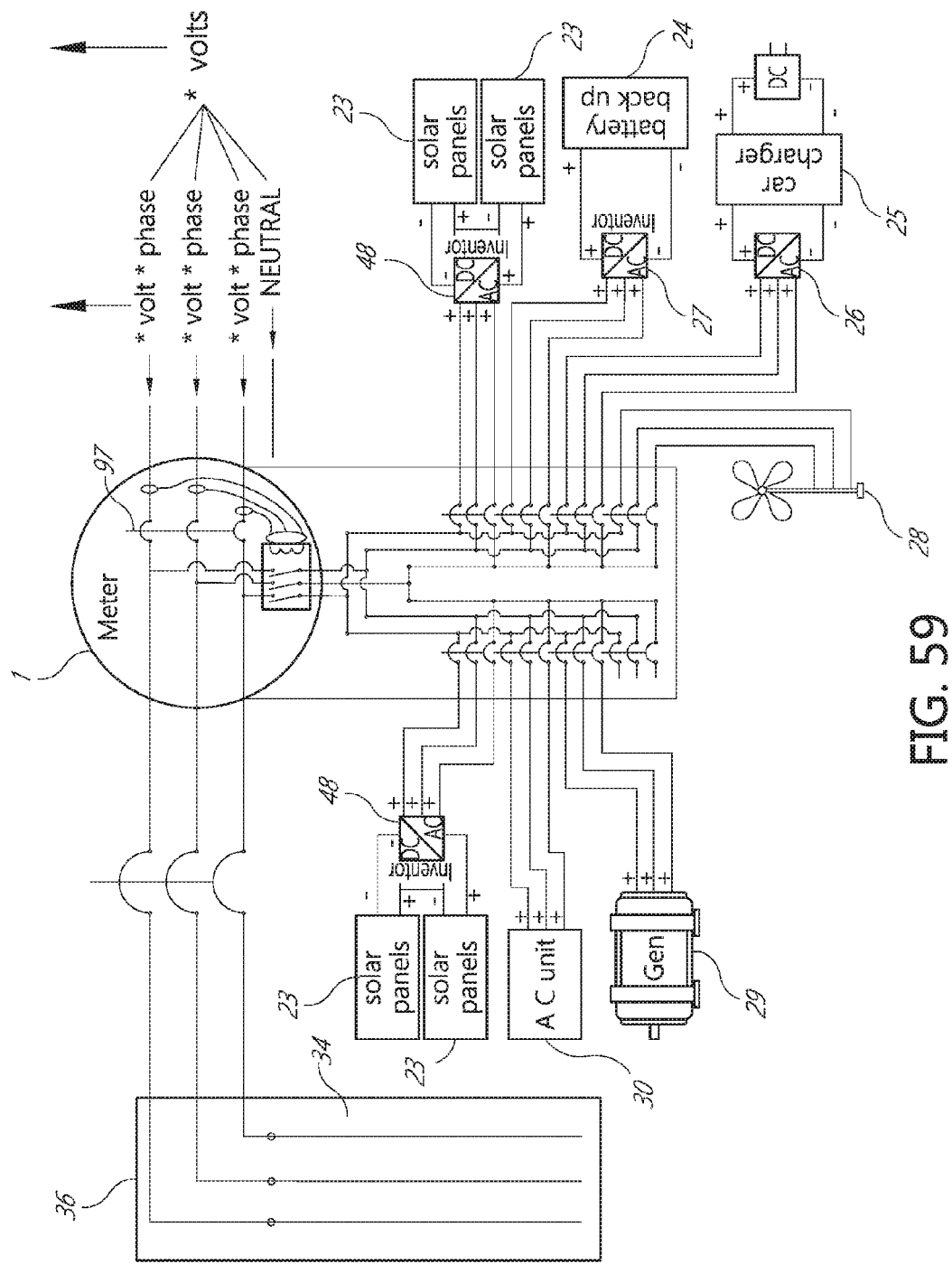
FIG. 59 is a 3 phase meter bypass one line diagram, for live busing, with a main breaker, that shuts off all power, and has an automatic transfer/AC Coupling system.

FIG. 59 is a 3 phase meter bypass one line diagram, for live busing, with a main breaker, that shuts off all power, and has, an automatic transfer/AC Coupling system.

Figure 60:
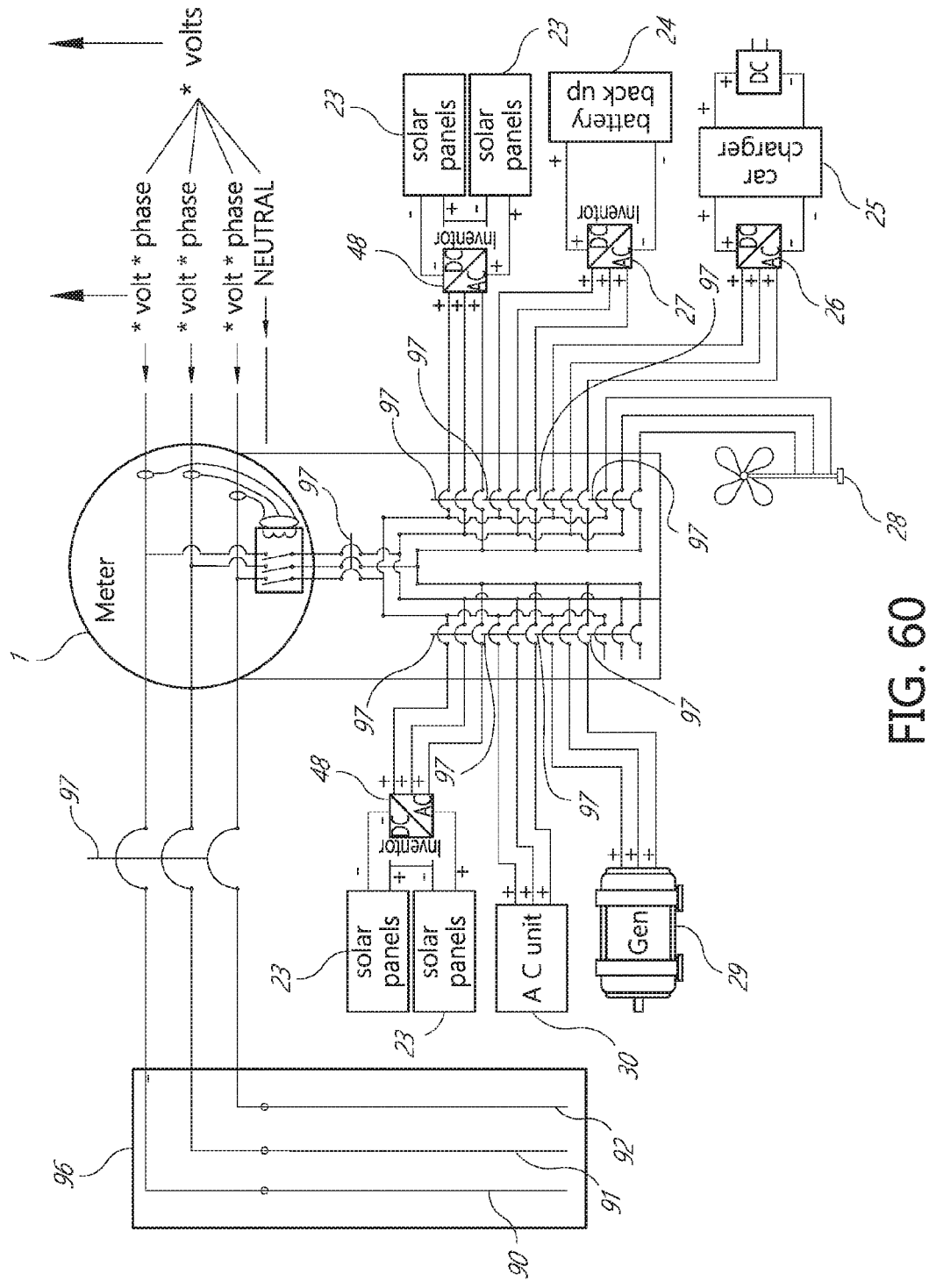
FIG. 60 is a 3 phase meter bypass one line diagram, with a main breaker, that shuts off the meter bypass area, and has an automatic transfer/AC Coupling system.

FIG. 60 is a 3 phase meter bypass one line diagram, with a main breaker, that shuts off the meter bypass area, and has an automatic transfer/AC Coupling system.

Figure 61:
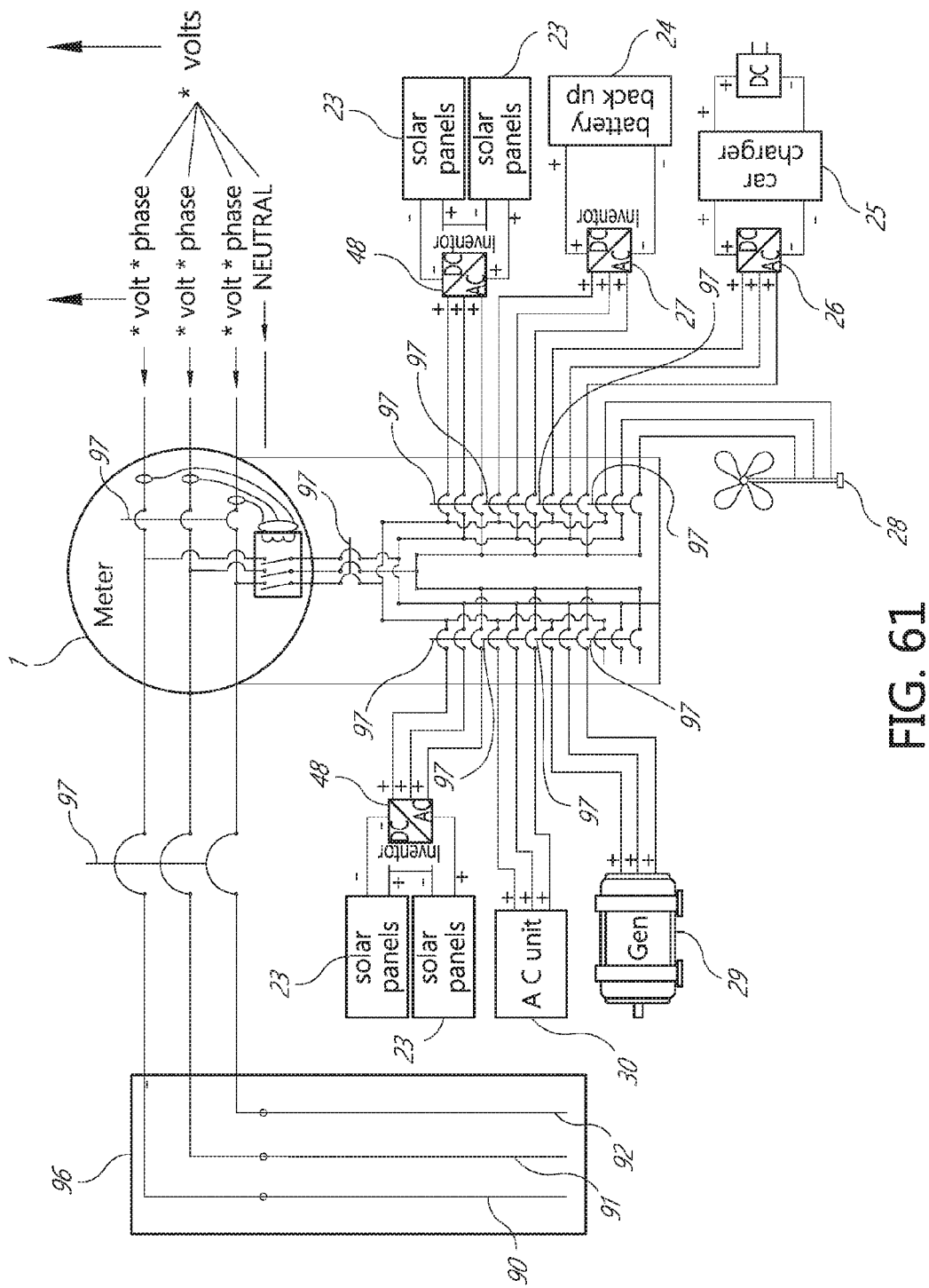
FIG. 61 is a 3 phase meter bypass one line diagram, with a main breaker, that shuts off the meter bypass area, and a breaker that shuts off all power, with an automatic transfer/AC Coupling system.

FIG. 61 is a 3 phase meter bypass one line diagram, with a main breaker, that shuts off the meter bypass area, and a breaker that shuts off all power, with an automatic transfer/AC Coupling system.

Figure 62:
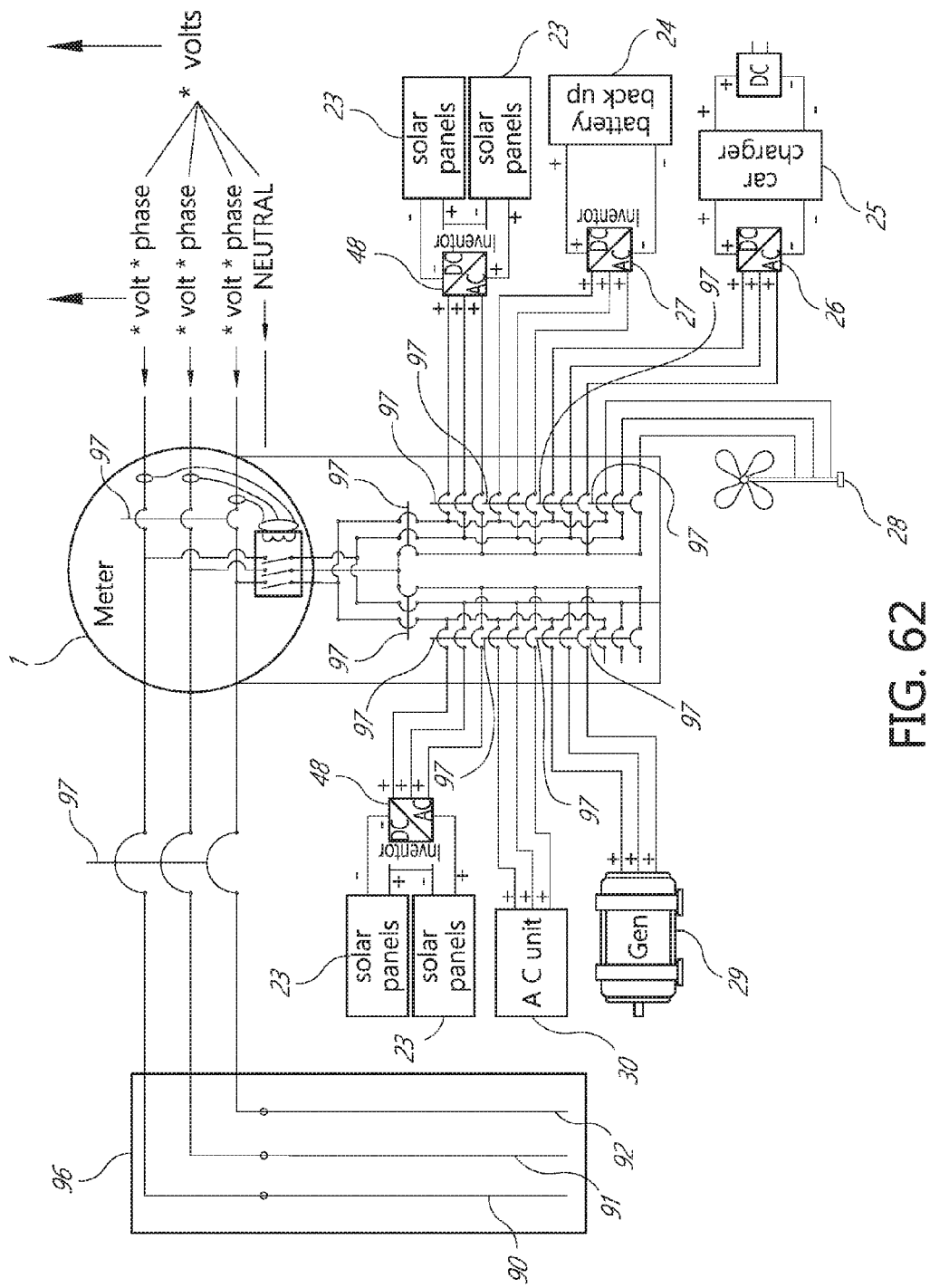
FIG. 62 is a 3 phase meter bypass one line diagram, with 2 main breaker, that shuts off the right, and left sides of the meter bypass area, and a breaker that shuts off all power, and has an automatic transfer/AC Coupling system.

FIG. 62 is a 3 phase meter bypass one line diagram, with 2 main breaker, that shuts off the right, and left sides of the meter bypass area, and a breaker that shuts off all power, and has an automatic transfer/AC Coupling system.

Figure 63:
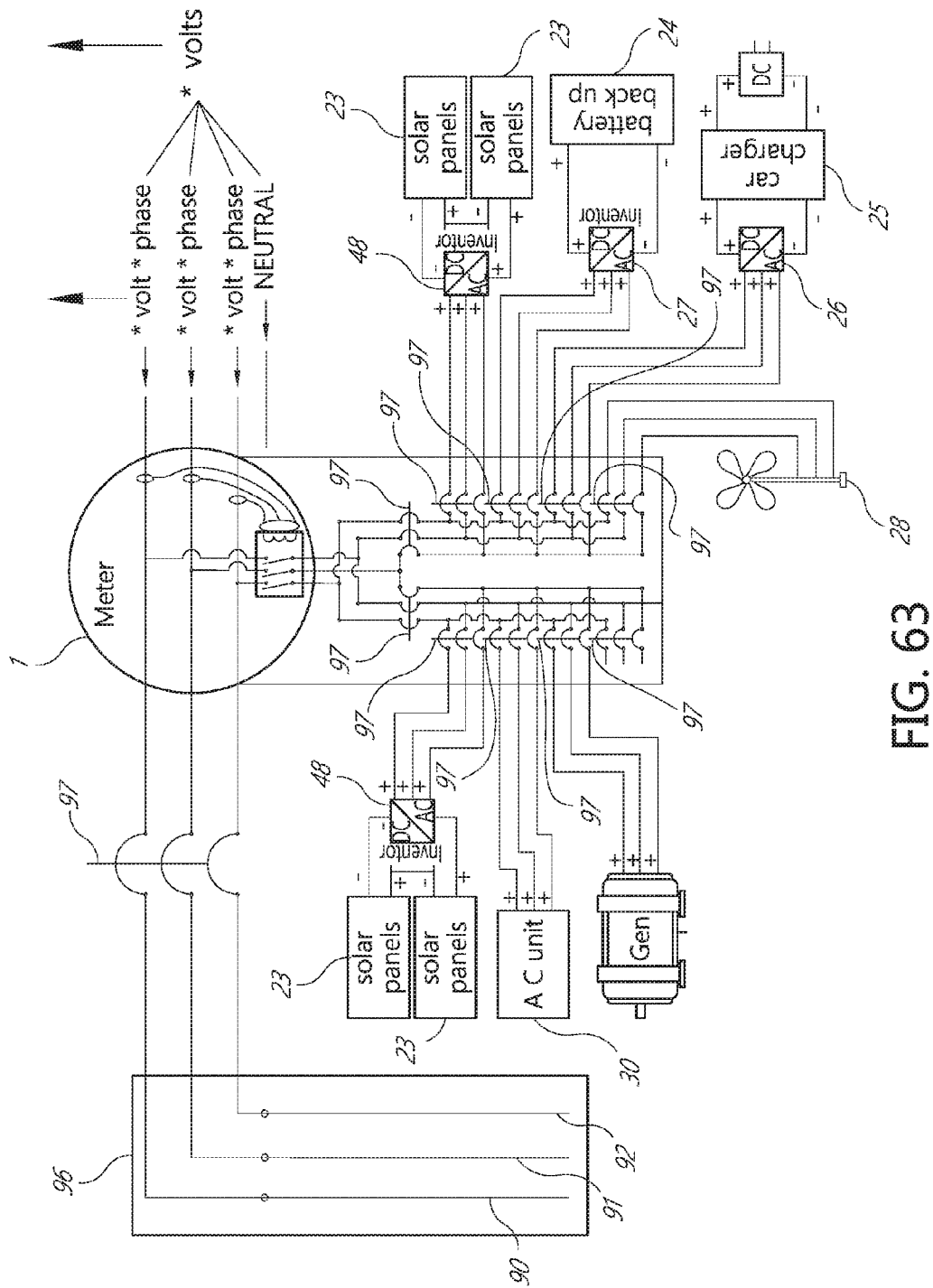
FIG. 63 is a 3 phase meter bypass one line diagram, with 2 main breaker, that shuts off the right, and left sides of the meter bypass area, with an automatic transfer/AC Coupling system.

FIG. 63 is a 3 phase meter bypass one line diagram, with 2 main breaker, that shuts off the right, and left sides of the meter bypass area, with an automatic transfer/AC Coupling system.

It should be noted that the terms "couple," "coupling," "coupled" or other variations of the word couple as used herein may indicate either an indirect connection or a direct connection. For example, if a first component is "coupled" to a second component, the first component may be either indirectly connected to the second component or directly connected to the second component. As used herein, the term "plurality" denotes two or more. For example, a plurality of components indicates two or more components.

In the foregoing description, specific details are given to provide a thorough understanding of the examples. However, it will be understood by one of ordinary skill in the art that the examples may be practiced without these specific details. Certain embodiments that are described separately herein can be combined in a single embodiment, and the features described with reference to a given embodiment also can be implemented in multiple embodiments separately or in any suitable subcombination. For example, electrical components/devices may be shown in block diagrams in order not to obscure the examples in unnecessary detail. In other instances, such components, other structures and techniques may be shown in detail to further explain the examples.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An electric meter bypass extension comprising:
   a housing;
   a plurality of line-side conductive members configured to transmit power from external power lines to a metering device;
   a plurality of load-side conductive members configured to transmit power from the metering device to a separate circuit breaker panel, the plurality of line-side conductive members not connected within the extension to the plurality of load-side conductive members;
   a first bypass breaker located on a first side of the extension and disposed at least partially within the housing, the first bypass breaker in electrical communication with the plurality of load-side conductive members; and
   a second bypass breaker located on a second side of the extension and disposed at least partially within the housing, the second side opposite the first side, the second bypass breaker in electrical communication with the plurality of load-side conductive members.

2. The extension of claim 1, wherein the electric meter bypass extension further comprises:
   a first plurality of connectors on a first face of the electric meter bypass extension, the first plurality of connectors comprising:
   at least two line connectors in electrical communication with the plurality of line-side conductive members and configured to form part of a connection between the plurality of line-side conductive members and the external power lines;
   at least two load connectors in electrical communication with the plurality of load-side conductive members and configured to form part of a connection between the plurality of load-side conductive members and the separate circuit breaker panel; and
   a second plurality of connectors on a second face of the electric meter bypass extension, each of the second plurality of connectors in electrical communication with at least one of the line-side conductive members or the load-side conductive members.

3. The electric meter bypass extension of claim 2, wherein the first plurality of connectors comprises a plurality of prongs extending outward from the first face of the electric meter bypass extension.

4. The electric meter bypass extension of claim 3, wherein the plurality of prongs are dimensioned and configured to be inserted in a meter socket.

5. The electric meter bypass extension of claim 2, wherein the second plurality of connectors comprise a plurality of slots formed in the second face of the electric meter bypass extension.

6. The electric meter bypass extension of claim 5, wherein the second face of the electric meter bypass extension comprises a meter socket, and the plurality of slots are configured to receive and retain prongs of an electric the metering device.

7. The electric meter bypass extension of claim 2, wherein the first and second faces of the electric meter bypass extension are formed on opposite sides of the electric meter bypass extension.

8. The electric meter bypass extension of claim 1, further comprises a plurality of busbars in electrical communication with the plurality of load-side conductive members, each of the plurality of busbars including a first prong, and wherein the first bypass breaker is seated on the first prong of each of the plurality of busbars.

9. The electric meter bypass extension of claim 8, wherein the plurality of busbars comprise interchangeable busbars removably installed within the housing.

10. The electric meter bypass extension of claim 9, wherein the first bypass breaker has a rating of more than 60 amps.

11. The electric meter bypass extension of claim 9, wherein the second bypass breaker is seated on a second prong of each of the plurality of busbars, and wherein a cumulative rating of the first and second bypass breakers is greater than 60 amps.

12. The electric meter bypass extension of claim 1, wherein the plurality of first and second bypass breakers are interchangeable.

13. The electric meter bypass extension of claim 1, wherein the housing additionally includes an aperture to allow routing of wiring to the first bypass breaker.

14. The electric meter bypass extension of claim 1, wherein the housing additionally includes a first opening to allow access to the first bypass breaker, and a second opening to allow access to the second breaker.

15. The electric meter bypass extension of claim 1, wherein the first bypass breaker is configured to function as a subsidiary breaker and the second bypass breaker is a configured to function as a main breaker and control the first bypass breaker.

16. The electric meter bypass extension of claim 1, wherein the electric meter bypass extension is dimensioned to be installed between the metering device and a meter socket in electrical communication with the external power lines and the separate circuit breaker panel.

17. An electric meter bypass extension comprising:
   a housing including at least a first face, a portion of the first face of the housing being substantially planar;
   at least one bypass breaker disposed at least partially within the housing; and a connection portion extending substantially parallel to the first face of the housing and dimensioned to be installed between a meter socket and an electric meter, the connection portion including:
- a plurality of apertures configured and dimensioned to allow a plurality of load-side conductive prongs extending from the electric meter to pass therethrough; and
- a plurality of conductive members in electrical communication with the at least one bypass breaker and configured to be placed in electrical contact with a portion of a circuit extending between the load side of the electric meter and a separate breaker panel.

18. The electric meter bypass extension of claim 17, wherein the electric meter bypass extension is dimensioned to be installed between the meter socket and the electric meter without substantially increasing the distance between the meter socket and the electric meter.

19. The electric meter bypass extension of claim 17, wherein the connection portion extends along at least a portion of the first side of the housing portion.

20. The electric meter bypass extension of claim 17, wherein the connection portion includes:
- a first plurality of gripping elements configured and dimensioned to allow the plurality of load-side conductive prongs extending from the electric meter to pass therethrough, the first plurality of gripping elements defining the plurality of apertures configured and dimensioned to allow the plurality of load-side prongs extending from the electric meter to pass therethrough; and
- a second plurality of gripping elements configured and dimensioned to allow a plurality of line-side conductive prongs extending from the electric meter to pass therethrough.

21. The electric meter bypass extension of claim 20, wherein each of the first plurality of gripping elements configured and dimensioned to allow the plurality of load-side conductive prongs to pass therethrough includes an insulating structure.

22. The electric meter bypass extension of claim 17, wherein the housing includes a plurality of busbars, each including at least one bussing prong, wherein the at least one bypass breaker is seated on the at least one a bussing prong of each of the plurality of busbars.

23. The extension of claim 17, wherein the plurality of busbars are interchangeable busbars removably installed within the housing.

24. The electric meter bypass extension of claim 17, wherein portions of the plurality of conductive members located within the connection portion extend generally in a first direction, and wherein the plurality of apertures configured and dimensioned to allow a plurality of load-side meter conductive prongs extending from the electric meter to pass therethrough are configured and dimensioned to allow the plurality of load-side meter conductive prongs extending from the electric meter to pass therethrough in a second direction substantially orthogonal to the first direction.

25. An electric meter bypass extension including at least one bypass breaker, the electric meter bypass extension comprising:
- a housing;
- a plurality of line-side conductive members configured to transmit power from external power lines to a metering device;
- a plurality of load-side conductive members configured to transmit power from the metering device to a separate circuit breaker panel, the plurality of line-side conductive members not connected within the electric meter bypass extension to the plurality of load-side conductive members; and
- an interchangeable busbar removably installed within the housing and in electrical communication with at least one of the plurality of load-side conductive members;
- a bypass breaker disposed at least partially within the housing, the bypass breaker supported by and in electrical communication with the interchangeable busbar; and
- a connection portion extending substantially parallel to a face of the housing, the connection portion including a plurality of apertures configured and dimensioned to allow a plurality of load-side conductive prongs extending from the metering device to pass therethrough.

26. The electric meter bypass extension of claim 25, wherein the interchangeable busbar is removably secured within the housing via a retaining structure retaining a first end of the interchangeable busbar and a securement device retaining a second end of the interchangeable busbar.

27. The electric meter bypass extension of claim 26, wherein the first end of the interchangeable busbar includes a cleat secured within the retaining structure, and the securement device includes a fastener extending through a portion of the interchangeable busbar.

28. The electric meter bypass extension of claim 25, wherein the interchangeable busbar comprises at least one bussing prong, and wherein the bypass breaker is seated on the at least one bussing prong of the interchangeable busbar.

* * * * *